(12) United States Patent
Farrar et al.

(10) Patent No.: US 9,723,382 B2
(45) Date of Patent: Aug. 1, 2017

(54) DOOR MODULE AND USES THEREOF

(71) Applicant: Panduit Corp., Tinley Park, IL (US)

(72) Inventors: Peter Thorburn Kenyon Farrar, Monmouth (GB); Richard Govier, Cardiff (GB); Alva B. Eaton, Nottingham Park, IL (US); Yuri Astvatsaturov, Vernon Hills, IL (US)

(73) Assignee: Panduit Corp., Tinley Park, IL (US)

( * ) Notice: Subject to any disclaimer, the term of this patent is extended or adjusted under 35 U.S.C. 154(b) by 176 days.

(21) Appl. No.: 14/634,382

(22) Filed: Feb. 27, 2015

(65) Prior Publication Data
US 2016/0255421 A1    Sep. 1, 2016

(51) Int. Cl.
| | |
|---|---|
| *H04Q 9/00* | (2006.01) |
| *H05K 5/02* | (2006.01) |
| *H05K 5/03* | (2006.01) |
| *E05B 47/00* | (2006.01) |
| *G07C 9/00* | (2006.01) |
| *H05K 7/14* | (2006.01) |

(52) U.S. Cl.
CPC .............. *H04Q 9/00* (2013.01); *E05B 47/00* (2013.01); *G07C 9/00563* (2013.01); *G07C 9/00896* (2013.01); *H05K 5/0208* (2013.01); *H05K 5/0217* (2013.01); *H05K 5/03* (2013.01); *H05K 7/1498* (2013.01); *E05B 2047/0059* (2013.01); *E05B 2047/0094* (2013.01); *H04Q 2209/30* (2013.01); *H04Q 2209/40* (2013.01)

(58) Field of Classification Search
CPC ..... E05B 2047/0059; E05B 2047/0094; E05B 47/00; G07C 9/00563; G07C 9/00896; H04Q 2209/30; H04Q 2209/40; H04Q 9/00; H05K 5/0208; H05K 5/0217; H05K 5/03; H05K 7/1498
See application file for complete search history.

(56) References Cited

U.S. PATENT DOCUMENTS

| | | | | |
|---|---|---|---|---|
| 5,829,130 | A | * | 11/1998 | Miller .................... A47B 88/20 29/868 |
| 7,383,691 | B2 | | 6/2008 | Felcman et al. |
| 8,046,196 | B2 | | 10/2011 | Felcman et al. |

(Continued)

OTHER PUBLICATIONS

Quick Installation Guide for Environmental Sensors, ServersCheck BVBA, Oct. 29, 2014.

*Primary Examiner* — Mohamed Barakat
(74) *Attorney, Agent, or Firm* — Christopher S. Clancy; James H. Williams; Aimee E. McVady

(57) ABSTRACT

In an embodiment, the present invention is an enclosure for housing electronic equipment, which includes a frame for mounting the electronic equipment, a gateway connected to the frame and in communication with a management application, a door removably mounted to the frame, the door including a plurality of door-mounted electronic devices, at least one of the door-mounted electronic devices requiring an interface that is different from at least one other of the door-mounted electronic devices, a door module attached to the door, the door module providing a plurality of interfaces wherein each of the plurality of door-mounted electronic devices is connected to one of the plurality of interfaces, and a communication link between the door module and the gateway, at least a portion of the communication link consisting of a single communication cable.

27 Claims, 54 Drawing Sheets

(56) References Cited

U.S. PATENT DOCUMENTS

| | | | |
|---|---|---|---|
| 8,917,513 B1 | 12/2014 | Hazzard | |
| 2010/0142544 A1* | 6/2010 | Chapel | H01R 25/006 |
| | | | 370/401 |
| 2011/0199183 A1* | 8/2011 | Marsden | G07C 9/00563 |
| | | | 340/5.52 |
| 2011/0291852 A1* | 12/2011 | Forristal | H05K 7/186 |
| | | | 340/686.1 |
| 2012/0133510 A1 | 5/2012 | Pierce et al. | |
| 2013/0061271 A1* | 3/2013 | Lu | H04L 12/2838 |
| | | | 725/74 |
| 2014/0029198 A1* | 1/2014 | Lozon | G06F 1/16 |
| | | | 361/679.57 |
| 2014/0330788 A1* | 11/2014 | Um | H05K 7/1498 |
| | | | 707/661 |

\* cited by examiner

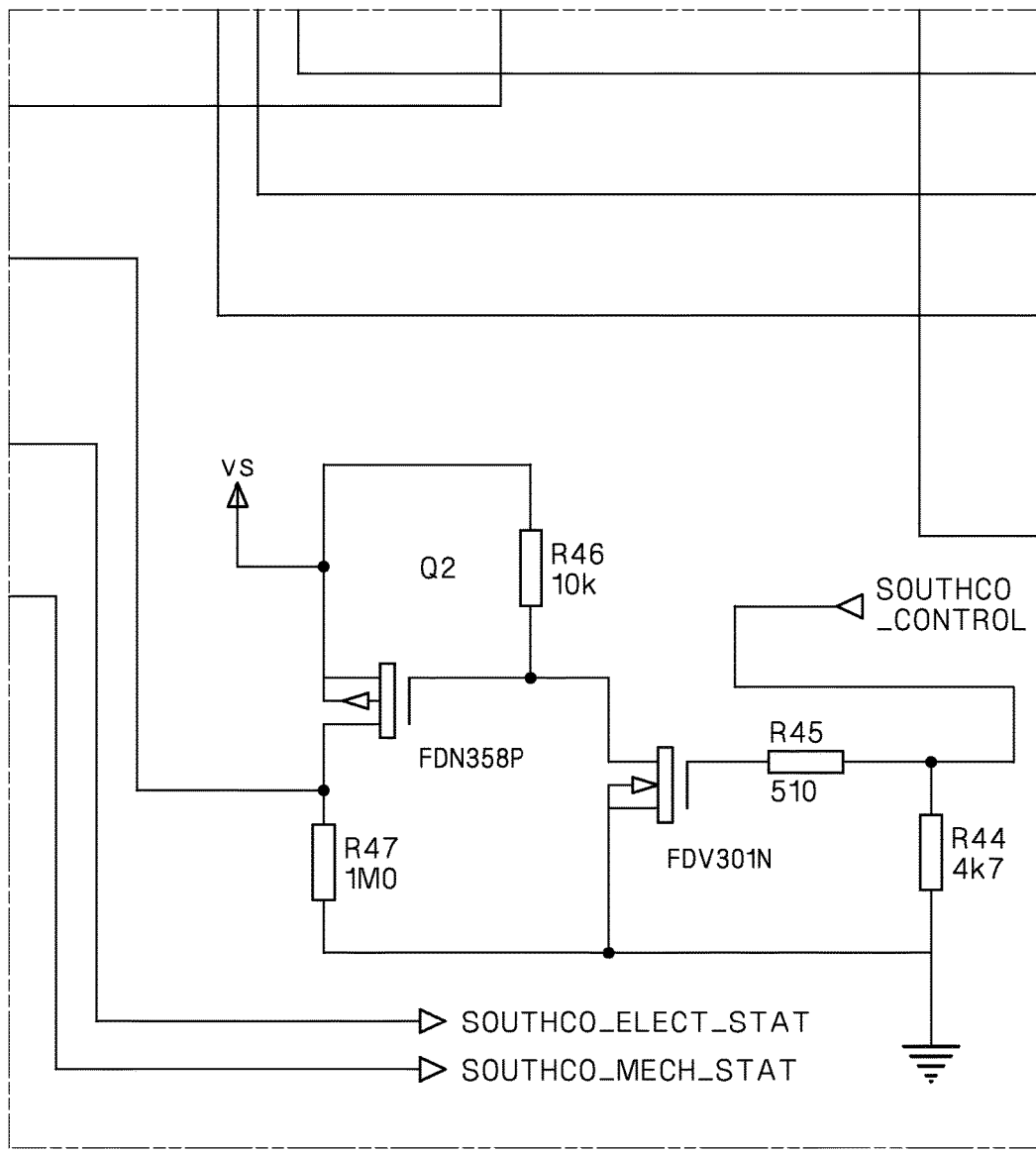
FIG.5FE
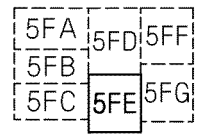

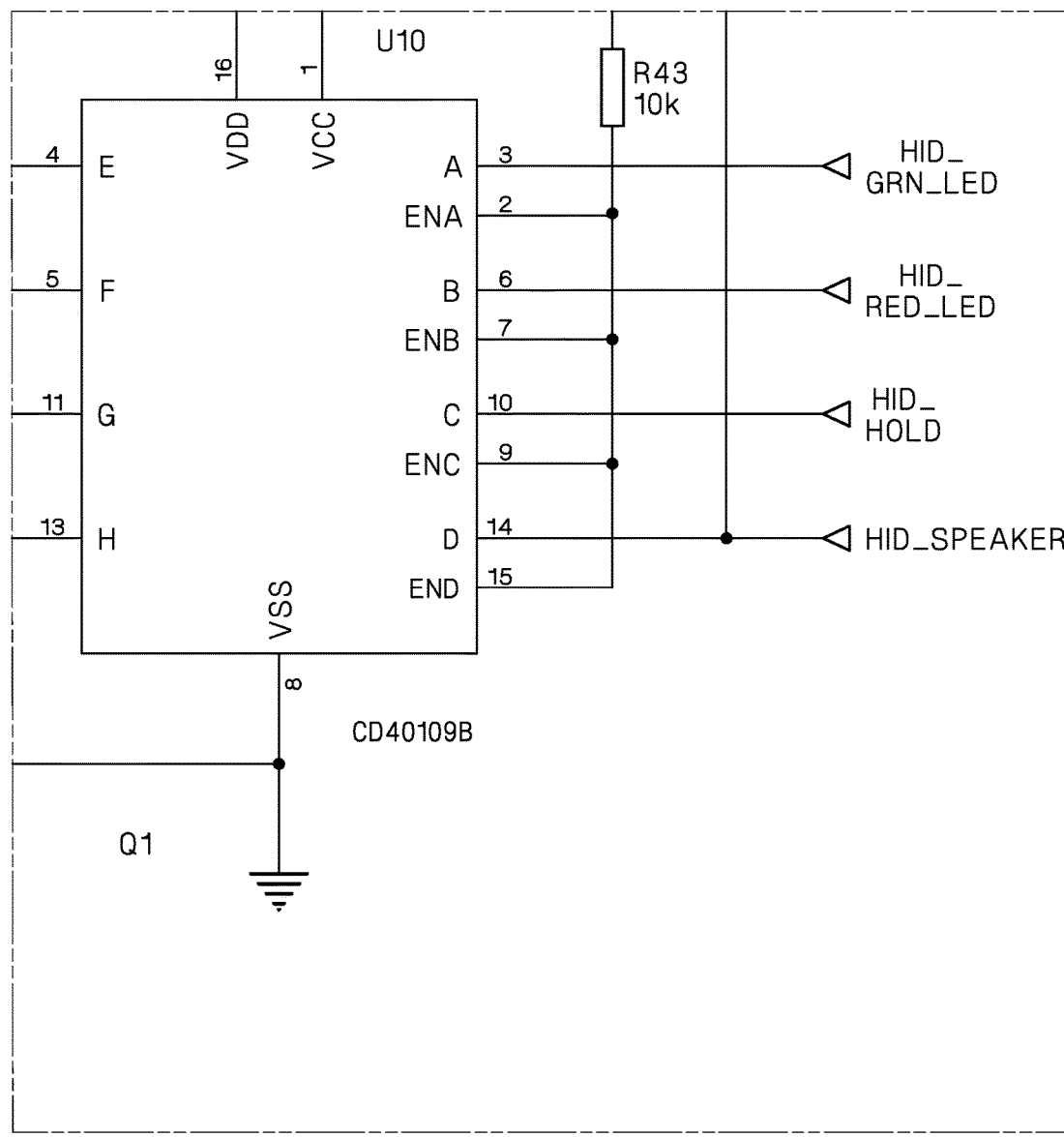
FIG.5FG
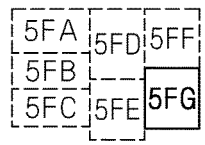

DOOR MODULE AND USES THEREOF

FIELD OF INVENTION

At least some embodiment of the present invention generally relate to the field of enclosure construction, and more specifically, to construction of enclosures that include removable walls (e.g., doors) with electronic devices attached thereto.

BACKGROUND

Environments such as data centers are becoming increasingly populated with electronic equipment that needs to be housed in particular enclosures. For example, thermal concerns or the need to enhance security with respect to network equipment often necessitates that this network equipment (e.g., servers, switches, patch panels, and so on) be placed in network cabinets that direct air flow in particular ways or restrict physical access by unauthorized personnel. A common approach to this is to provide network cabinets with operable doors that can be designed to affect internal air flow or to provide physical security to the equipment inside.

To enable these doors to operate accordingly, various sensors, motors, door locks, displays, or other electronic devices may need to be incorporated therein, and a communication link between the door-mounted electronic device and some management software/hardware needs to be provided. While in some cases each door-mounted device may be connected wirelessly to the gateway, this method of connectivity may not always be preferable due to reliability, security, and/or installation concerns. Furthermore, constant need for available power may pose challenges to implementing a wireless connection scheme. Conversely, a wired link may be provided between the door-mounted electronic devices and their control/management software/hardware. Such a wired connection typically includes a link between each individual door-mounted device and a gateway located inside the cabinet. However, such wired connections also have drawbacks.

To take one example, the installation of network equipment into or the removal of network equipment from the network cabinet may require a temporary removal and a subsequent reinstallation of the cabinet door. To achieve this task, essentially every door-mounted electronic device that is connected to a gateway inside of the network cabinet needs to be disconnected therefrom and later reconnected when the door is being reinstalled. With a typical network cabinet front door, this may require the disconnection and a subsequent reconnection of more than ten different electronic devises. With such a high number of disconnects and reconnects, the chances for connector damage, equipment damage due to forgetting to disconnect one of the devices, and/or incorrect reconnection, is significantly increased.

Thus, there exists a need for devices, systems, and methods for simplifying removals and/or installations of enclosure doors with electronic equipment mounted thereon.

SUMMARY

Accordingly, at least some embodiments of the present invention are directed towards devices, systems, and/or methods for simplifying removals and/or installations of enclosure doors with electronic equipment mounted thereon.

In an embodiment, the present invention is an enclosure for housing electronic equipment. The enclosure includes a frame for mounting the electronic equipment. The enclosure also includes a gateway connected to the frame and in communication with a management application. The enclosure also includes a door removably mounted to the frame, the door including a plurality of door-mounted electronic devices, at least one of the door-mounted electronic devices requiring an interface that is different from at least one other of the door-mounted electronic devices. The enclosure also includes a door module attached to the door, the door module providing a plurality of interfaces wherein each of the plurality of door-mounted electronic devices is connected to one of the plurality of interfaces. The enclosure also includes a communication link between the door module and the gateway, at least a portion of the communication link consisting of a single communication cable.

In another embodiment, the present invention is a method of monitoring environmental conditions inside of an enclosure having a frame and a removably mounted door, the enclosure housing electronic equipment. The method includes the steps of: (a) mounting a gateway to the frame, the gateway being in communication with a management application; (b) providing a plurality of door-mounted electronic devices, at least one of the door-mounted electronic devices requiring an interface that is different from at least one other of the door-mounted electronic devices; (c) attaching a door module to the door, the door module having a plurality of interfaces; (d) connecting each of the plurality of door-mounted electronic devices with one of the plurality of interfaces; (e) providing a communication link between the door module and the gateway, at least a portion of the communication link consisting of a single communication cable; and (f) communicating electronic data between at least some of the plurality of door-mounted electronic devices and the management application.

In yet another embodiment, the present invention is an enclosure management system that includes a management application and an enclosure housing electronic equipment. The enclosure includes a frame for mounting the electronic equipment. The enclosure also includes a gateway connected to the frame and in communication with the management application. The enclosure also includes a door removably mounted to the frame, the door including a plurality of door-mounted electronic devices, at least one of the door-mounted electronic devices requiring an interface that is different from at least one other of the door-mounted electronic devices. The enclosure also includes a door module attached to the door, the door module providing a plurality of interfaces wherein each of the plurality of door-mounted electronic devices is connected to one of the plurality of interfaces. The enclosure also includes a communication link between the door module and the gateway, at least a portion of the communication link requiring only a single communication cable.

In still yet another embodiment, the present invention is an enclosure for housing electronic equipment. The enclosure includes a frame for mounting the electronic equipment. The enclosure also includes a gateway connected to the frame and in communication with a management application. The enclosure also includes a door removably mounted to the frame, the door including a plurality of door-mounted electronic devices, at least one of the door-mounted electronic devices requiring an interface that is different from at least one other of the door-mounted electronic devices. The enclosure also includes a door module attached to the door, the door module providing a plurality of interfaces wherein each of the plurality of door-mounted electronic devices is connected to one of the plurality of interfaces. The enclosure also includes a communication link between the door module and the gateway, at least a portion of the communication link consisting of a wireless connection.

In a variation of this embodiment, the door further includes a hinge having a post, the frame includes a bushing configured to receive the post therethrough and the frame further includes a post support configured to support the post, the hinge is switchable between an engaged state and a disengaged state, the engaged state causing the post to be received through the bushing and be supported by the post support, and the disengaged state causing the post to be free of the bushing and be unsupported by the post support, and electrical power for powering at least one of the door mounted electronic devices and/or the door module is passed through the post support and the post.

In another variation of this embodiment, the door is removably mounted to the frame along a portion of a first vertical frame edge and along a portion of a second vertical frame edge, the first vertical frame edge includes at least one first electrical frame contact and the second vertical frame edge includes at least one second electrical frame contact, the door further includes at least one first door contact for electrically connecting to the at least one first electrical frame contact and at least one second door contact for electrically connecting to the at least one second electrical frame contact, and electrical power for powering at least one of the door mounted electronic devices and/or the door module is passed through at least one of the at least one first door contact and the at least one second door contact.

These and other features, aspects, and advantages of the present invention will become better-understood with reference to the following drawings, description, and any claims that may follow.

DETAILED DESCRIPTION

Embodiments of the present invention may be realized in accordance with the following teachings and it should be evident that various modifications and changes may be made in the following teachings without departing from the broader spirit and scope of the invention. Furthermore, as used herein, the phrase "door-mounted electronic device(s)" shall refer to any electronic device(s) that is mounted on a door with the exception of a door module 170, 470 as described further in this specification.

Figure 1:
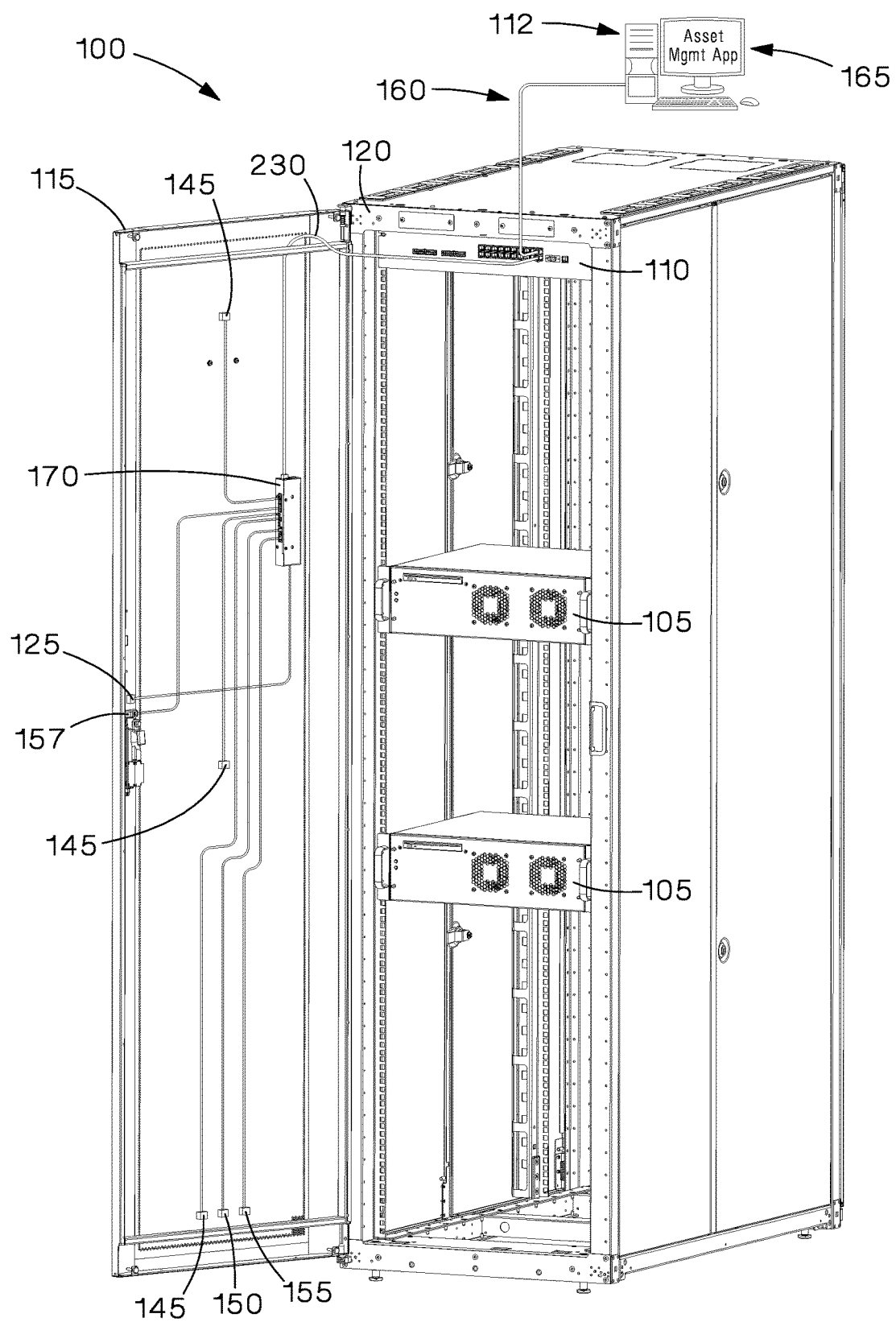
FIG. 1 illustrates an embodiment of a network cabinet showing the back side of the cabinet's front door.
Figure 2:
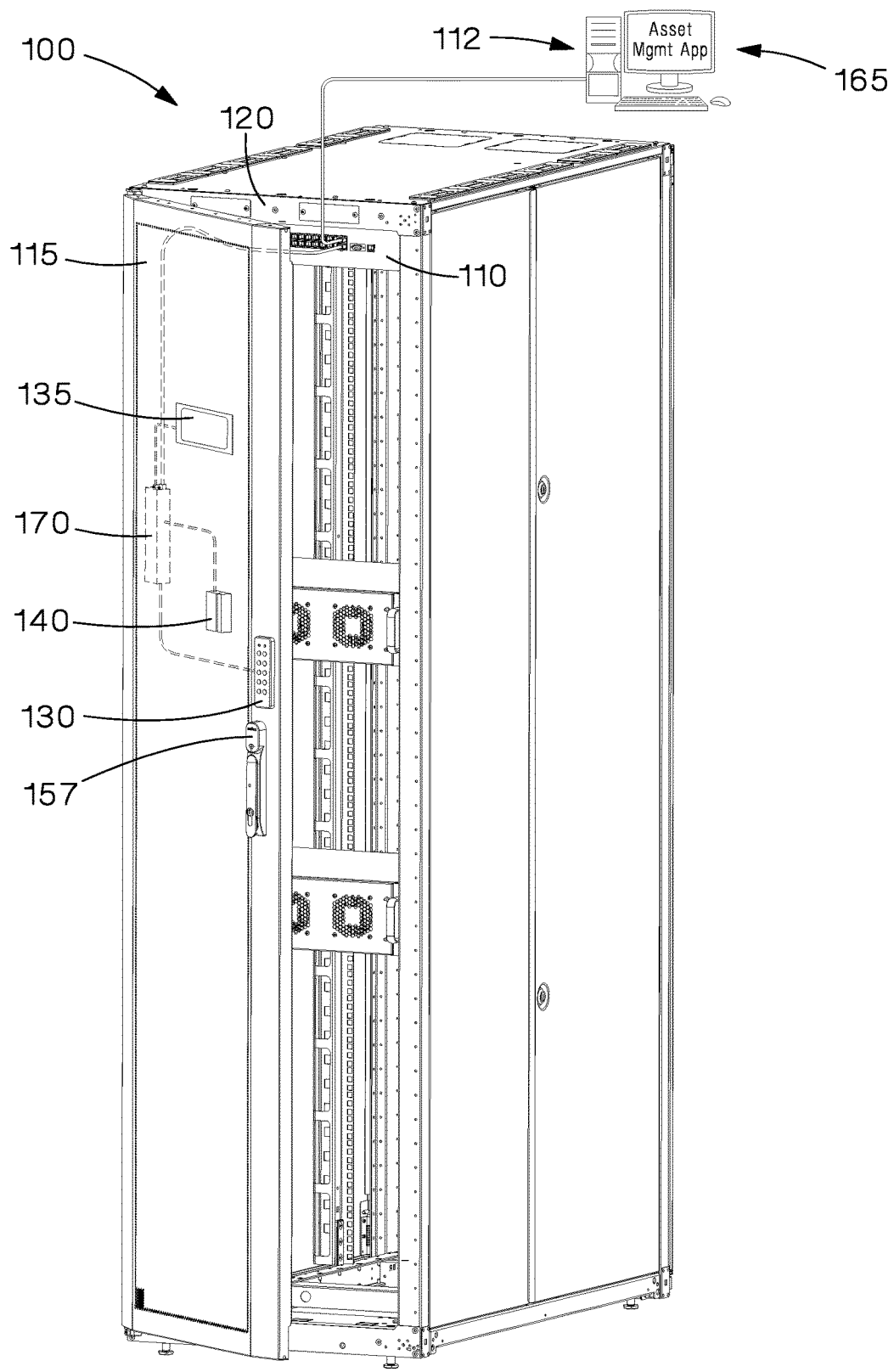
FIG. 2 illustrates the cabinet of FIG. 1 showing the front side of the cabinet's front door.

FIGS. 1 and 2 illustrate an exemplary implementation of the present invention. Included therein is a network cabinet 100 which houses electronic equipment 105 and a gateway 110. Gateway 110 can be connected to an asset management application 112 that can be executed on a remote system and can function as an enterprise-level application designed to monitor and manage a collection of network cabinets 100. An example of an asset management application 112 can be found in, but is not limited to, U.S. Pat. No. 8,306,935 (Doorhy et al.) entitled "Physical Infrastructure Management System," which is incorporated herein by reference in its entirety. The network cabinet 100 also includes a front door 115 removably attached to the frame 120 of the cabinet 100. To assist in the installation and/or removal of electronic equipment 105, the front door 115 may be detached from the frame 120 enabling easier ingress/egress of the electronic equipment 105.

To allow the front door 115 to serve as an integral part of the cabinet 100, various electronic devices are mounted thereon. To restrict unauthorized access to the cabinet 100, the door 115 includes an electronic door-lock mechanism 125. The door-lock can be actuated via a remotely initiated lock/unlock command and/or authentication procedure performed by the user by direct interaction with the cabinet 100. For example, the user may enter an access code on a key pad 130 or on a touch-screen display 135, he may use a card/badge reader 140 to provide the necessary credentials to activate the door-lock mechanism 125, or a multi-factor authentication scheme may be used where a user must submit their card/badge and, for example, enter a PIN code on the key pad to authenticate themselves to the system to gain access.

The front door 115 also includes a plurality of sensors which can be employed to manage environmental characteristics within the cabinet 100 and ensure the electronic equipment 105 is operating in safe conditions. In the embodiment illustrated in FIGS. 1 and 2, three temperature sensors 145 along with a pressure sensor 150 and a humidity sensor 155 are deployed throughout various locations on the inside of the door 115. The number/type/positioning of these sensors can be varied based on the design or implementation needs. In addition, any other suitable electronic devices may be deployed on the inside or outside of the door. These can include, but are not limited to, lights, illuminated logo(s), door lock(s) 157, door contact sensor(s), and the like.

To enable full functionality of the various electronic devices that can be mounted on the door 115, a communication link 160 is provided between those devices and some type of an asset/infrastructure management application executed at least partially on a computer 165. The asset/infrastructure management application may be a stand-alone application or it may be a component of an enterprise-level management software such as that which would be used to manage a data center. The communication link 160 includes, as part thereof, the gateway 110 that consolidates data captured from the various electronic devices and facilitates overall communication between the door-mounted electronic devices and the asset management application, and the communication link(s) between the gateway and the door-mounted electronic devices.

Figure 3:
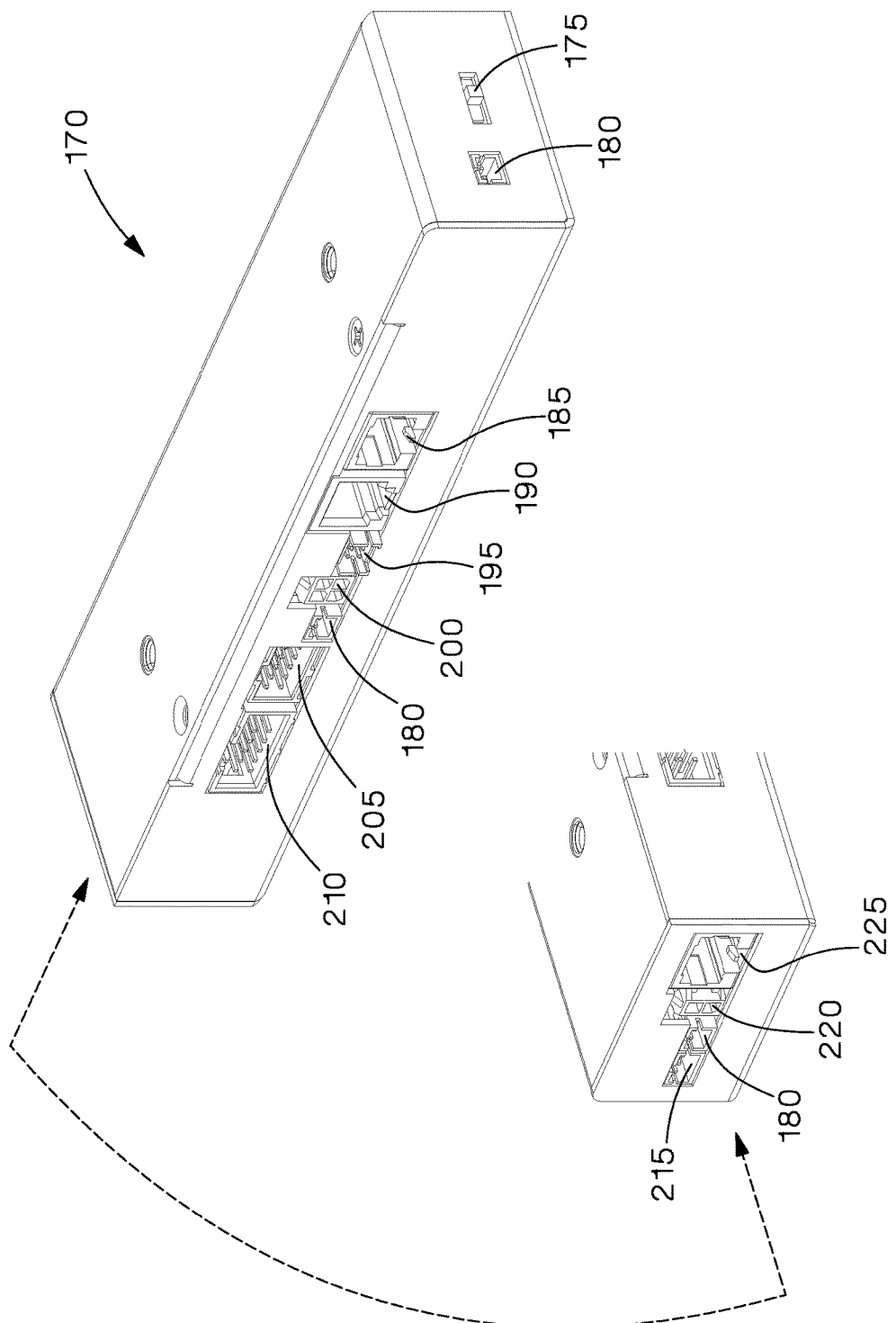
FIG. 3 illustrates an embodiment of a door module.

To avoid individual wires between each of the door-mounted devices and the gateway, a door module 170 is provided on the door 115. As shown in greater detail in FIG. 3, the door module 170 includes a plurality of input/output ports designed to be connected with the various door-mounted electronic devices. In addition, the door module 170 can have built-in sensors and switches for customizing certain aspects of its functionality. For example, in the embodiment shown in FIG. 3, the door module 170 includes an HID (Human Interface Device)/Keypad selector switch 175, temperature sensor ports 180, a standard sensor port 185, a remote display port 190, a door lock control port 195, a card reader port 200, an HID reader port 205, a keypad port 210, a door contact port 215, an illumination assembly port 220, and a gateway uplink/downlink port 225. The use of the door module 170 allows all desired door-mounted electronic devices to be connected to a single door-mounted door module 170, with a single cable 230 being provided between the gateway uplink/downlink port 225 of the door module 170 and the gateway 110.

The advantage of this configuration becomes evident when the door 115 needs to be dismounted. In that event, rather than having to disconnect each door-mounted electronic device from the gateway 110, only one cable 230 needs to be disconnected, leaving all connections between the door module 170 and the door-mounted electronic devices intact. A similar advantage is also present when the door 115 is being mounted onto the frame 120. Rather than having to connect each of the door-mounted electronic devices with the gateway individually, only one cable needs to be installed. Limiting the number of connects/disconnects between the components mounted on the door 115 and the gateway 110 may reduce the amount of errors that can occur upon reconnection, increase the reliability of the communication link between the door-mounted devices and the gateway, and/or decrease the time that it takes to dismount and reinstall the door 115 if and when the need arises.

Figure 4:
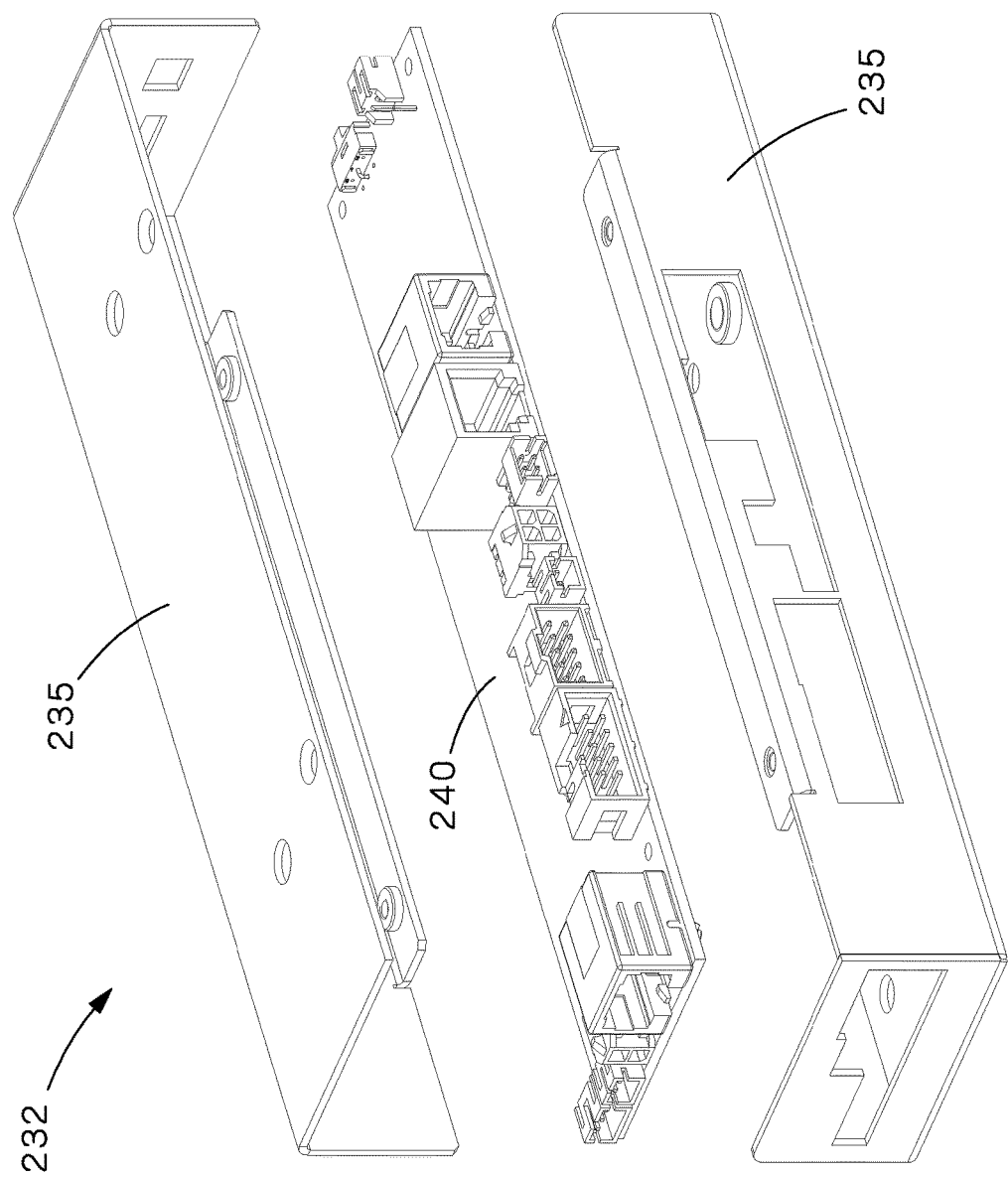
FIG. 4 illustrates an exploded view of the door module of FIG. 3.
Figure 5A:
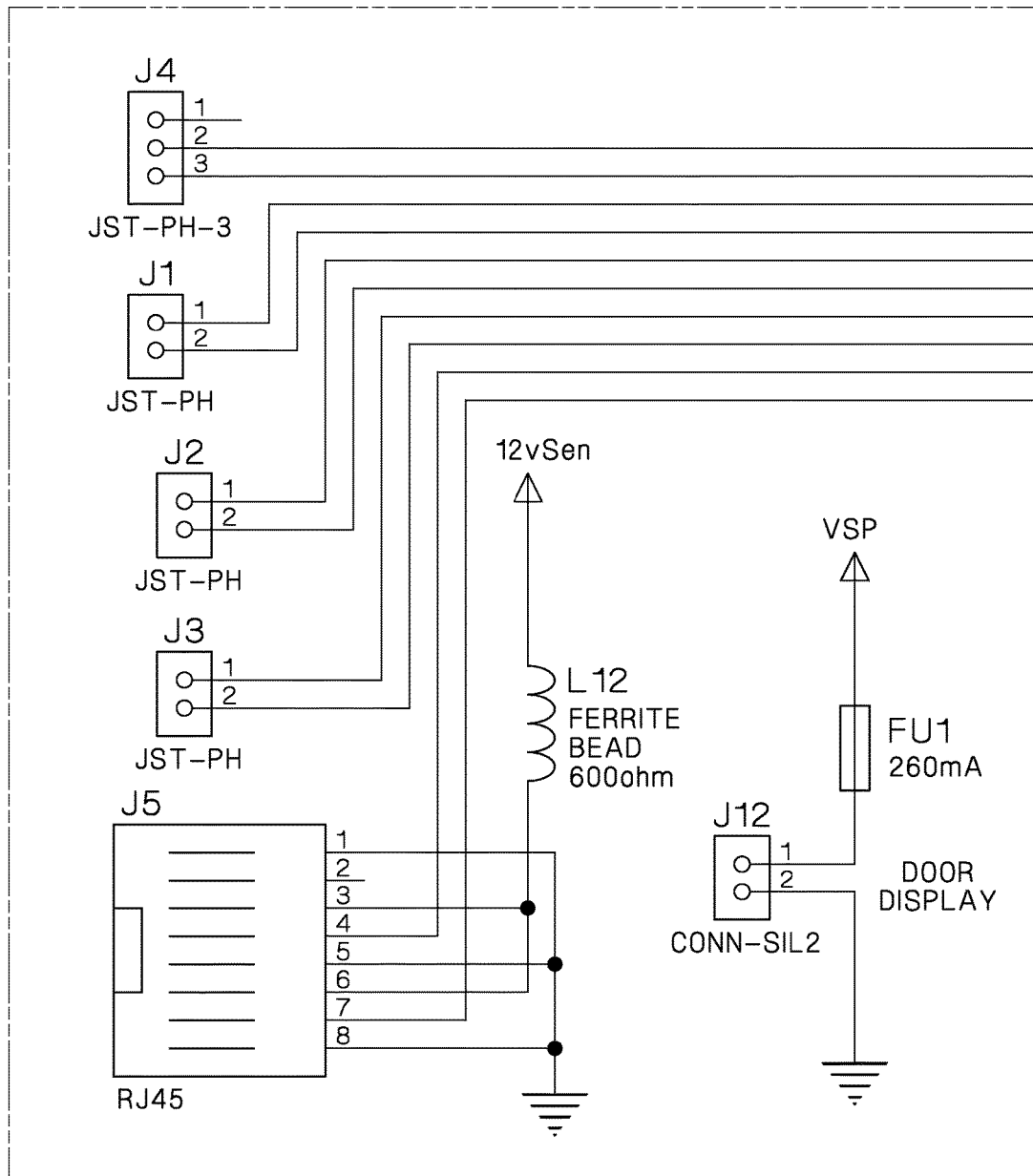
FIGS. 5AA-5HE illustrate schematics employed in an embodiment of a door module.
Figure 5A:
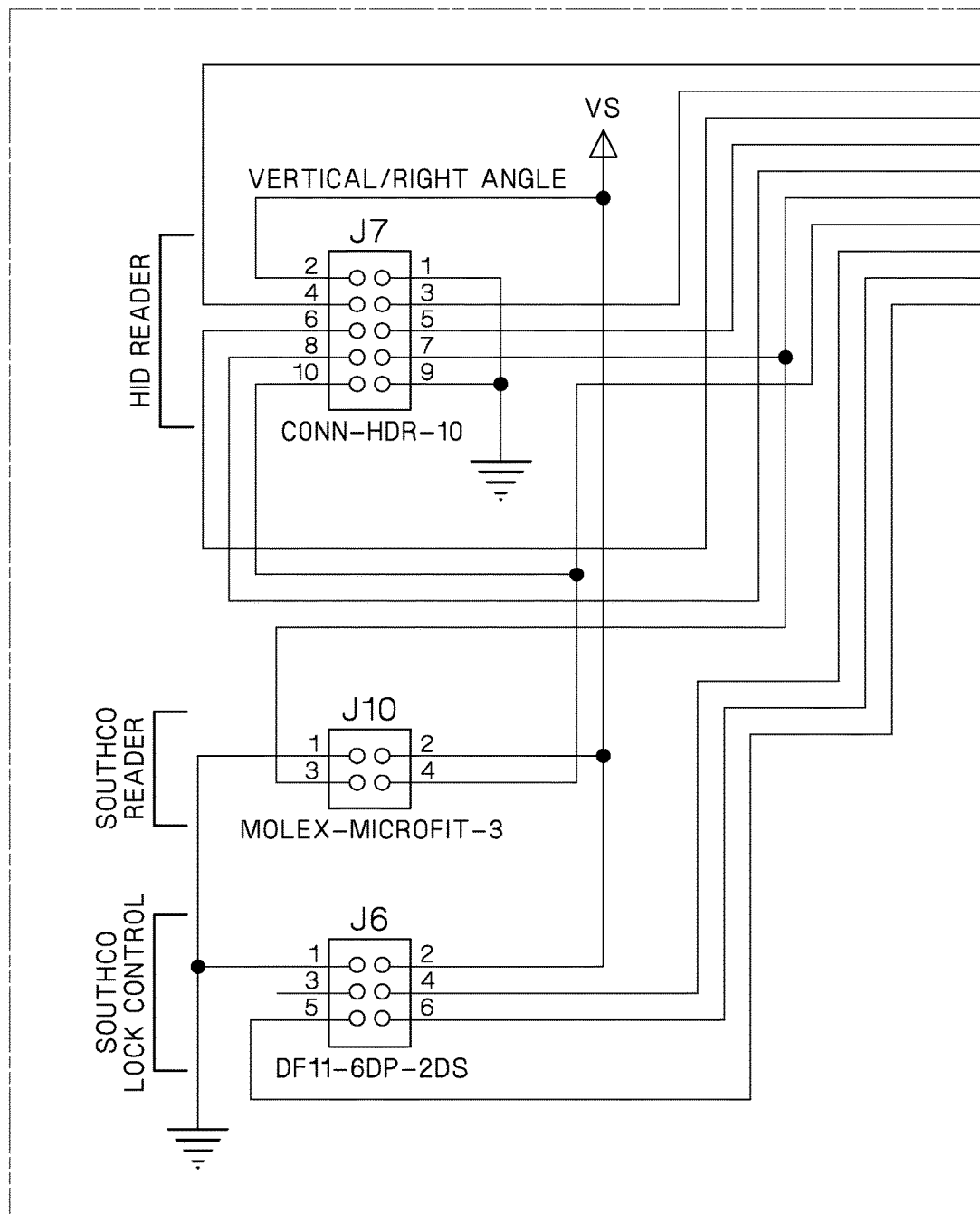
Figure 5A:
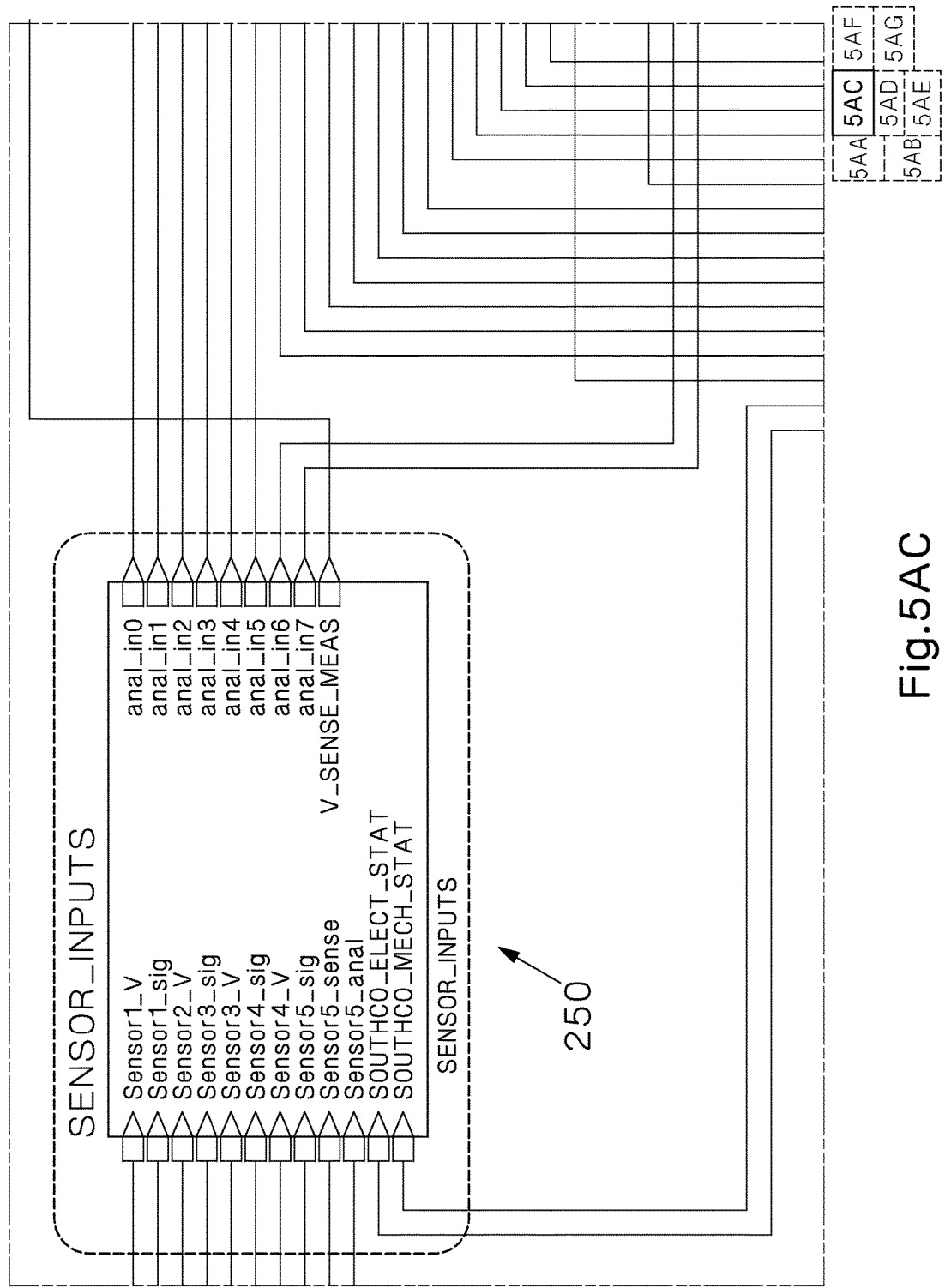
Figure 5A:
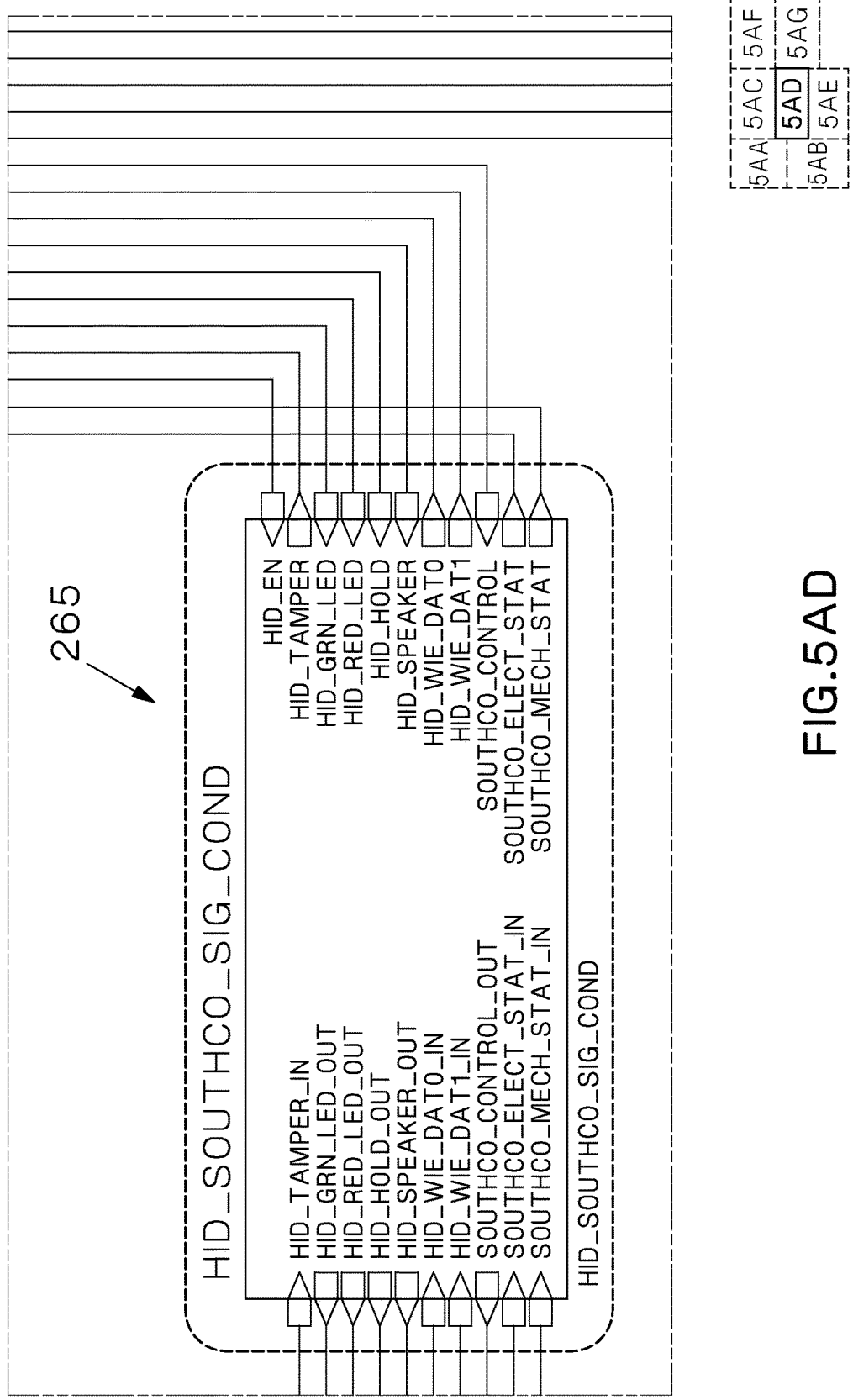
Figure 5A:
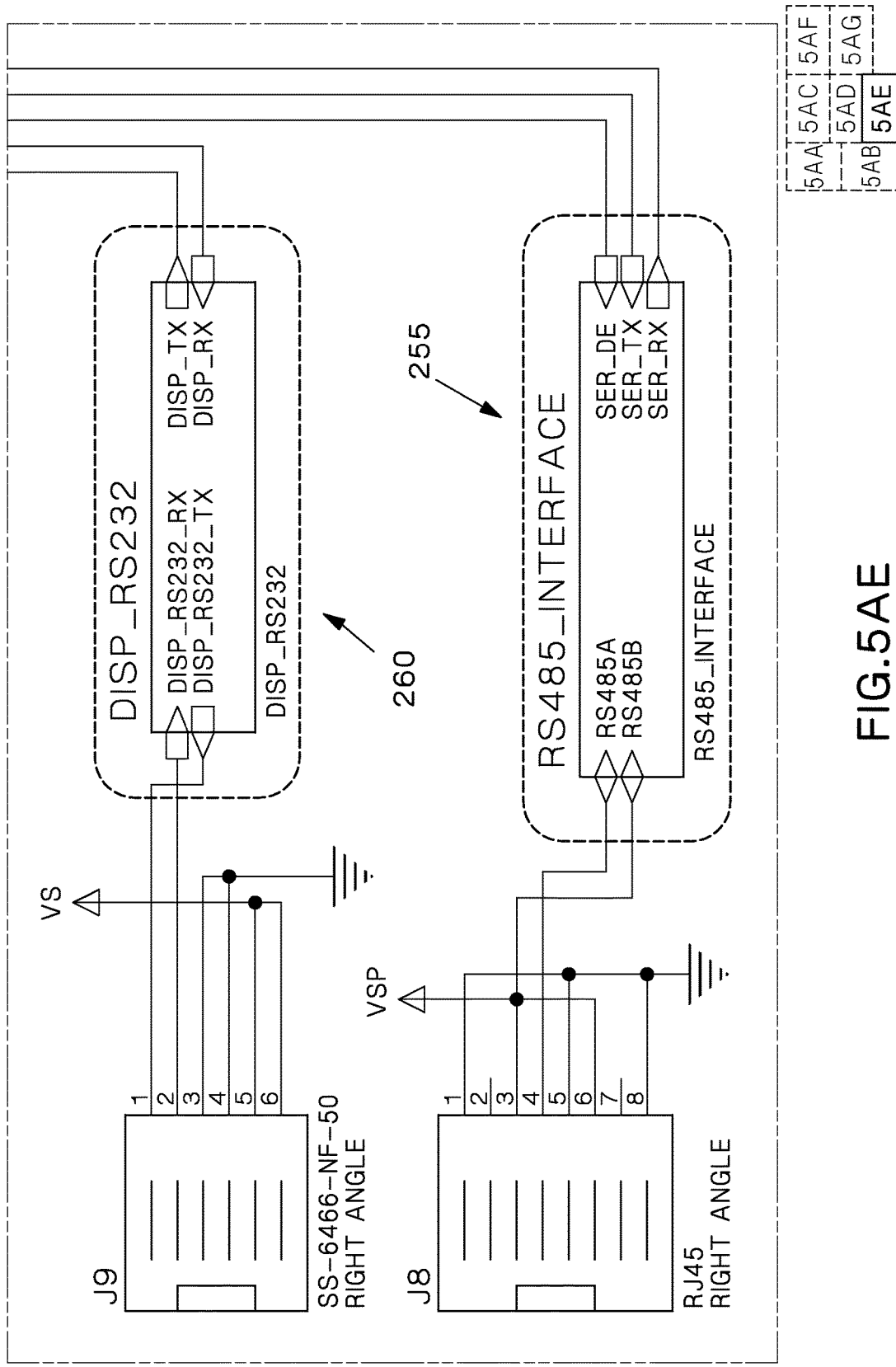
Figure 5A:
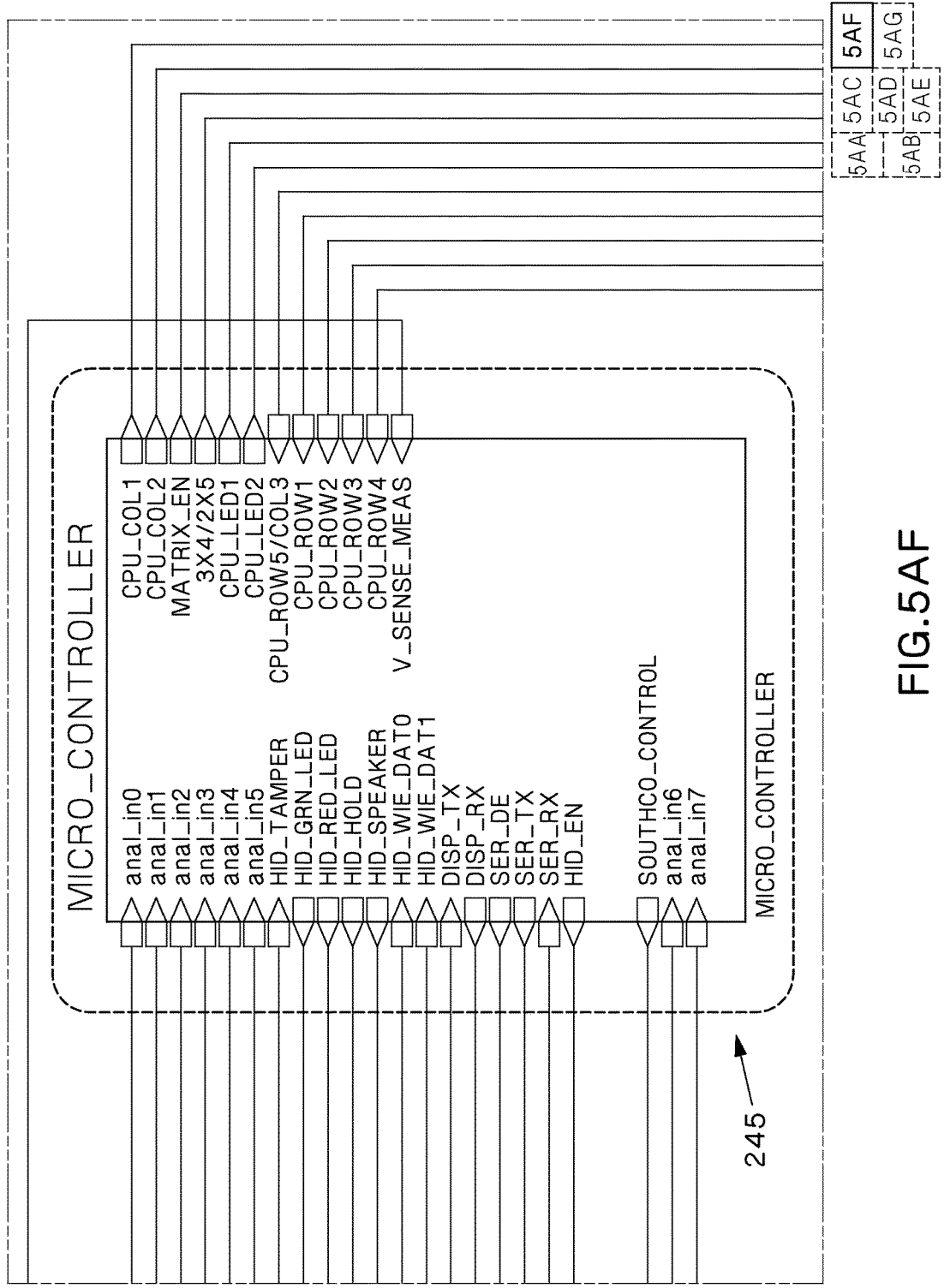
Figure 5A:
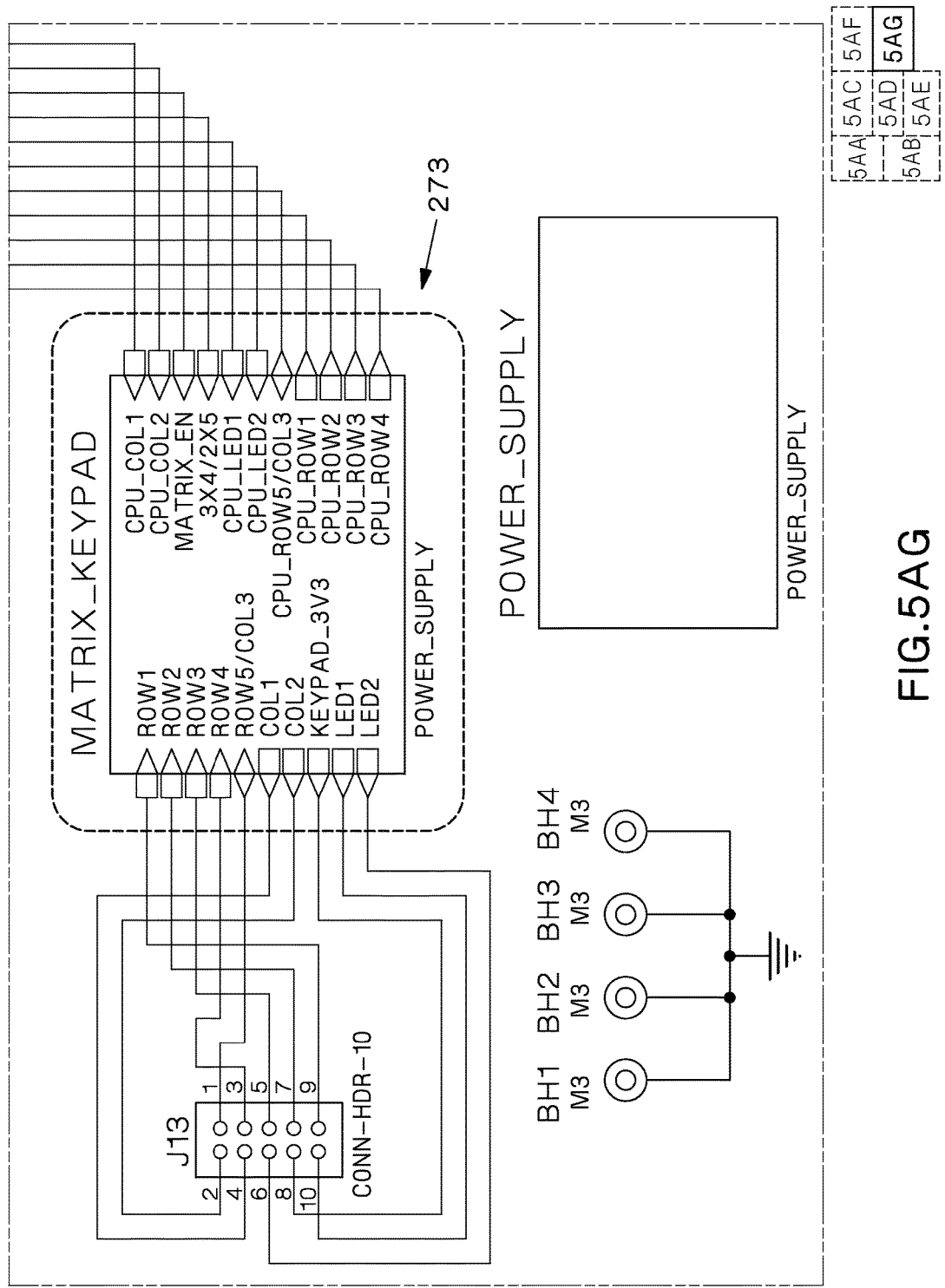
Figure 5B:
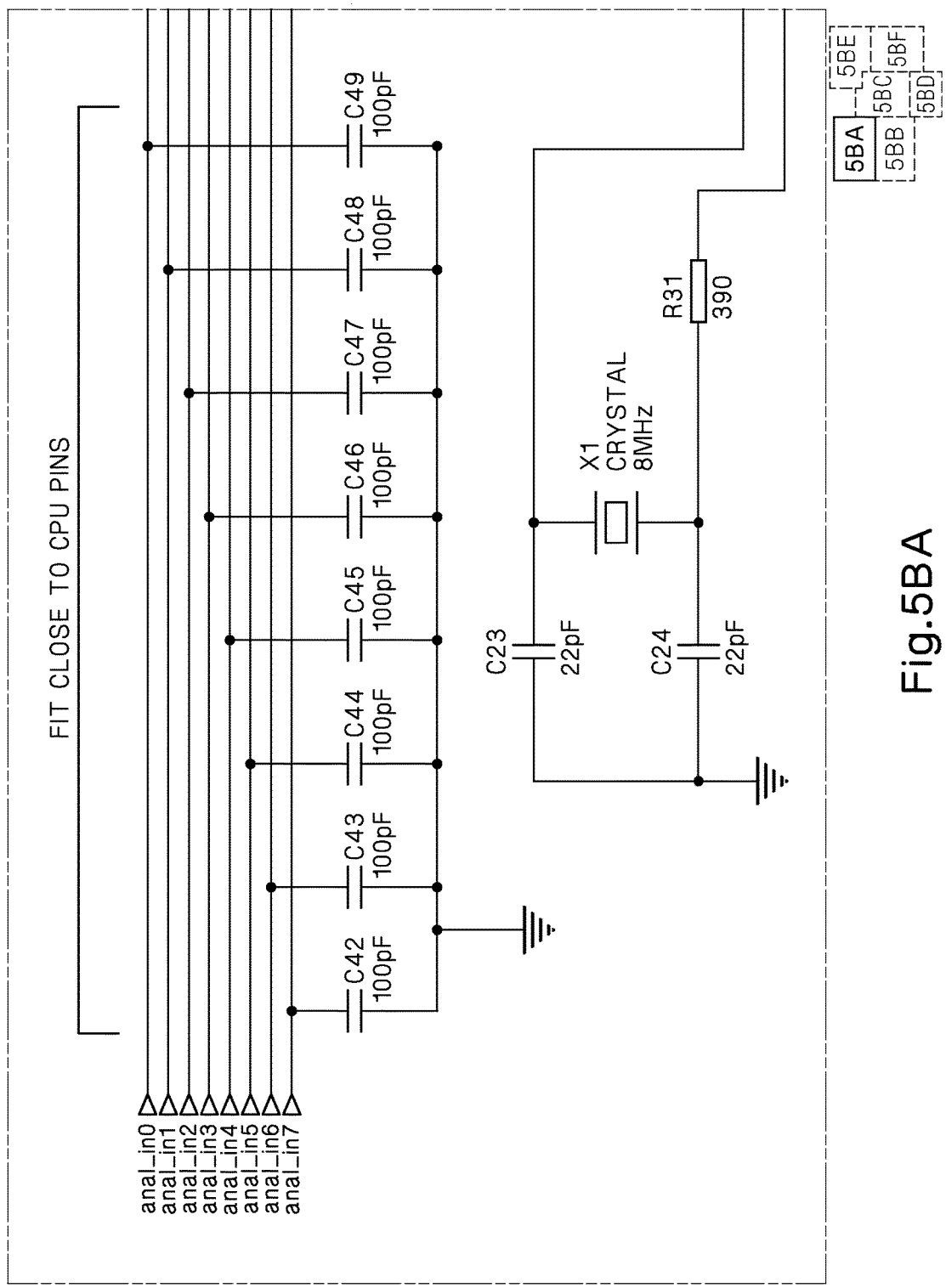
Figure 5B:
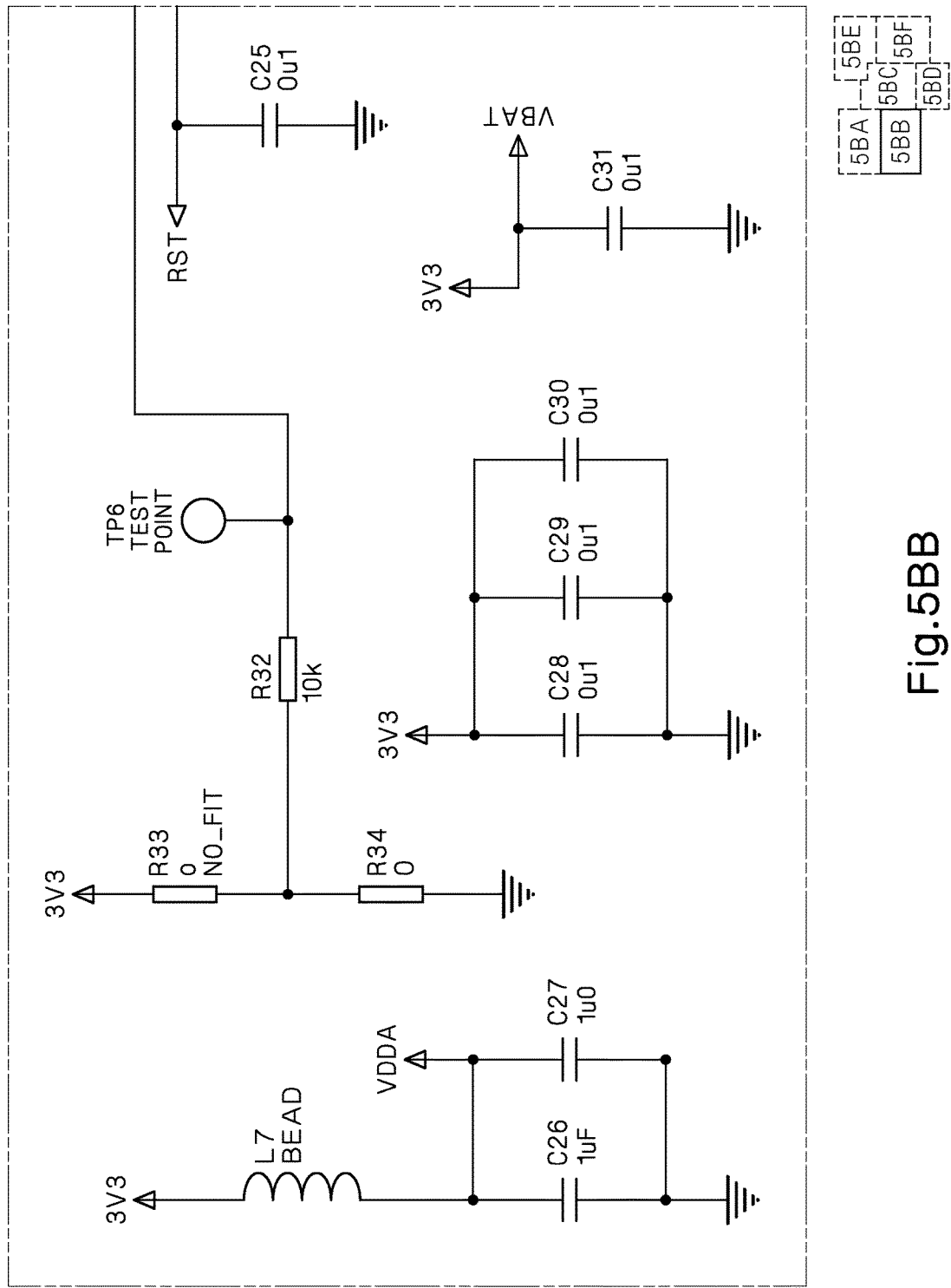
Figure 5B:
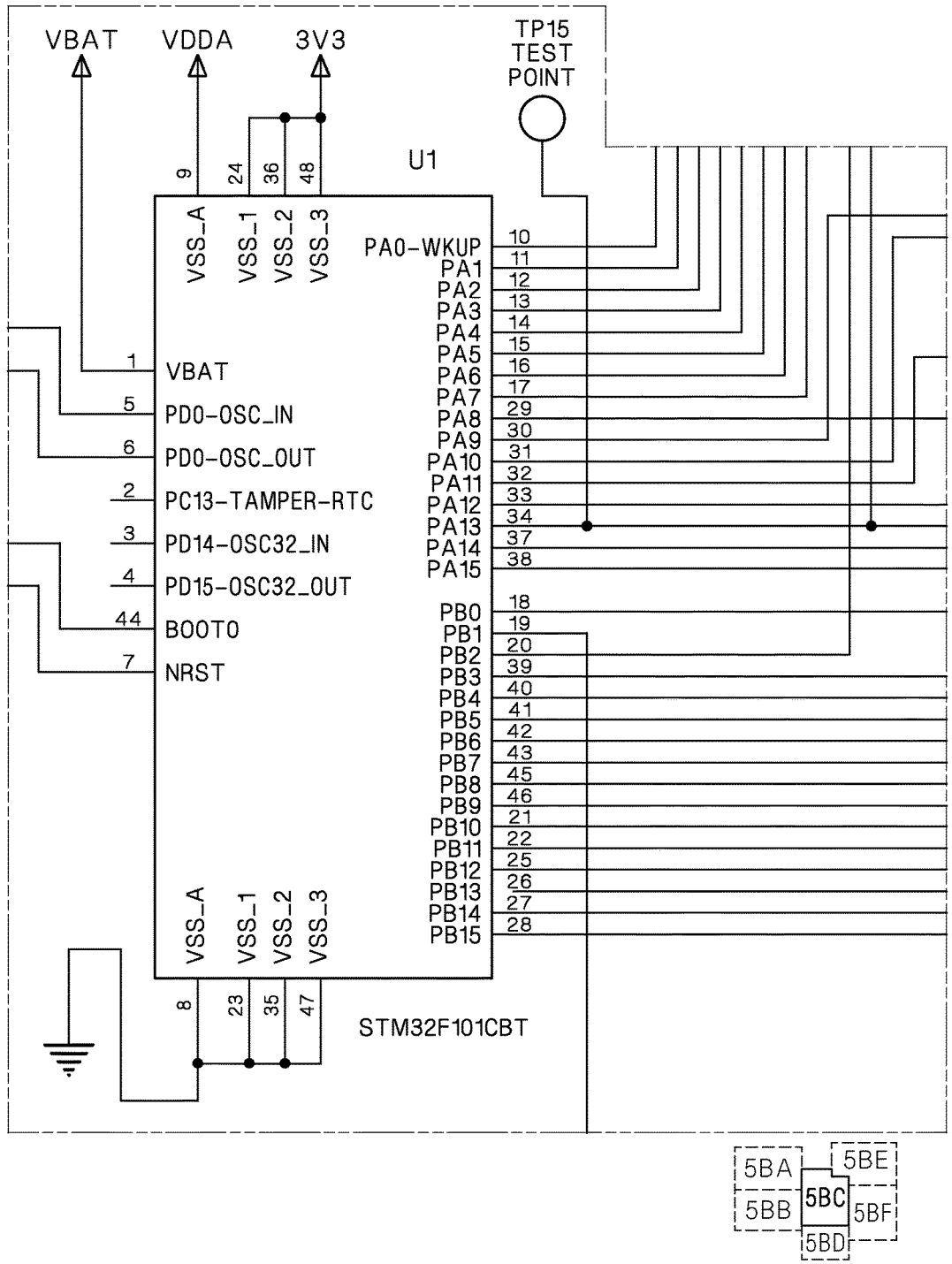
Figure 5B:
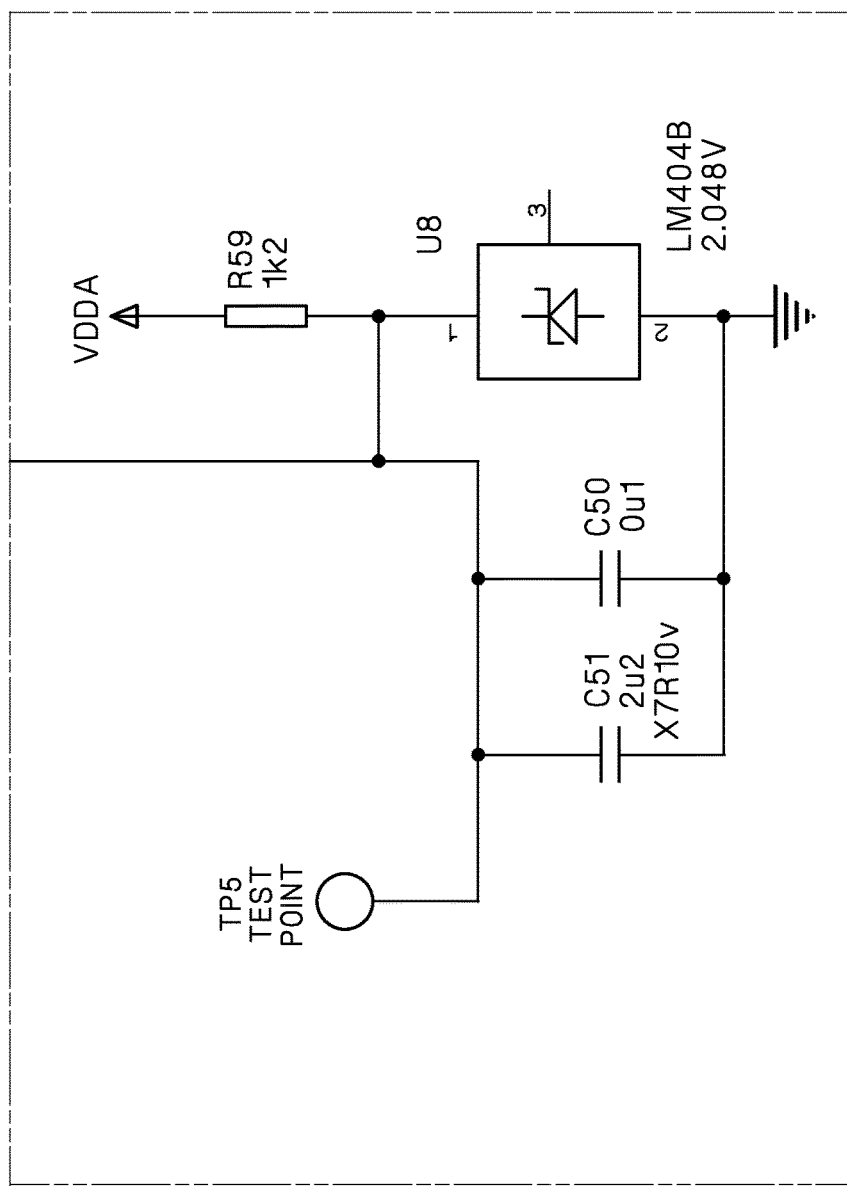
Figure 5B:
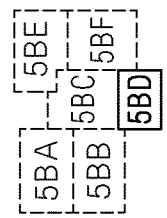
Figure 5B:
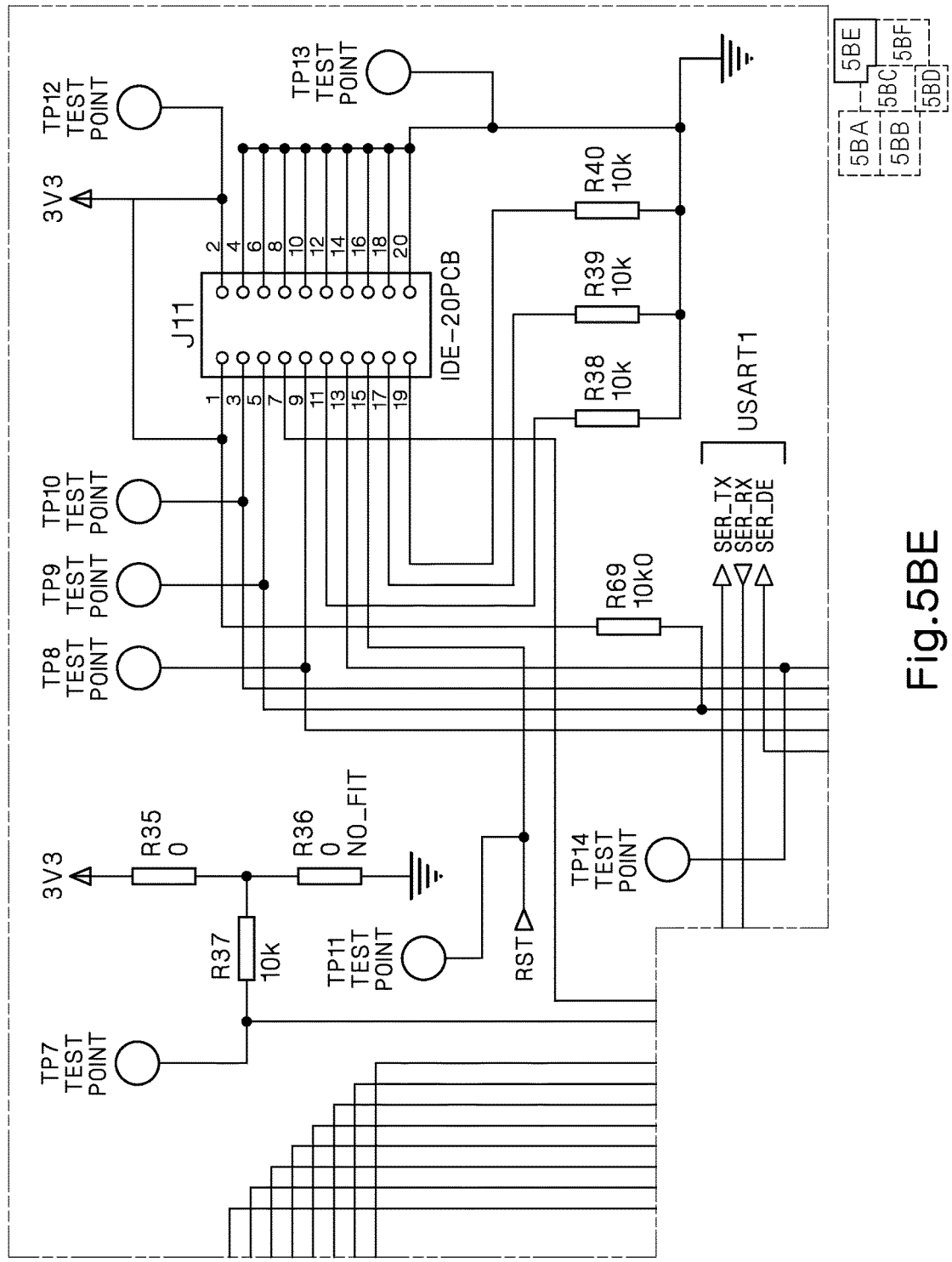
Figure 5B:
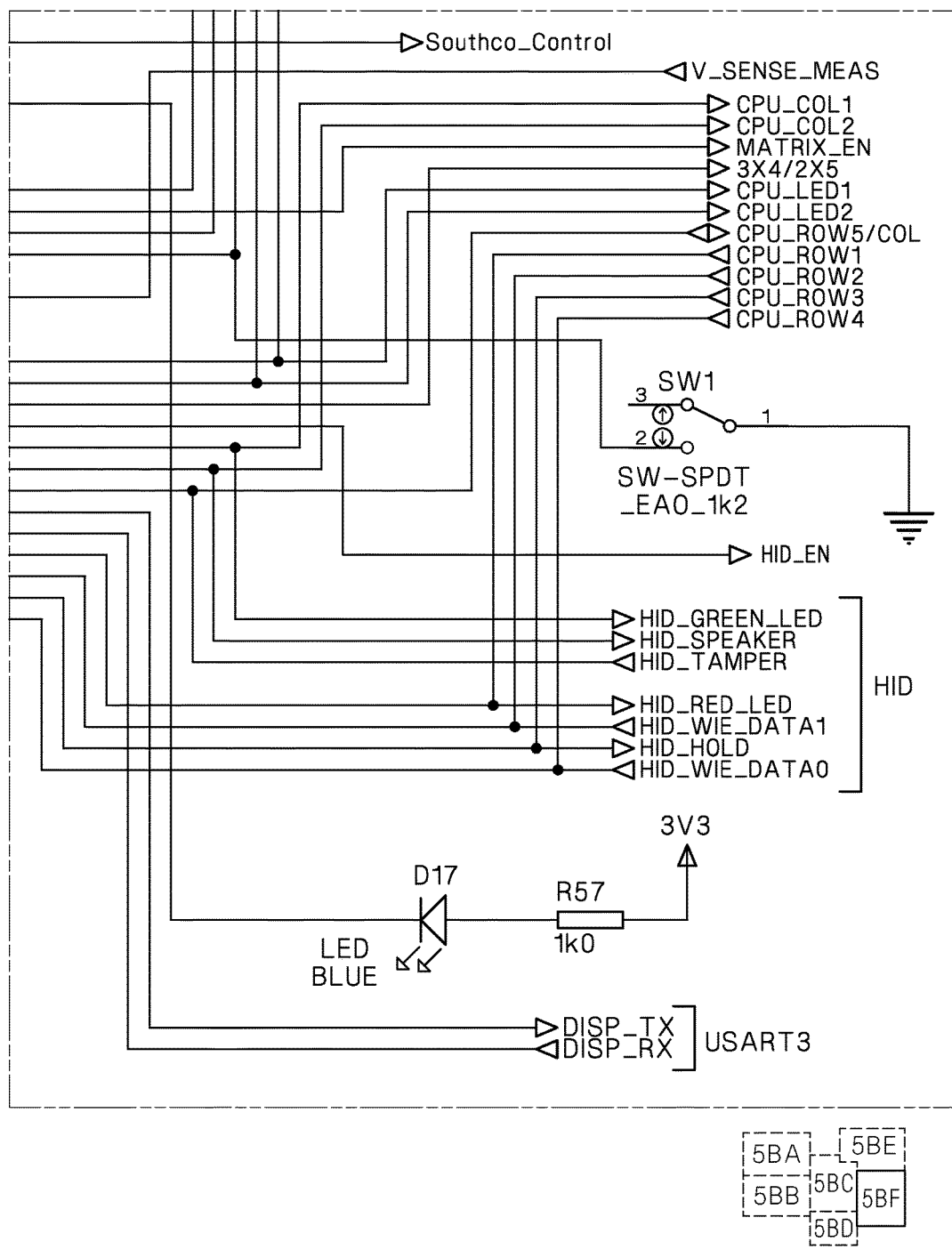
Figure 5C:
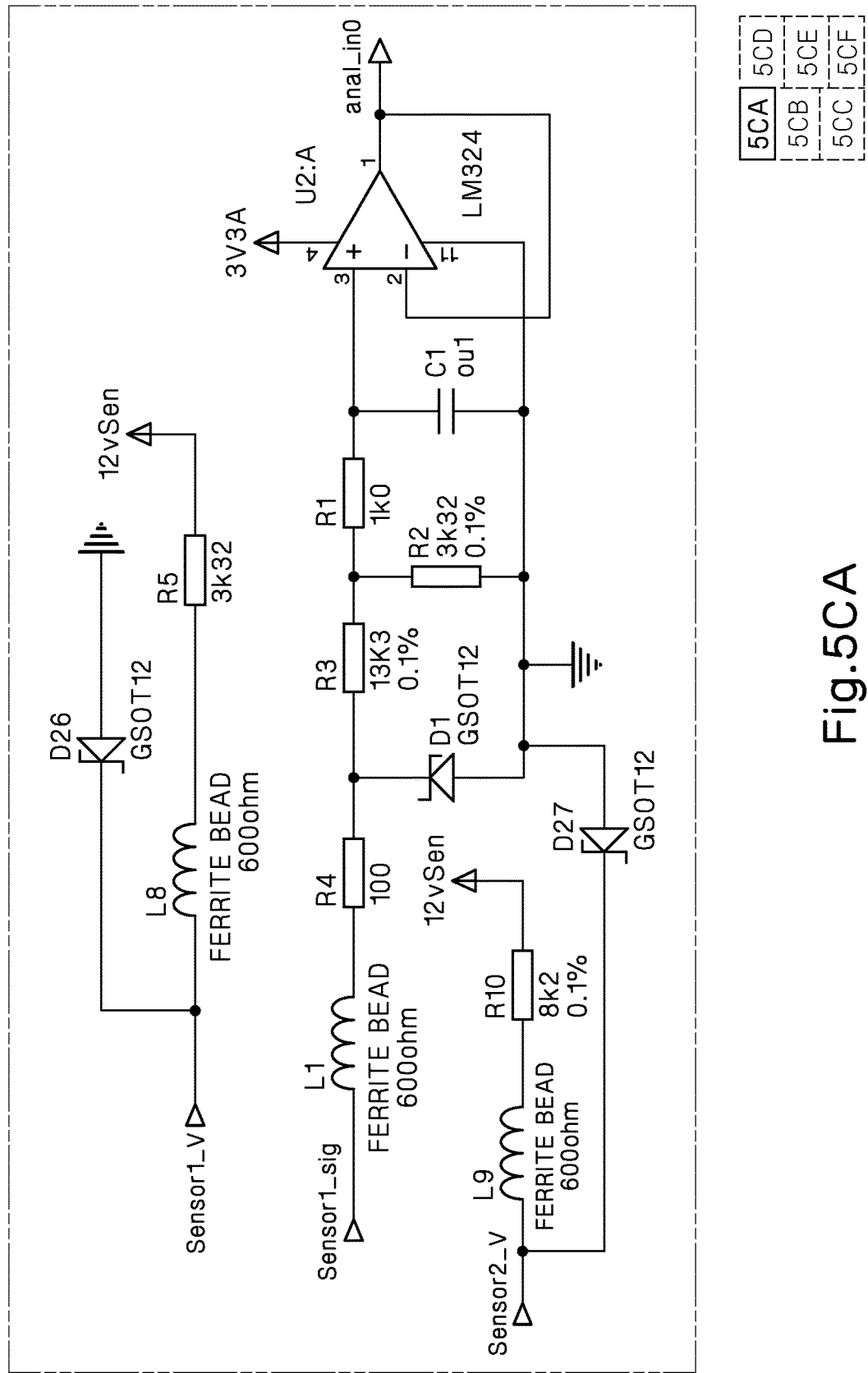
Figure 5C:
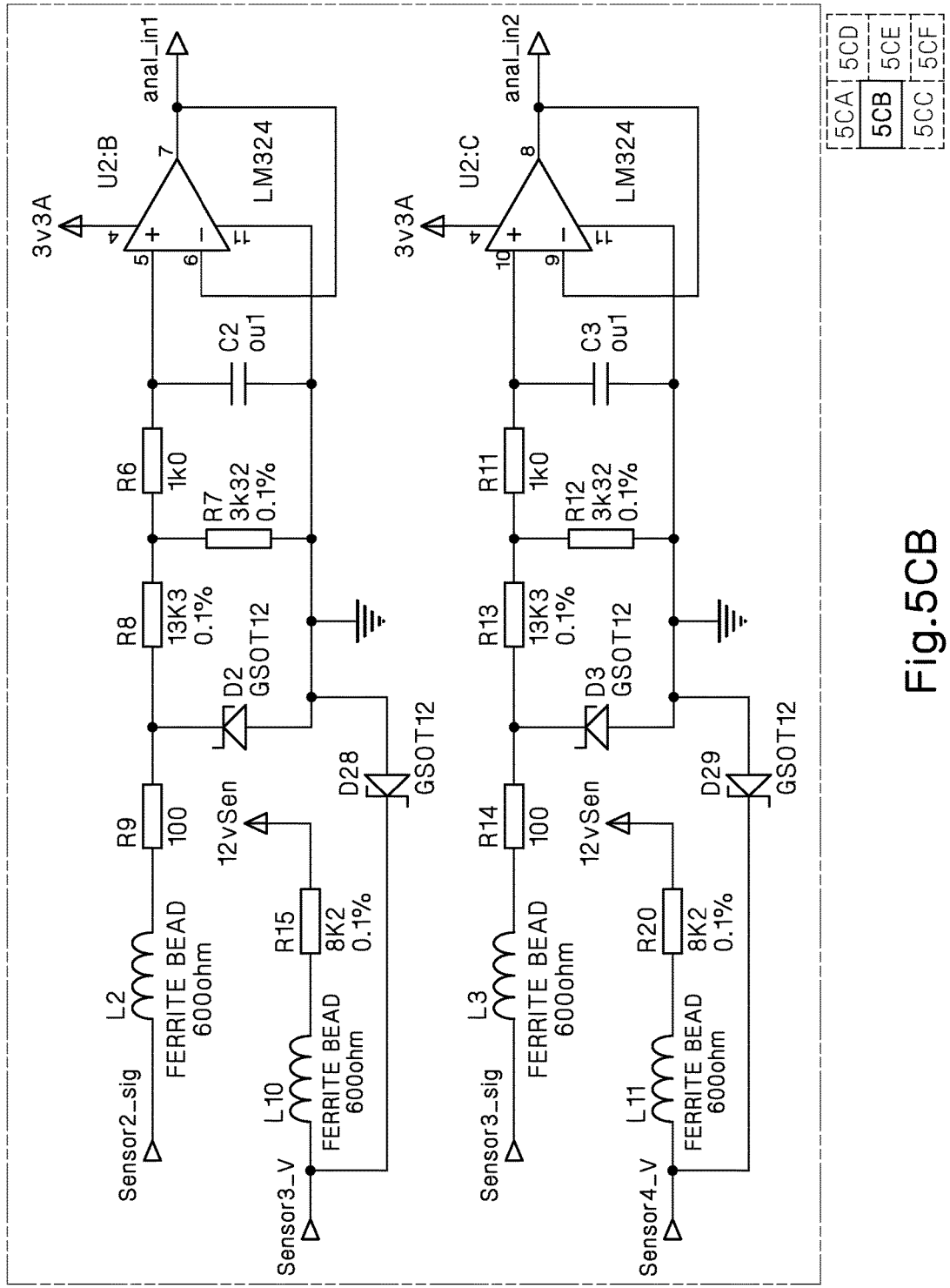
Figure 5C:
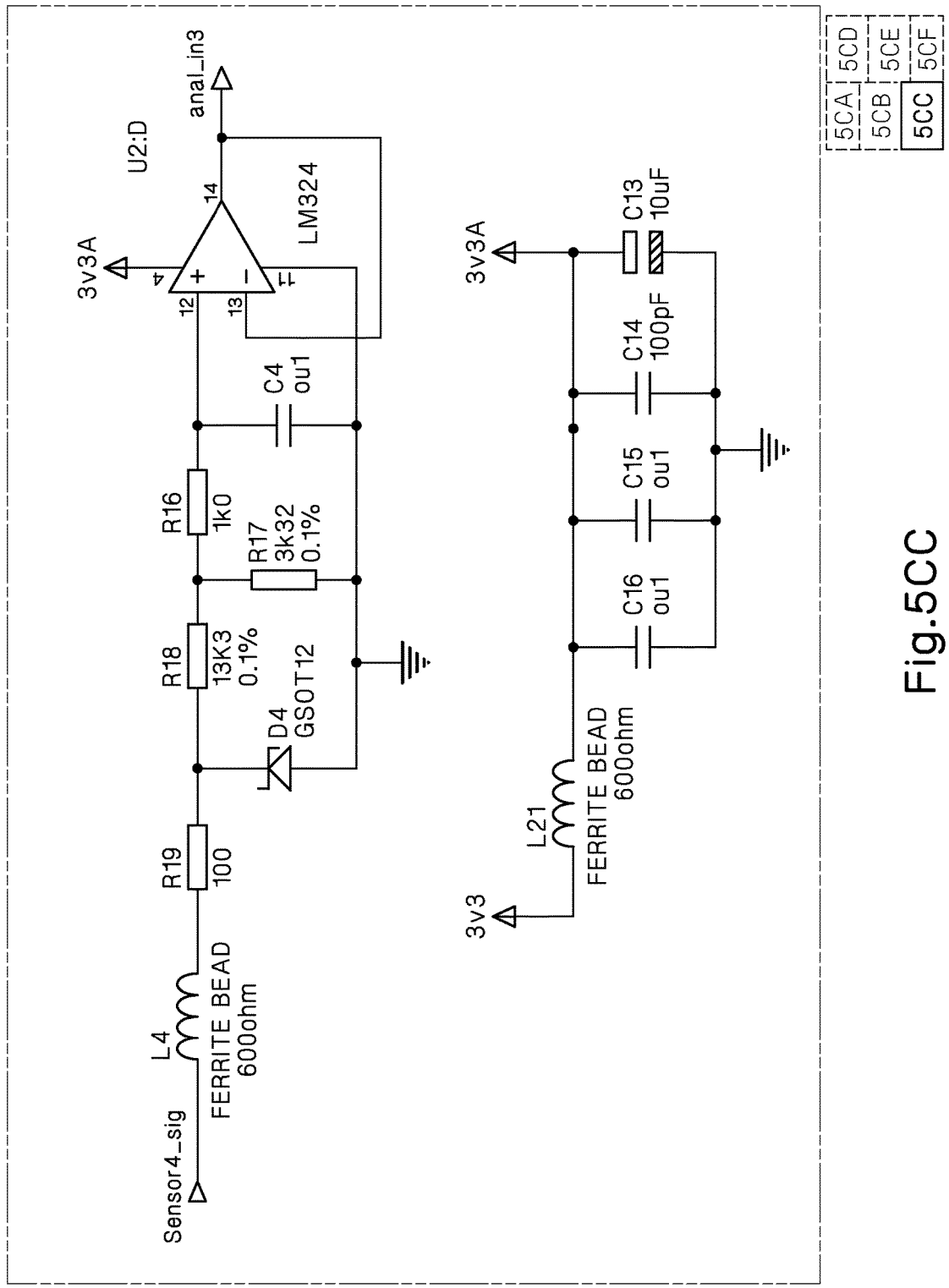
Figure 5C:
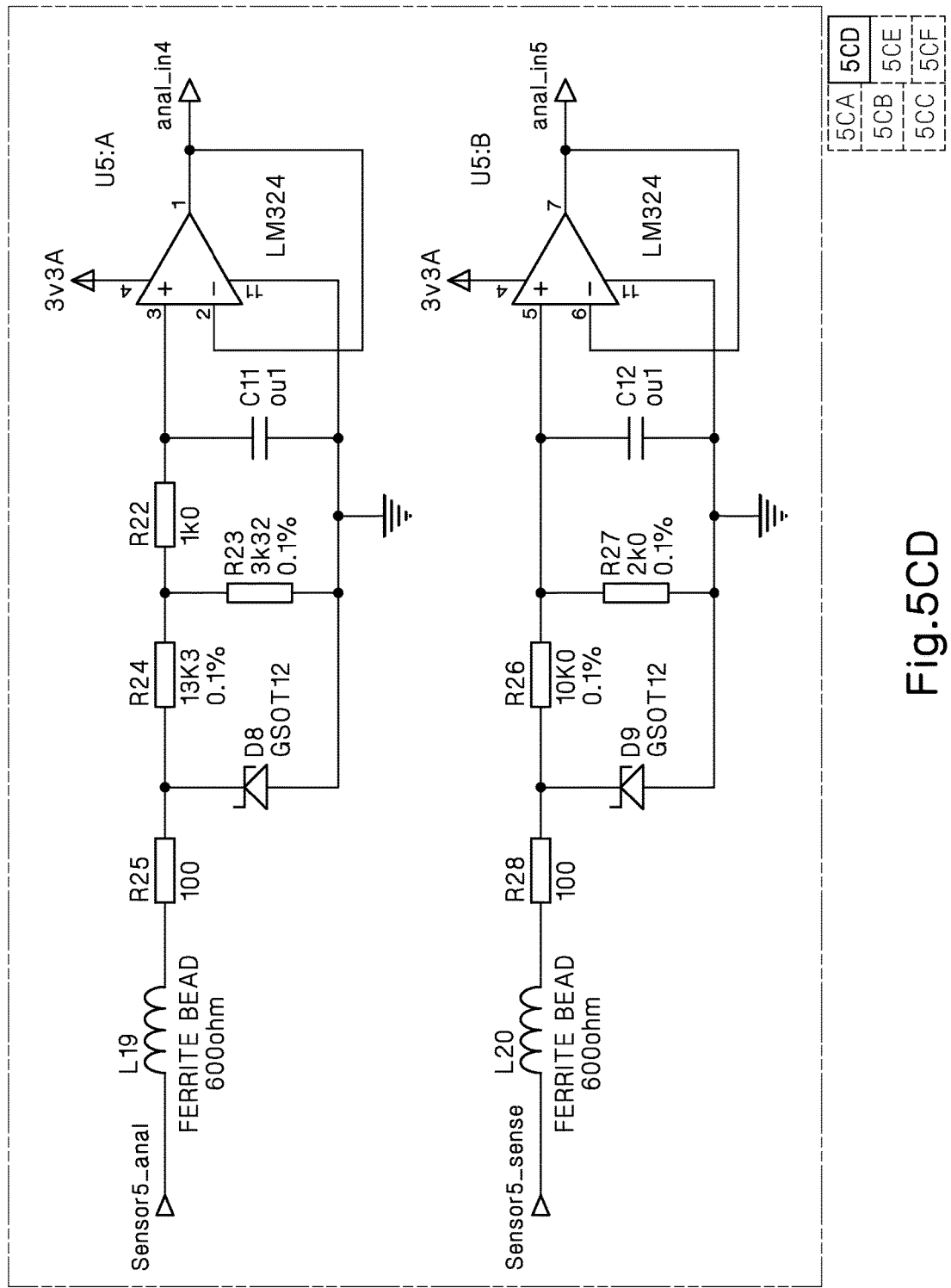
Figure 5C:
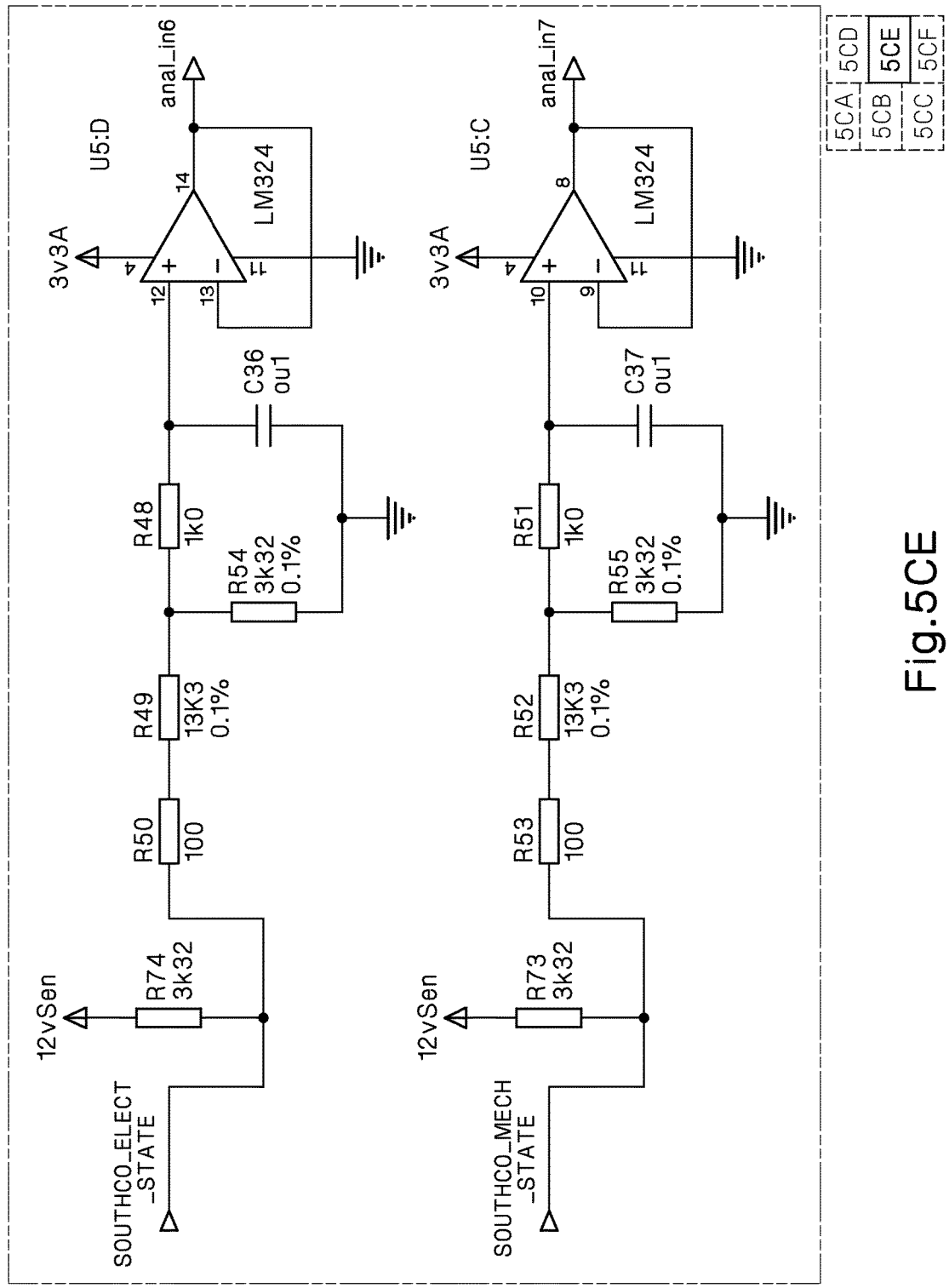
Figure 5C:
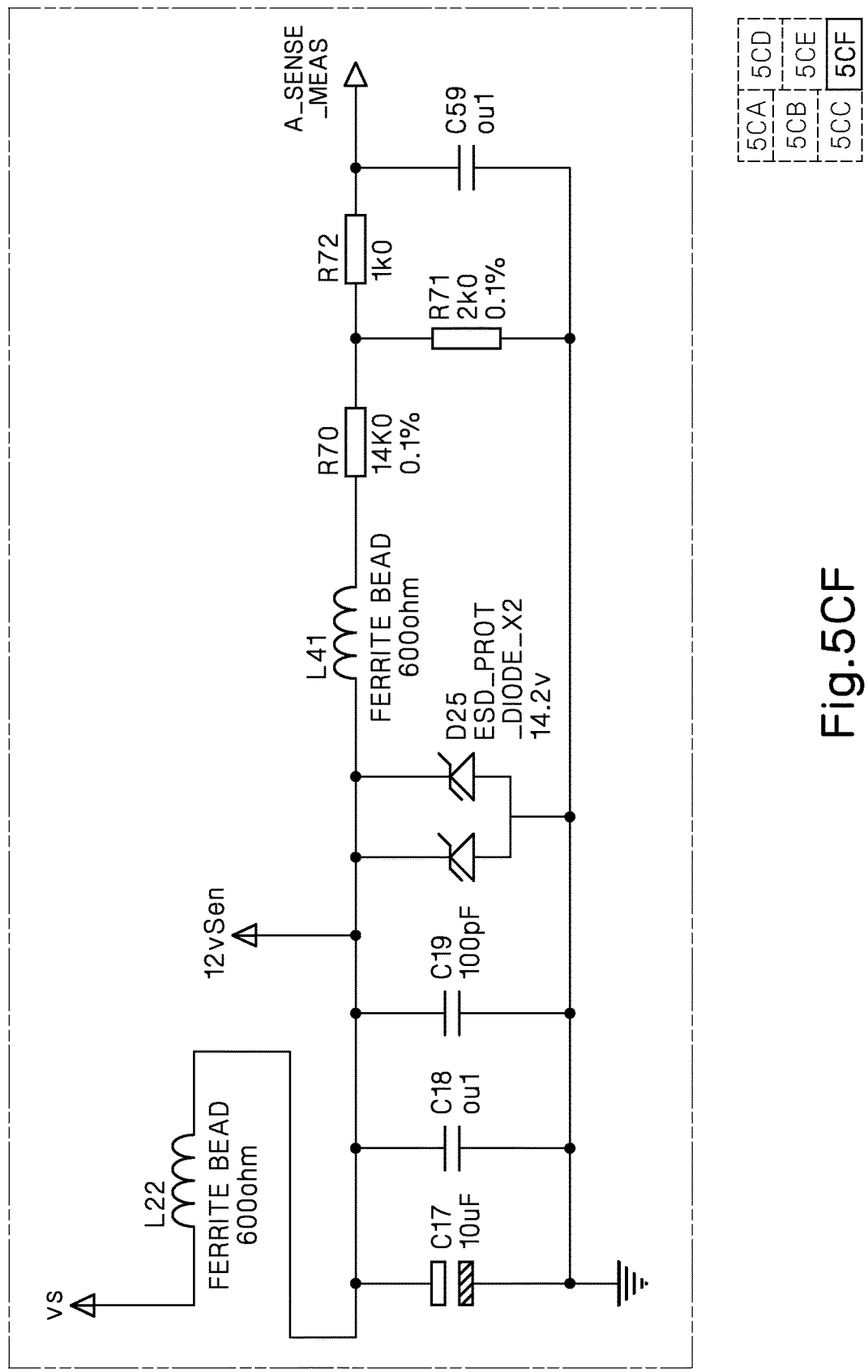
Figure 5D:
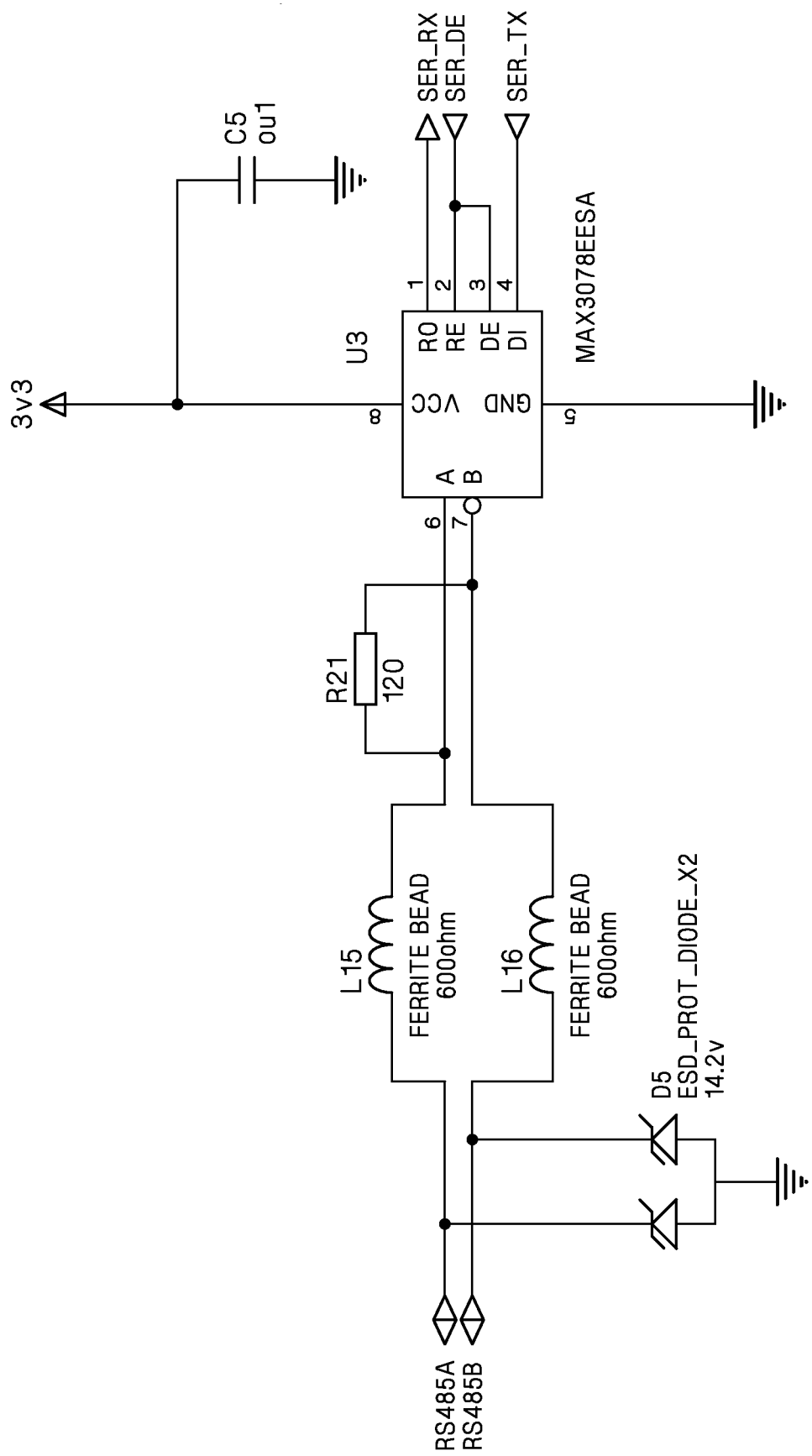
Figure 5E:
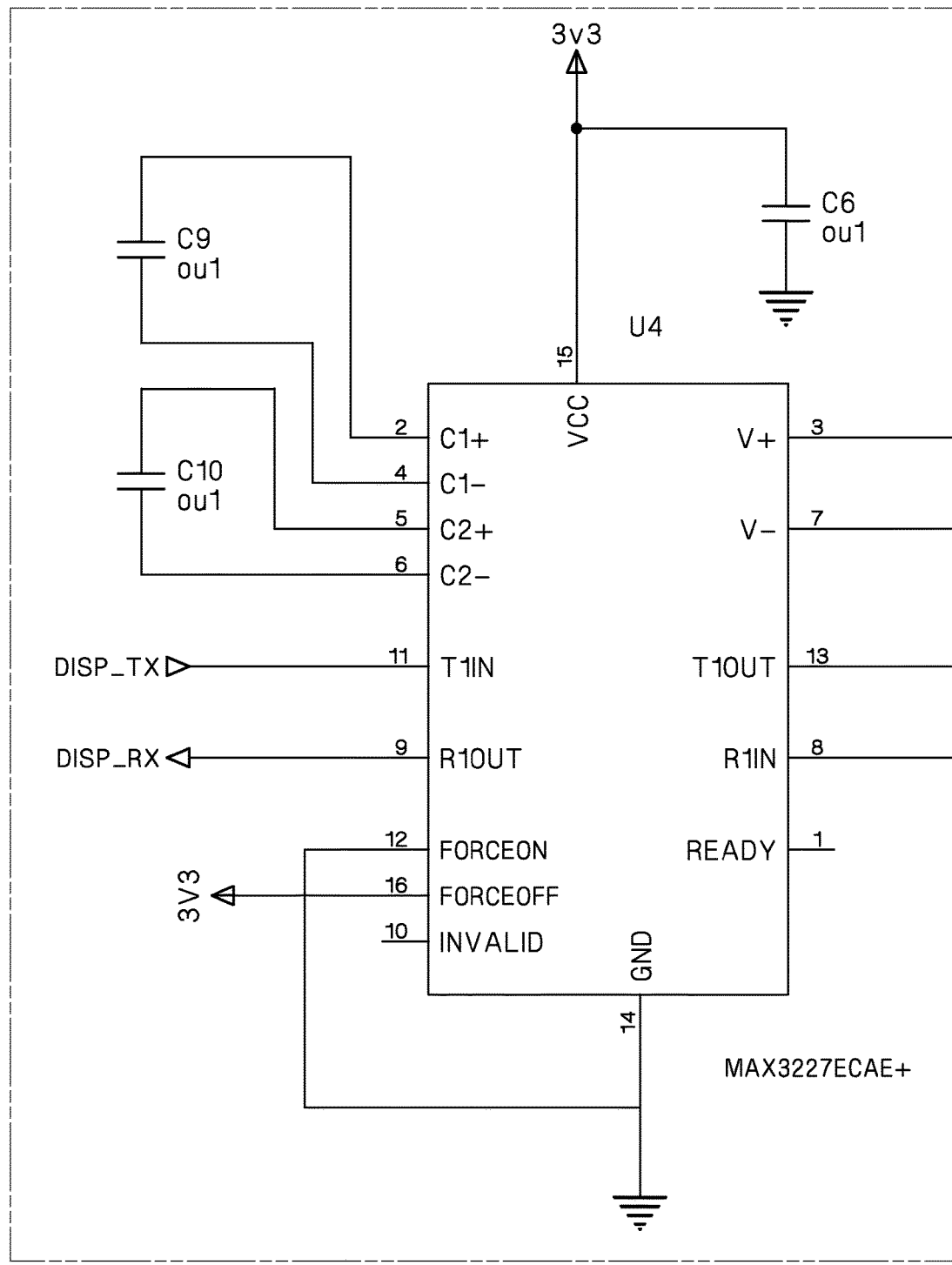
Figure 5E:
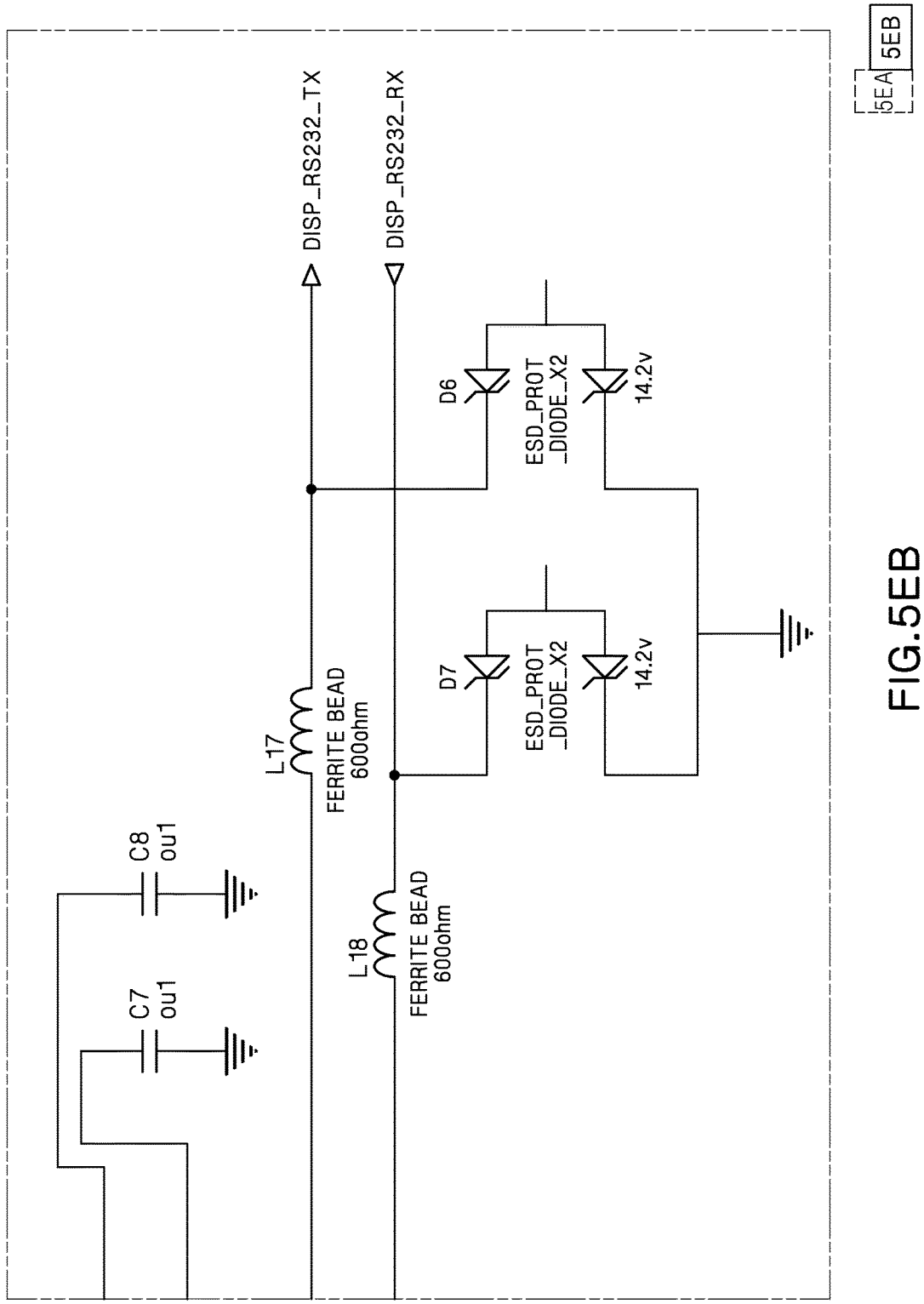
Figure 5F:
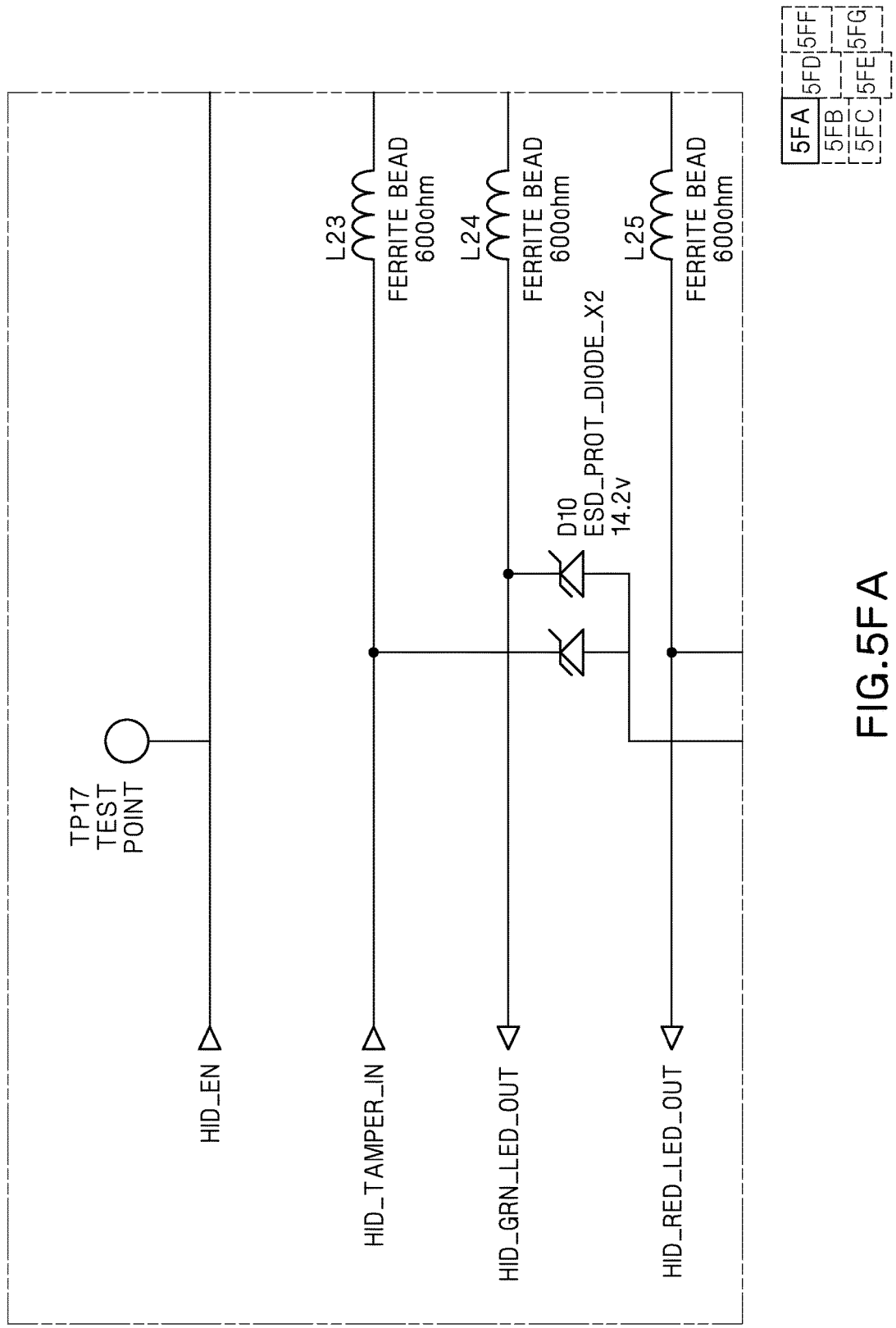
Figure 5F:
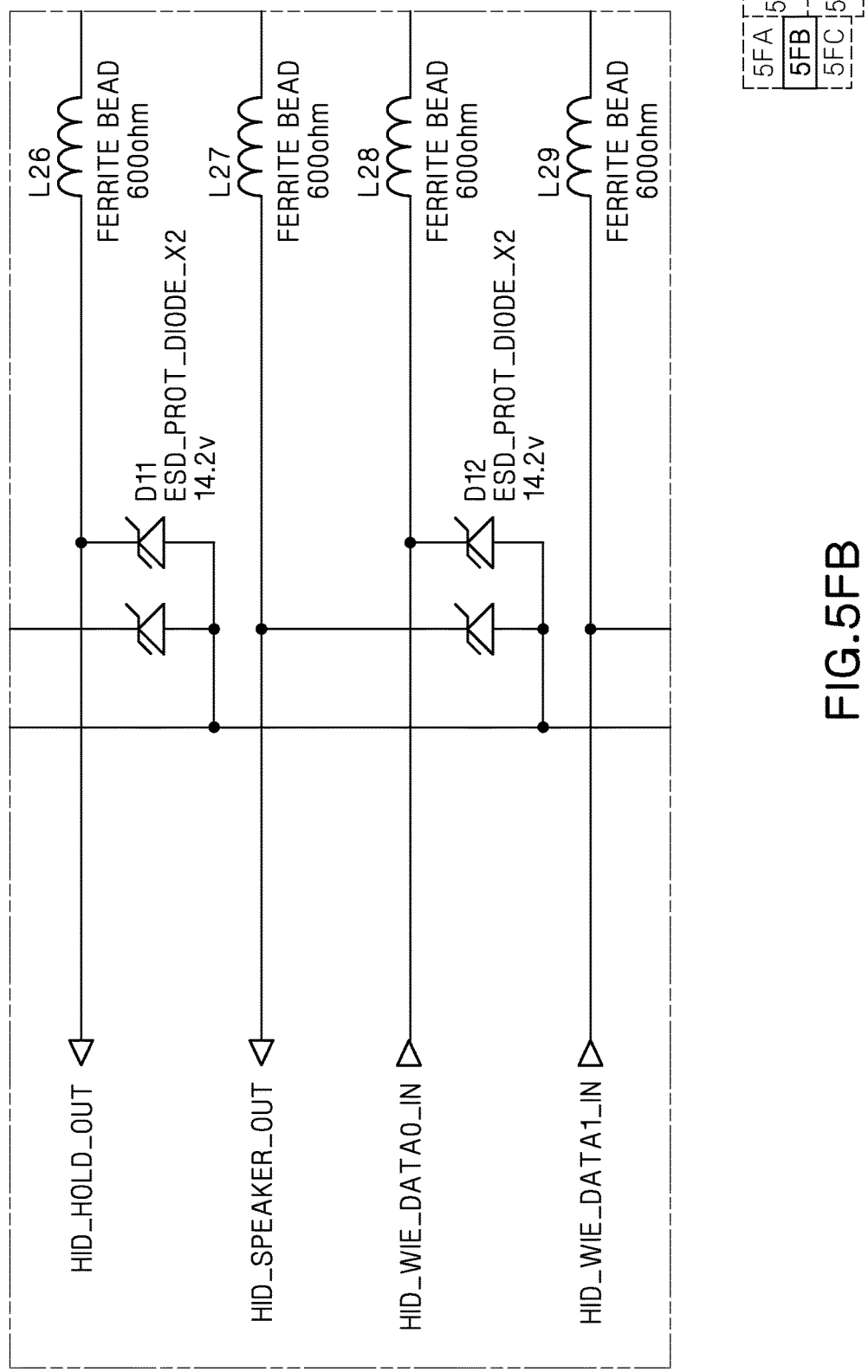
Figure 5F:
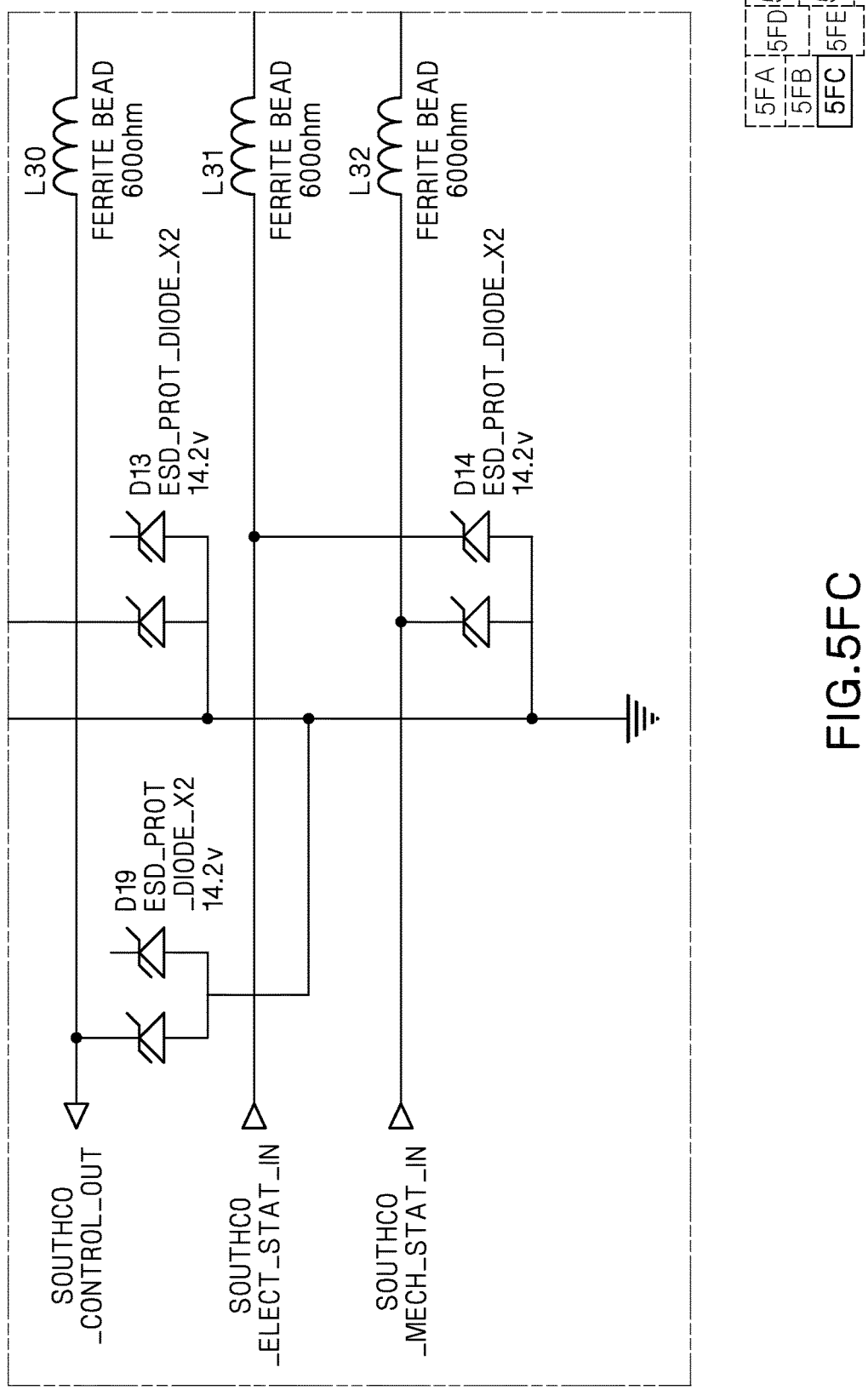
Figure 5F:
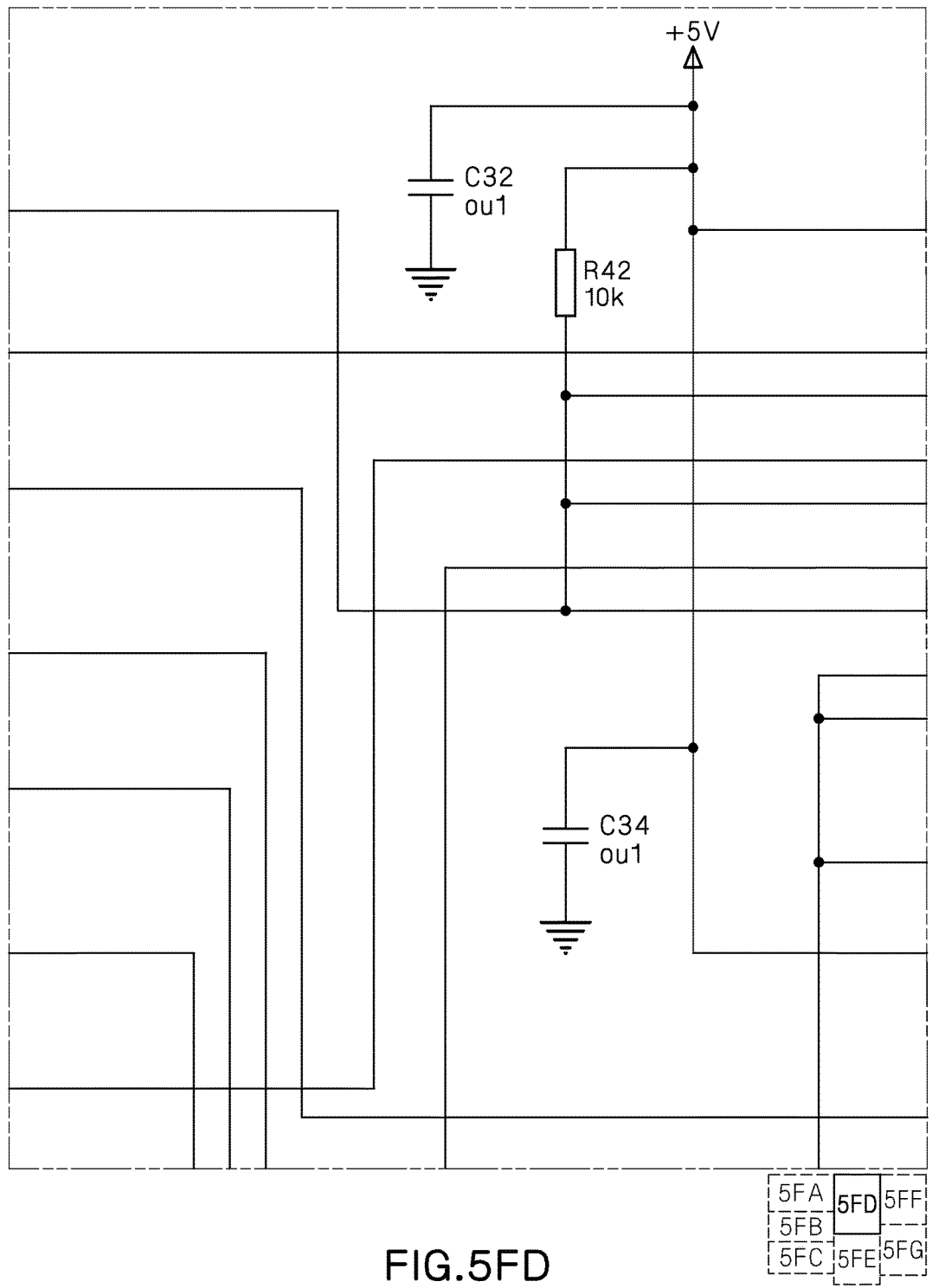
Figure 5F:
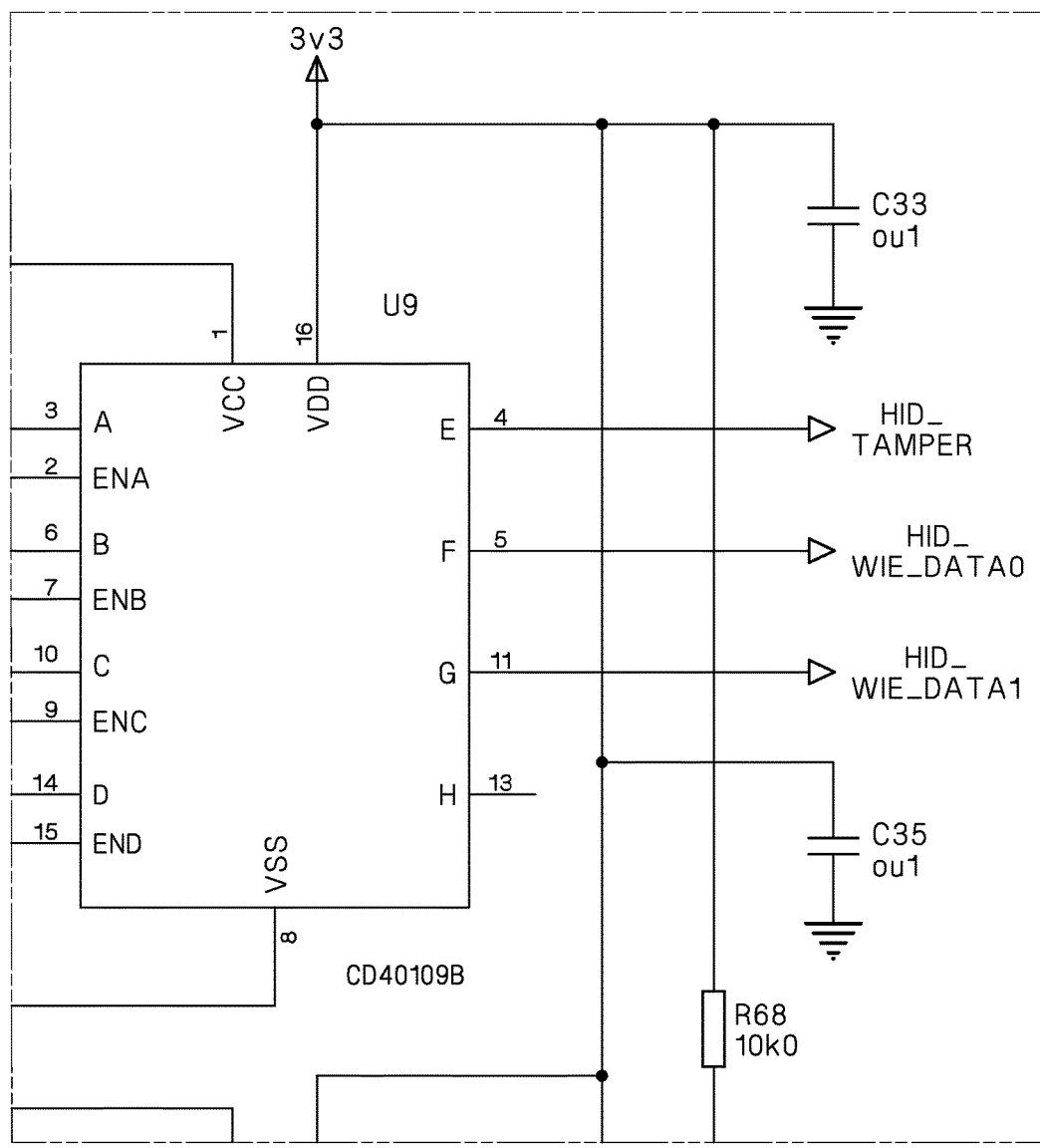
Figure 5G:
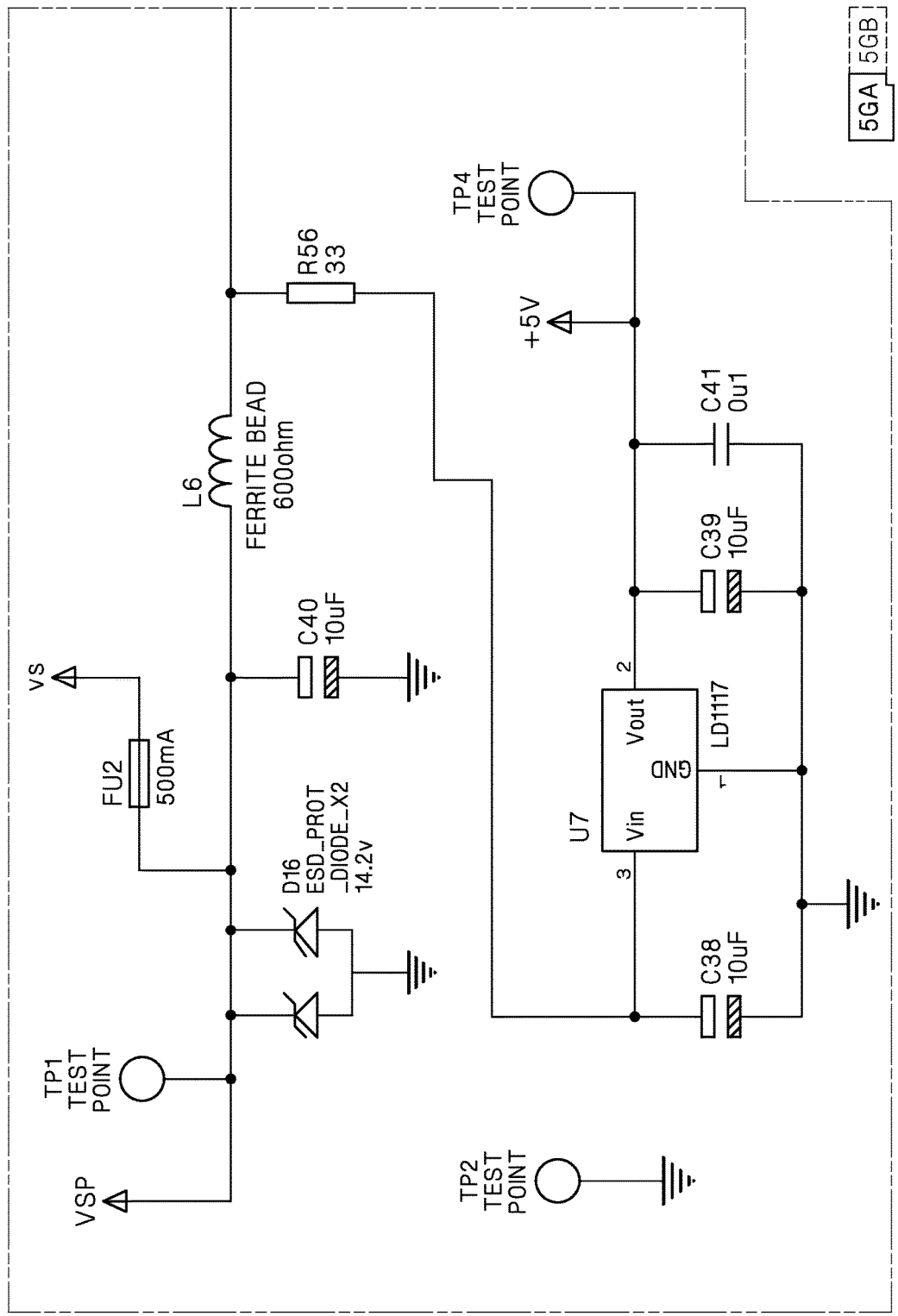
Figure 5G:
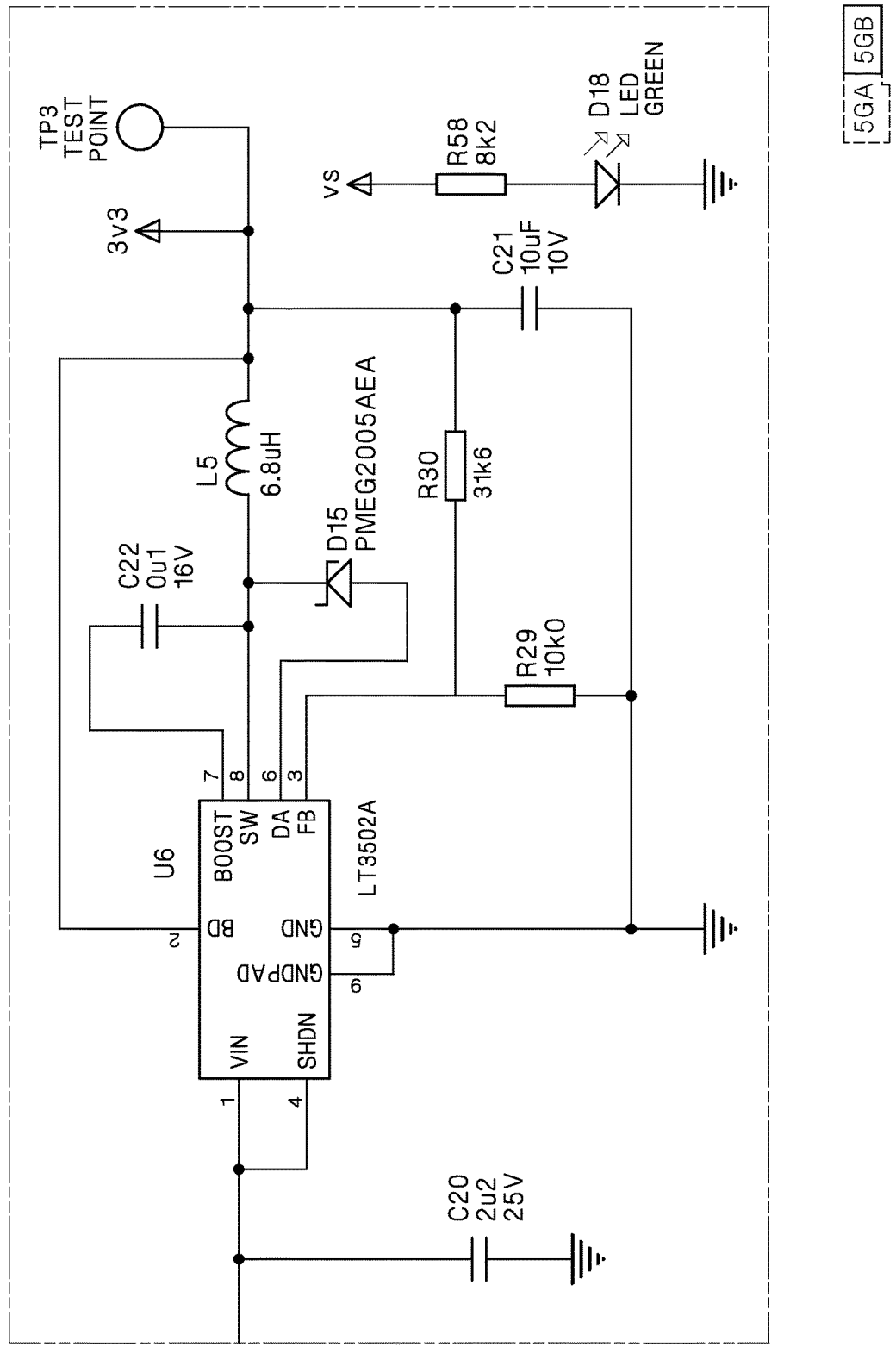
Figure 5H:
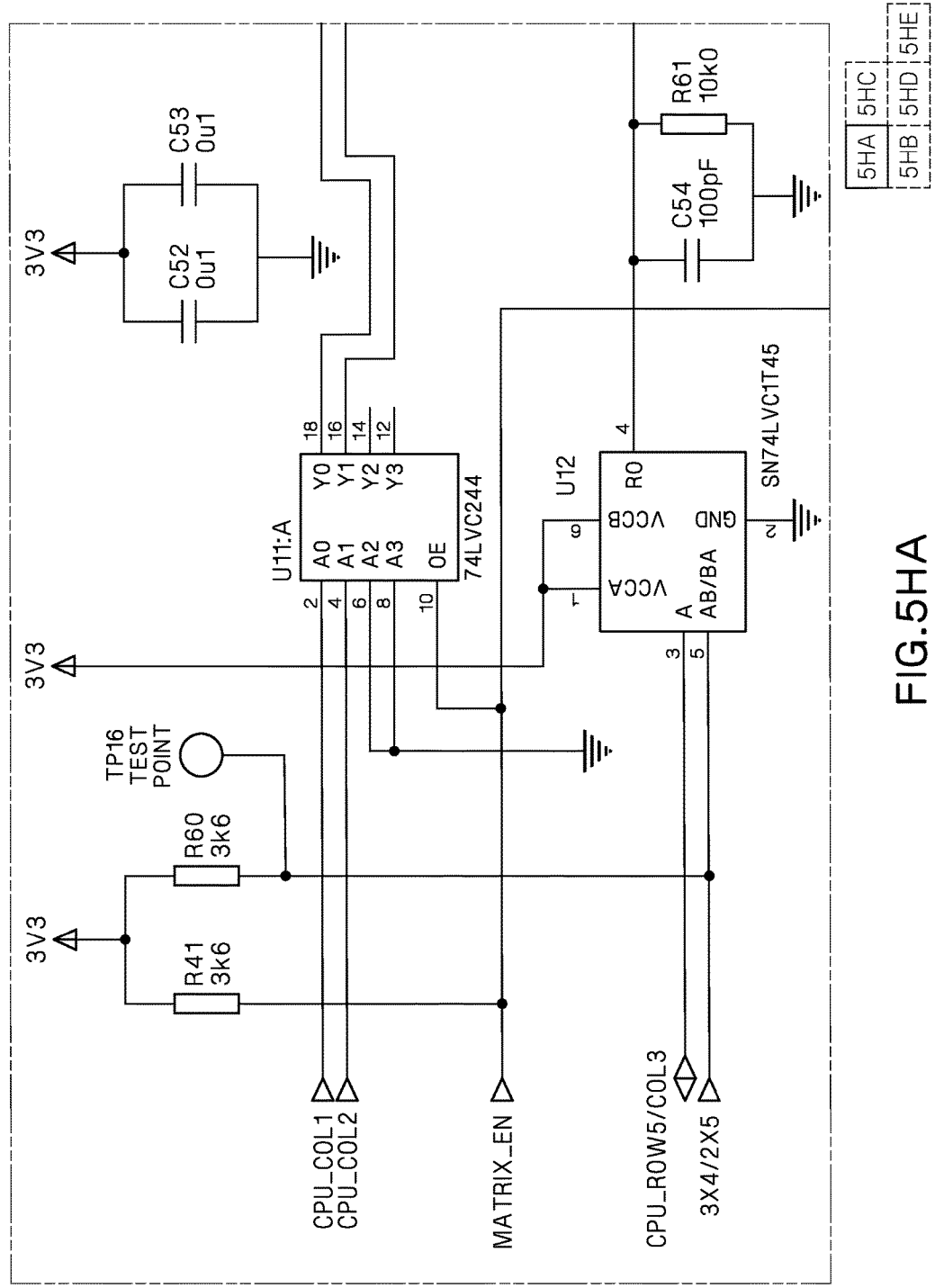
Figure 5H:
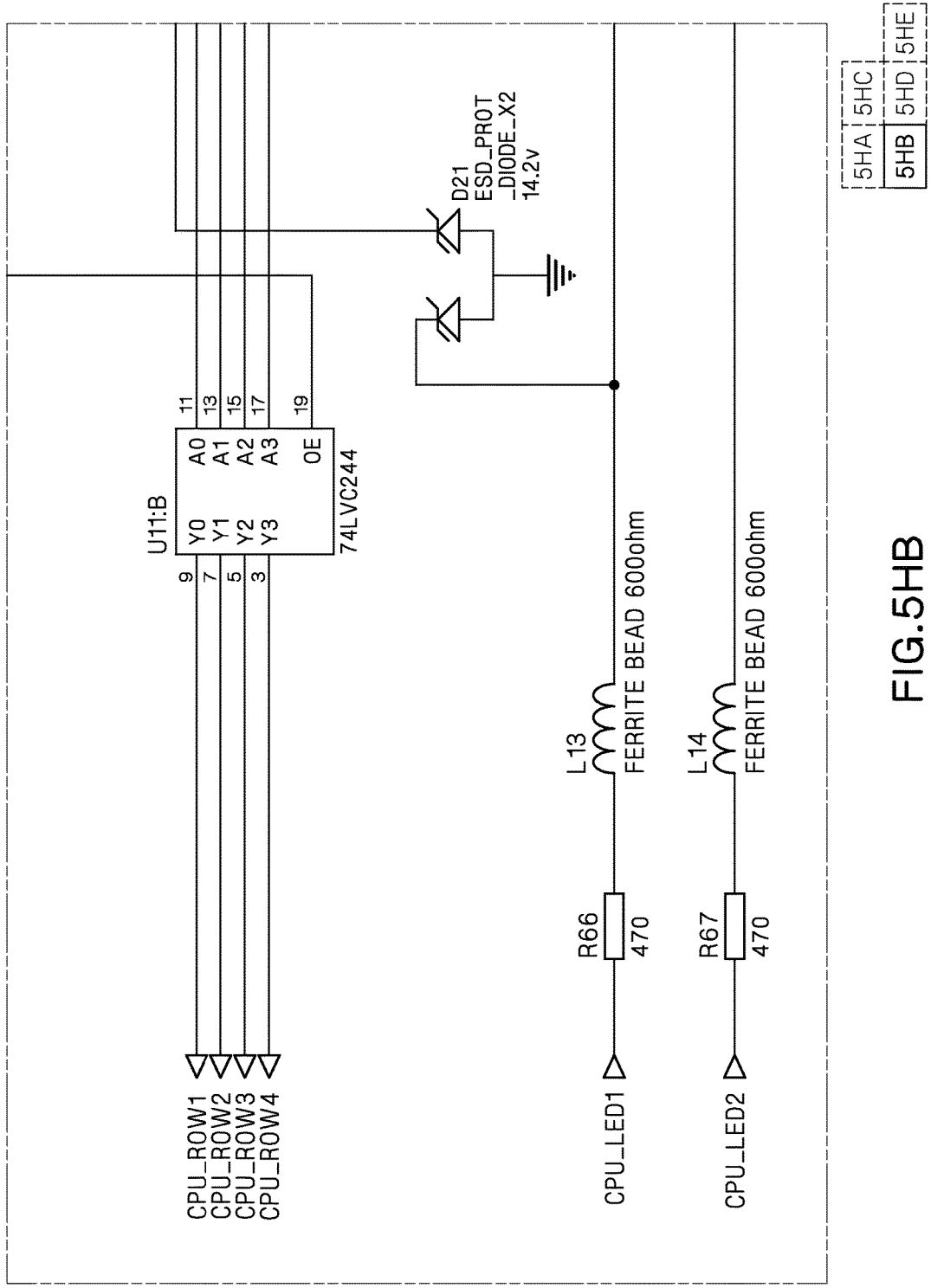
Figure 5H:
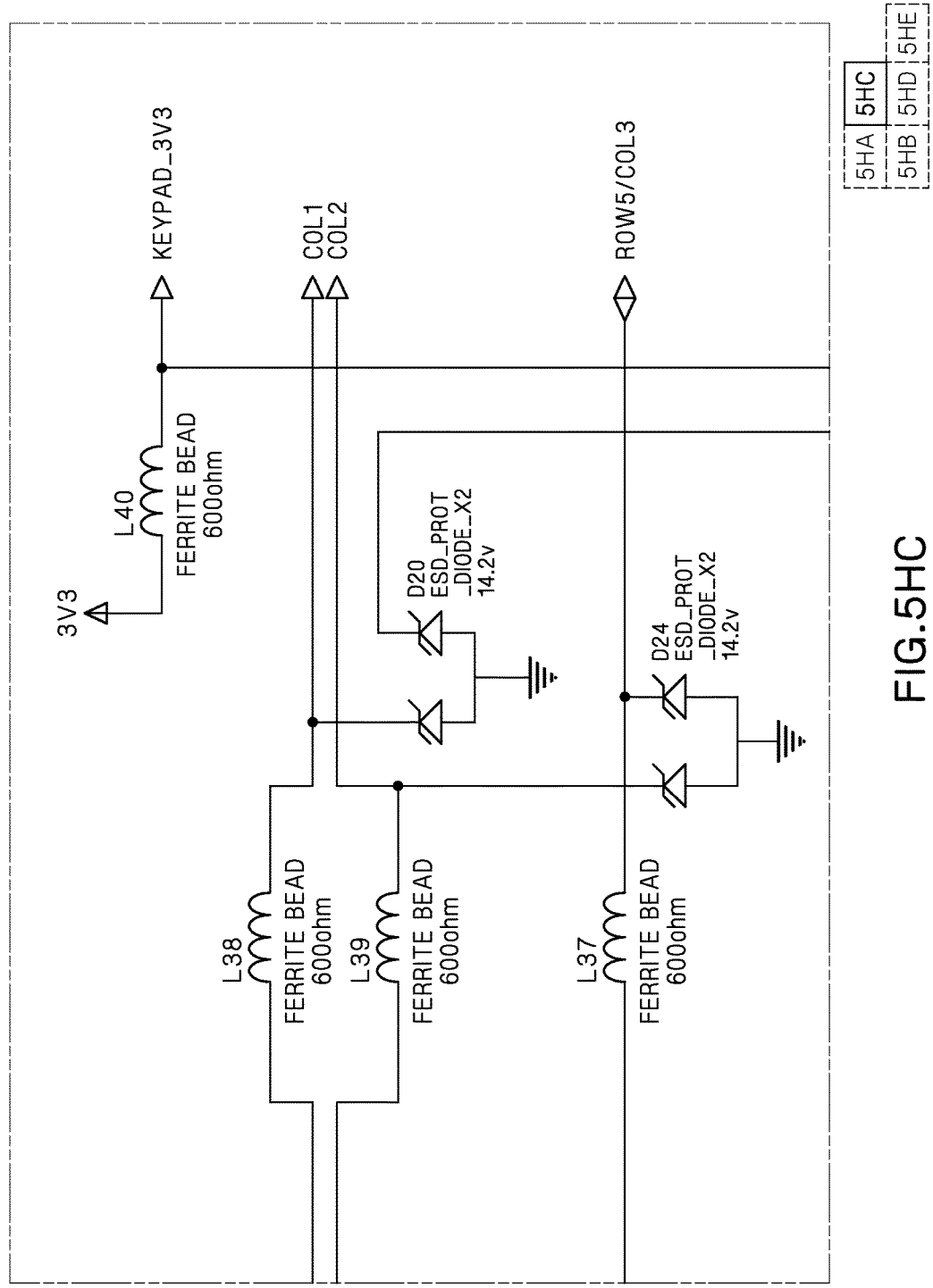
Figure 5H:
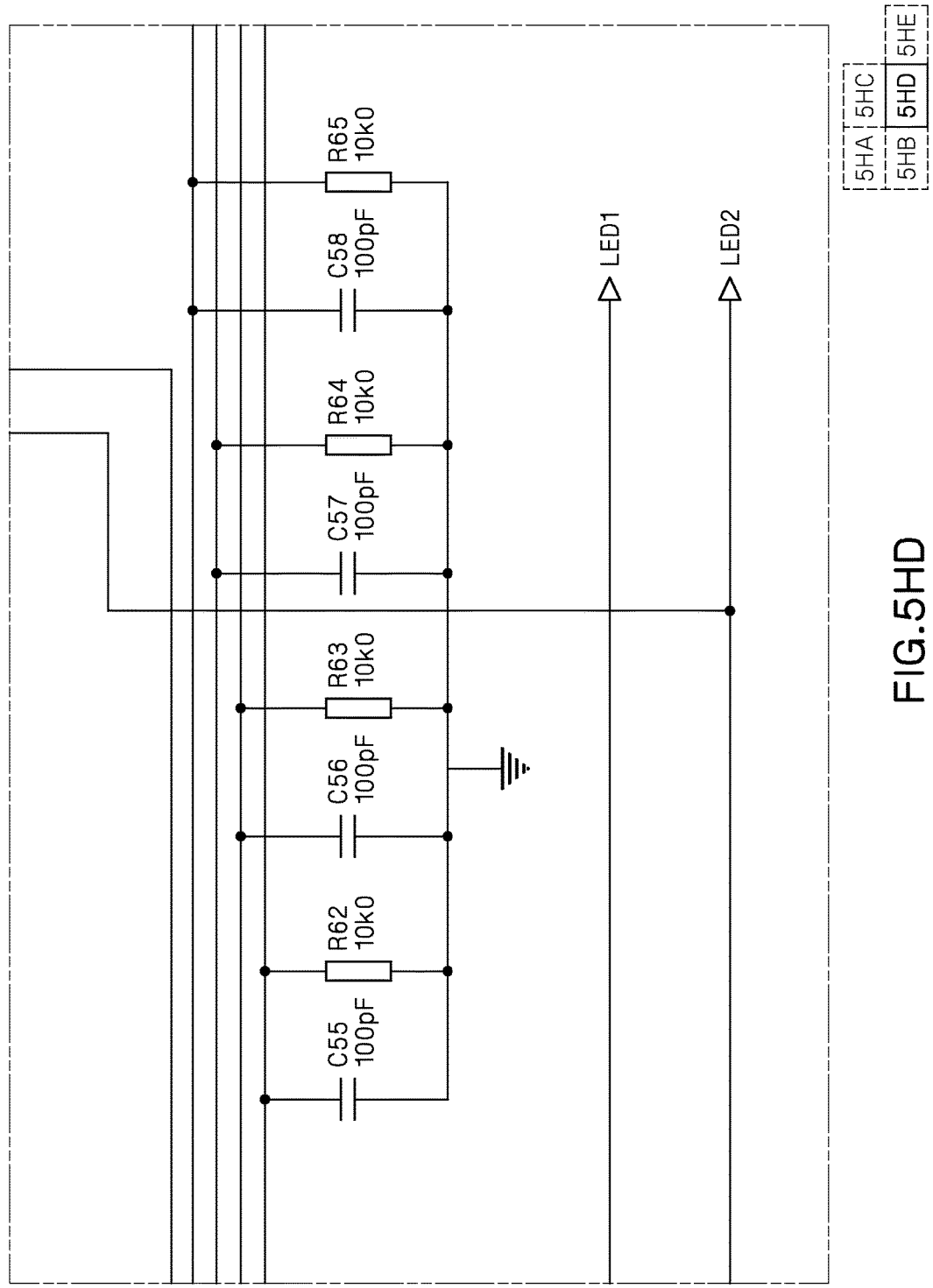
Figure 5H:
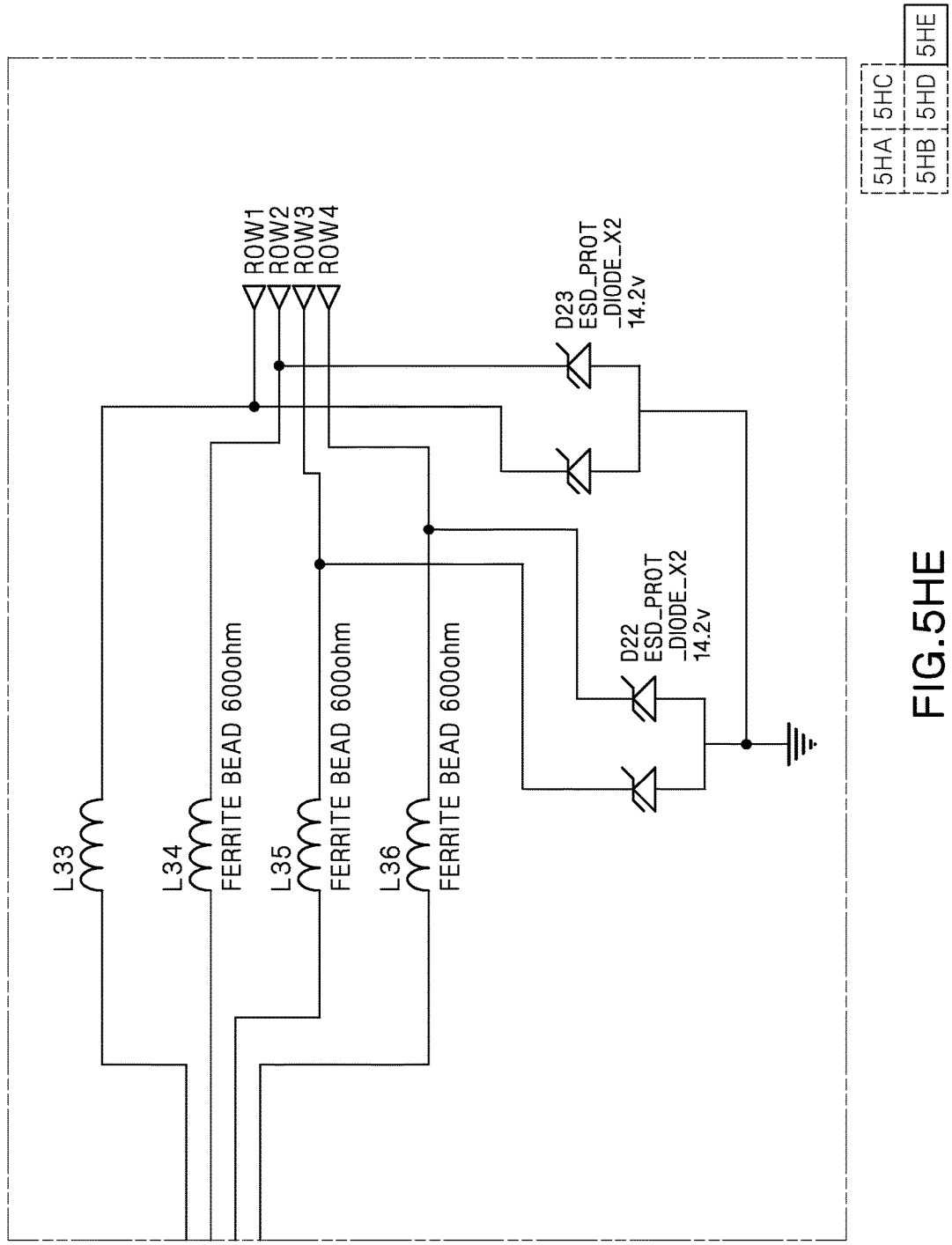

FIG. 4 shows an exploded view of the door module 170. In the currently described embodiment the door module's housing 232 is made up of two halves 235 which house a printed circuit board (PCB) 240 having thereon all necessary electronics and input/output ports. An exemplary set of electronic schematics employed in the design of the door module are shown in FIGS. 5A-5H. In particular, FIGS. 5AA-5AG illustrate the master schematic for the door module PCB with area 245, which is shown in greater details in FIGS. 5BA-5BF, representing the schematic for the micro controller components; area 250, which is shown in greater detail in FIGS. 5CA-5CF, representing the schematic for the sensor inputs; area 255, which is shown in greater detail in FIG. 5D, representing the schematic for the RS485 interface; area 260, which is shown in greater detail in FIGS. 5EA-5EB, representing the schematic for the RS232 display port; area 265, which is shown in greater detail in FIGS. 5FA-5FG, representing the schematic for the HID interface; area 270, which is shown in greater detail in FIGS. 5GA-5GB, represents the schematic for the power supply; and area 273, which is shown in greater detail in FIGS. 5HA-5HE, represents the schematic for the matrix keypad connection.

Figure 6:
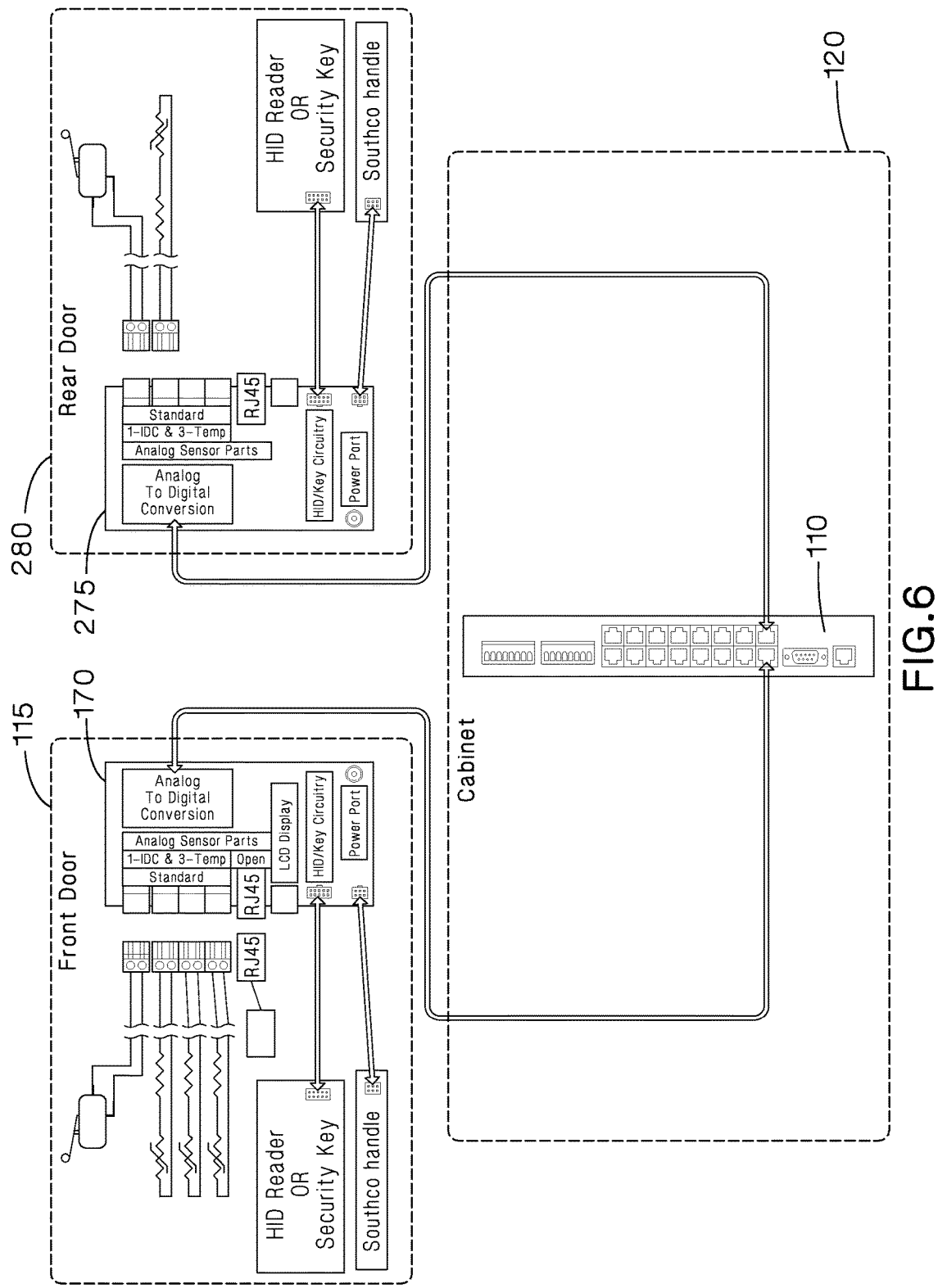
FIG. 6 illustrates a system block diagram according to an embodiment of the present invention.

FIG. 6 illustrates a further modification to the embodiment described above wherein a second door module 275 is installed on a rear door 280 of the network cabinet 100. The second door module 275 can be used and connected to the gateway 110 in the same way as the first door module 170, allowing the rear door 280 to be dismounted and/or reinstalled without having to disconnect each of the door-mounted electronic devices from the gateway 110 individually.

Figure 7:
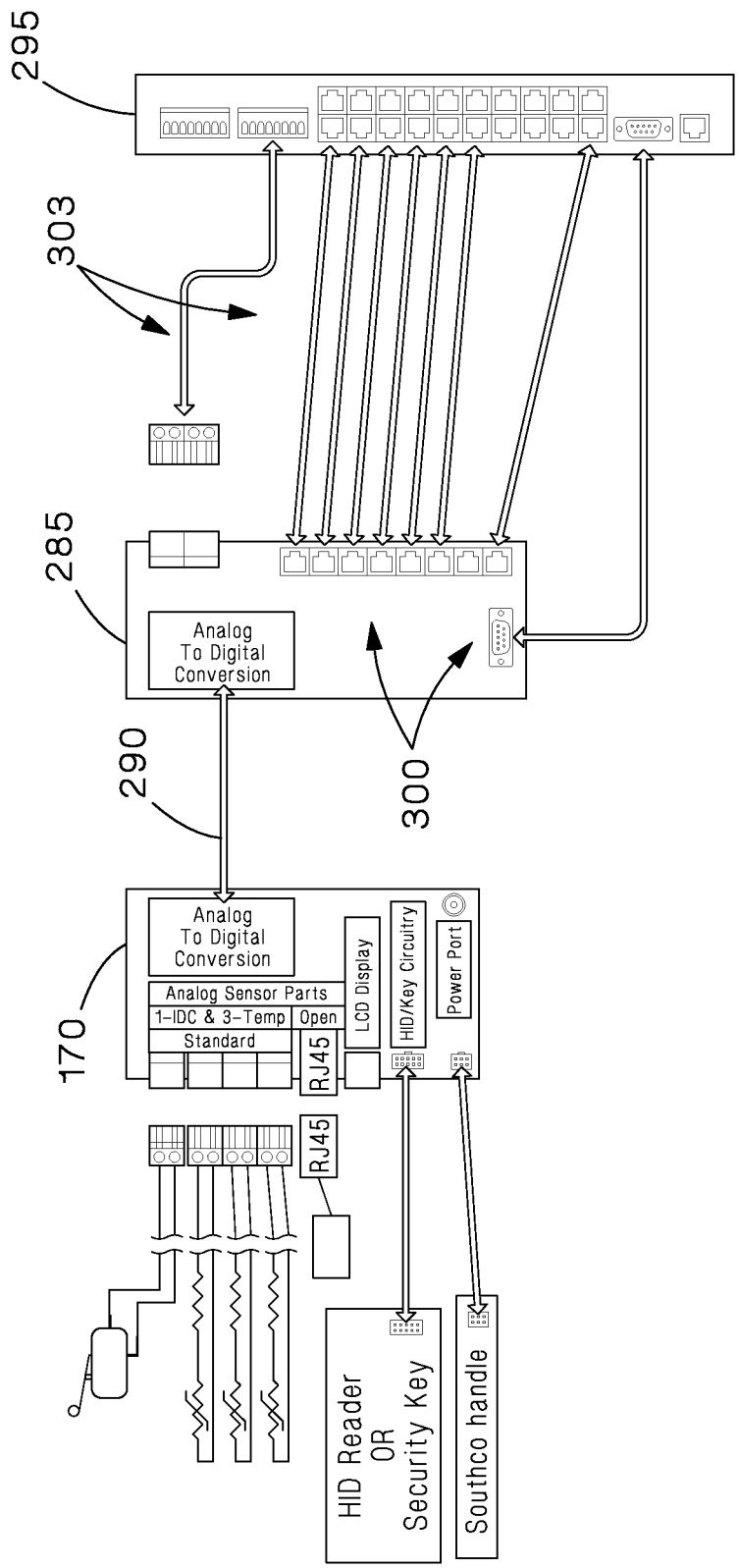
FIG. 7 illustrates a system block diagram according to an embodiment of the present invention.

FIG. 7 illustrates an alternative embodiment of the present invention. In this case, rather than providing a direct single-cable connection 230 from the door module 170 to the gateway, an intermediate device is positioned between the door module and the gateway. The intermediate device 285 is mounted on the frame 120 and can take a form of a patch panel, a PCB enclosed by a housing, or any other suitable design that is within the grasp of one of ordinary skill in the relevant art. To retain the feature of having only one communication cable extending between the door and the frame of the cabinet, the door module 170 is linked to the intermediate device 285 via a single cable 290. While in the currently described embodiment the cable 290 is shown as an RJ45 cable, alternative embodiments (see FIG. 9 for an example) can use other types of communication cables. The embodiment of FIG. 7 may be more advantageous in situations where the gateway 295 is incapable of de-multiplexing the multiplexed signal generated by the door module 170. To address this, the intermediate device 285 can include de-multiplexing hardware/firmware that can extract the originally multiplexed signals, and channel them to appropriate gateway inputs via its own set of interfaces 300 and respective cables 303. The same can be said about signals that are being transmitted from the gateway 295 to the door module 170. In situations where the gateway 295 is incapable of multiplexing multiple signals for transmission over a single cable, the intermediate device 285 handles the multiplexing before transmitting the multiplexed signal over the cable 290.

Figure 8:
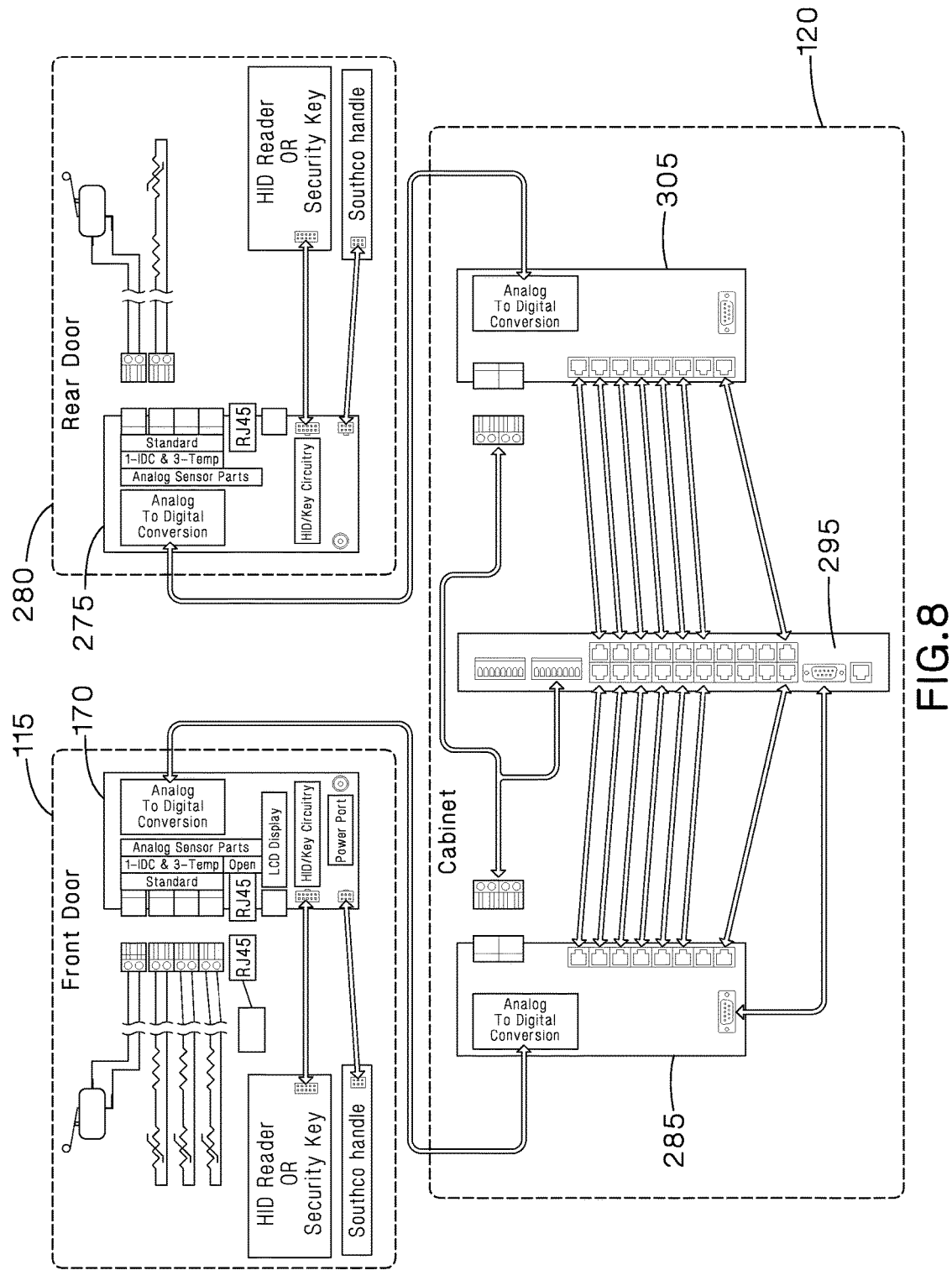
FIG. 8 illustrates a system block diagram according to an embodiment of the present invention.

FIG. 8 illustrates how the embodiment of FIG. 7 can be used on both front and rear doors 115, 280 when employing a first and a second door modules 170, 275 in conjunction with a first and a second intermediate device 285, 305. Note that the second intermediate device 305 may be designed in the same/similar manner as the first intermediate device 285 and can be mounted at a convenient location on the cabinet frame 120 (e.g., rear of the cabinet frame).

Figure 9:
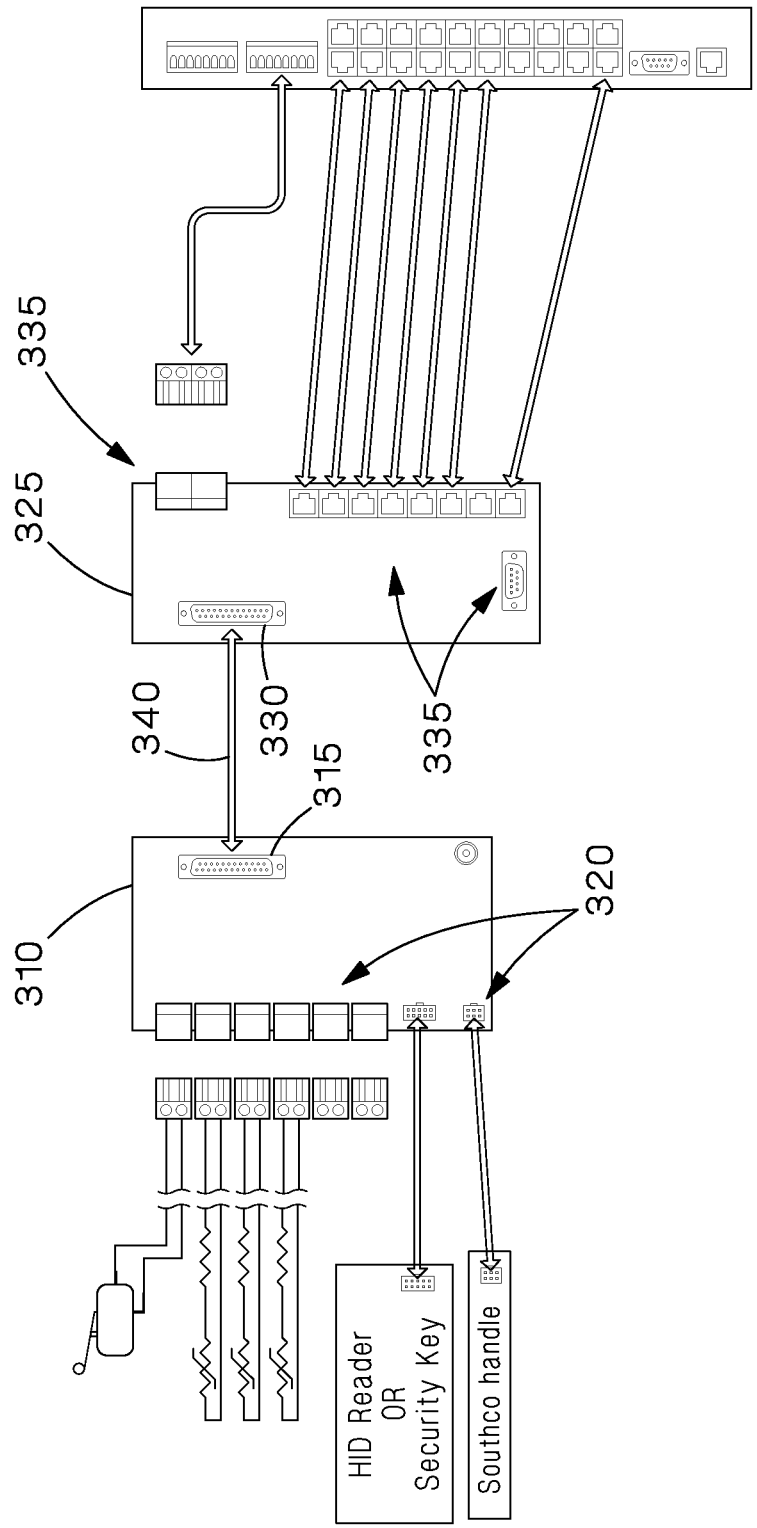
FIG. 9 illustrates a system block diagram according to an embodiment of the present invention.

Another embodiment of the present invention is shown in FIG. 9. Whereas in the previously described embodiment the door module 170 included hardware/firmware that would enable signals communicated between the door-mounted electronic devices and the gateway to be transmitted via a single twisted-pair communication cable for at least a portion of that distance, the embodiment shown in FIG. 9 relies on a pass-through configuration. Rather than multiplexing and de-multiplexing signals, the door module 310 does not condition any of the signals transmitted between the connector 315 and the various ports that connect to the door-mounted electronic devices. The same may hold true for the intermediate device 325, where the signals transmitted between the connector 330 and the various ports 335 are not conditioned. Connectors 315, 330 may be D-type serial connectors and may be connected via a single D-type serial cable 340. Reducing the amount of electronics and complexity may increase reliability and reduce costs.

In yet another configuration, door module 310 and the intermediate device 325 may combine the use of multiplexing/de-multiplexing for some door-mounted electronic devices with straight-through communication for some other door-mounted electronic devices.

Figure 10:
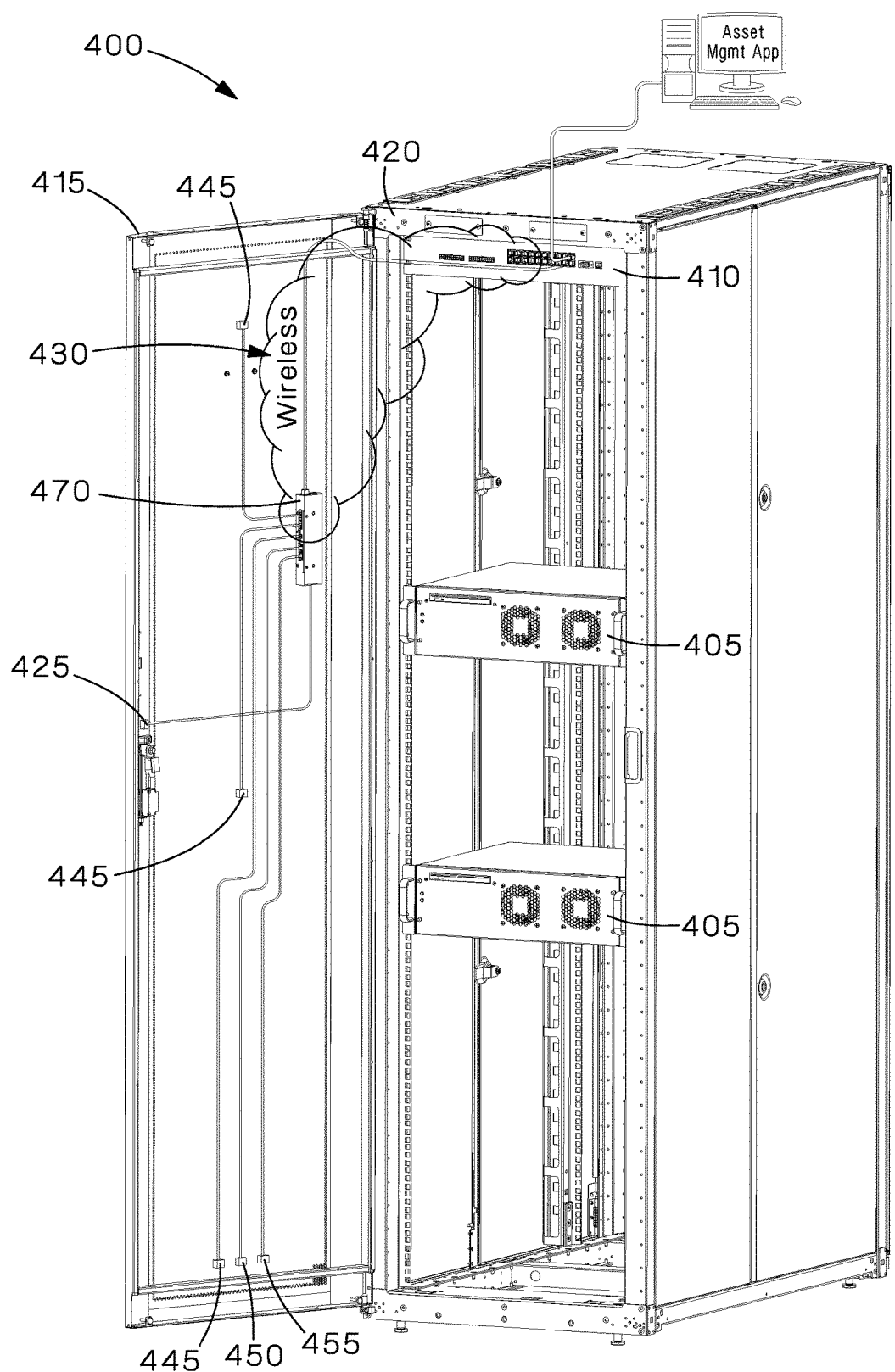
FIG. 10 illustrates an embodiment of a network cabinet showing the back side of the cabinet's front door.
Figure 11:
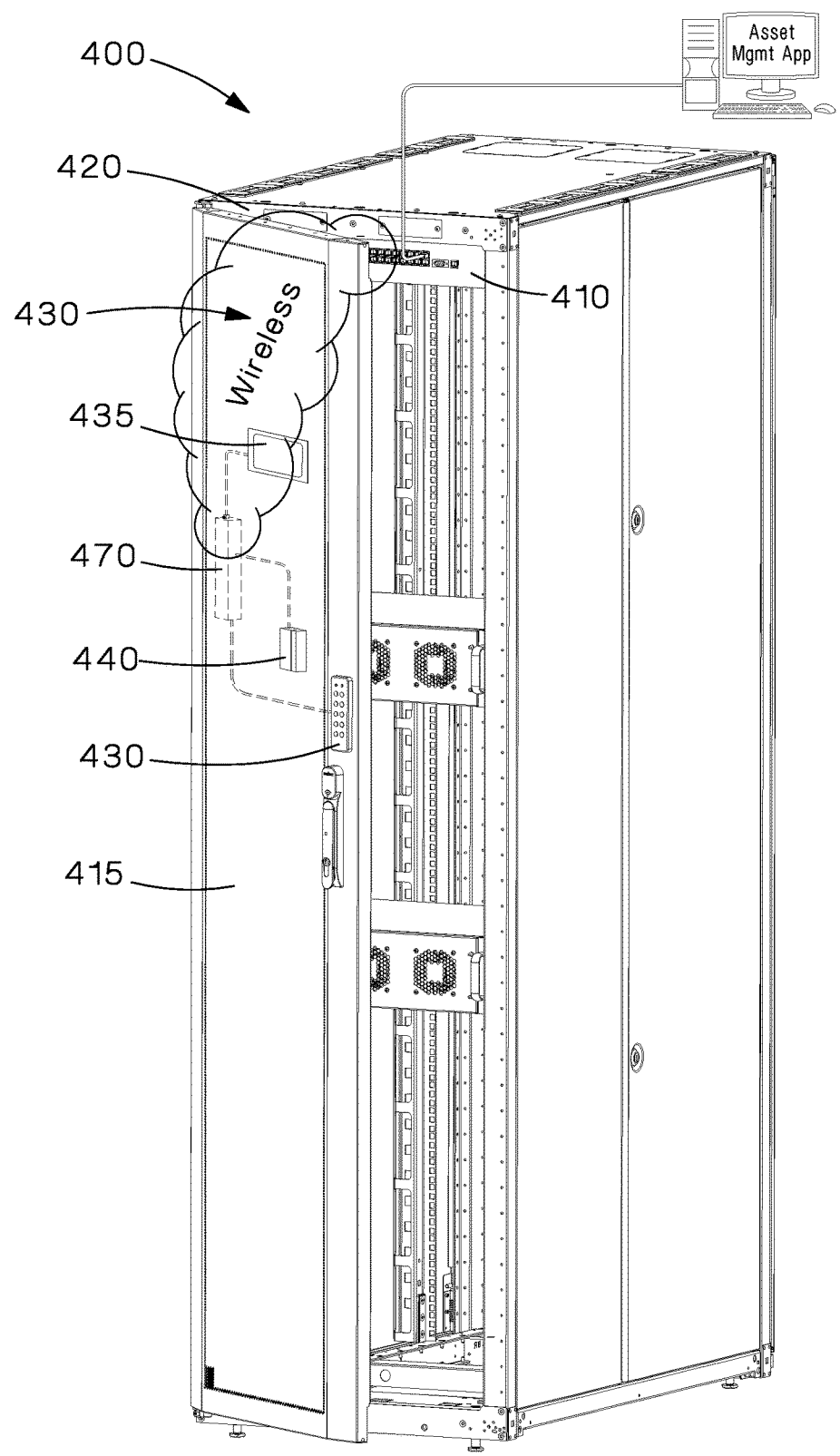
FIG. 11 illustrates the cabinet of FIG. 10 showing the front side of the cabinet's front door.

Referring now to FIGS. 10 and 11, shown therein is a network cabinet 400 configured according to yet another embodiment of the present invention. Similar to cabinet 100, cabinet 400 houses electronic equipment 405 along with a gateway 410, and includes a door 415 removably mounted on the cabinet's frame 420. The door 415 has a plurality of electronic devices mounted thereon, including, but not limited to, an electronic door-lock mechanism 425, a key pad 430, a touch-screen display 435, a card/badge reader 440, temperature sensors 445, a pressure sensor 450, and a humidity sensor 455.

In addition, attached to the door 415 is a door module 470. The construction of the door module 470 may be similar to that of the door module 170. Likewise, the interaction between the door module 470 and the door-mounted electronic devices can be similar to that of the door module 170 in that a wired connection is provided between each of the door-mounted electronic devices and the door module 470. However, unlike the embodiment shown in FIGS. 1 and 2, the door module's communication link to the gateway includes a wireless component 430, essentially eliminating the need for the cable 230.

The advantage of the embodiment shown in FIGS. 10 and 11 is that the door 415 may be removed from/installed onto the cabinet frame 420 without having to manually disconnect/connect any communication cables while simultaneously maintaining a wired link between all the door-mounted electronic devices and the door module 470. This configuration can be especially preferred where wired door-mounted electronic devices are favored, yet a relatively simple door removal/installation solution is desired.

Figure 12:
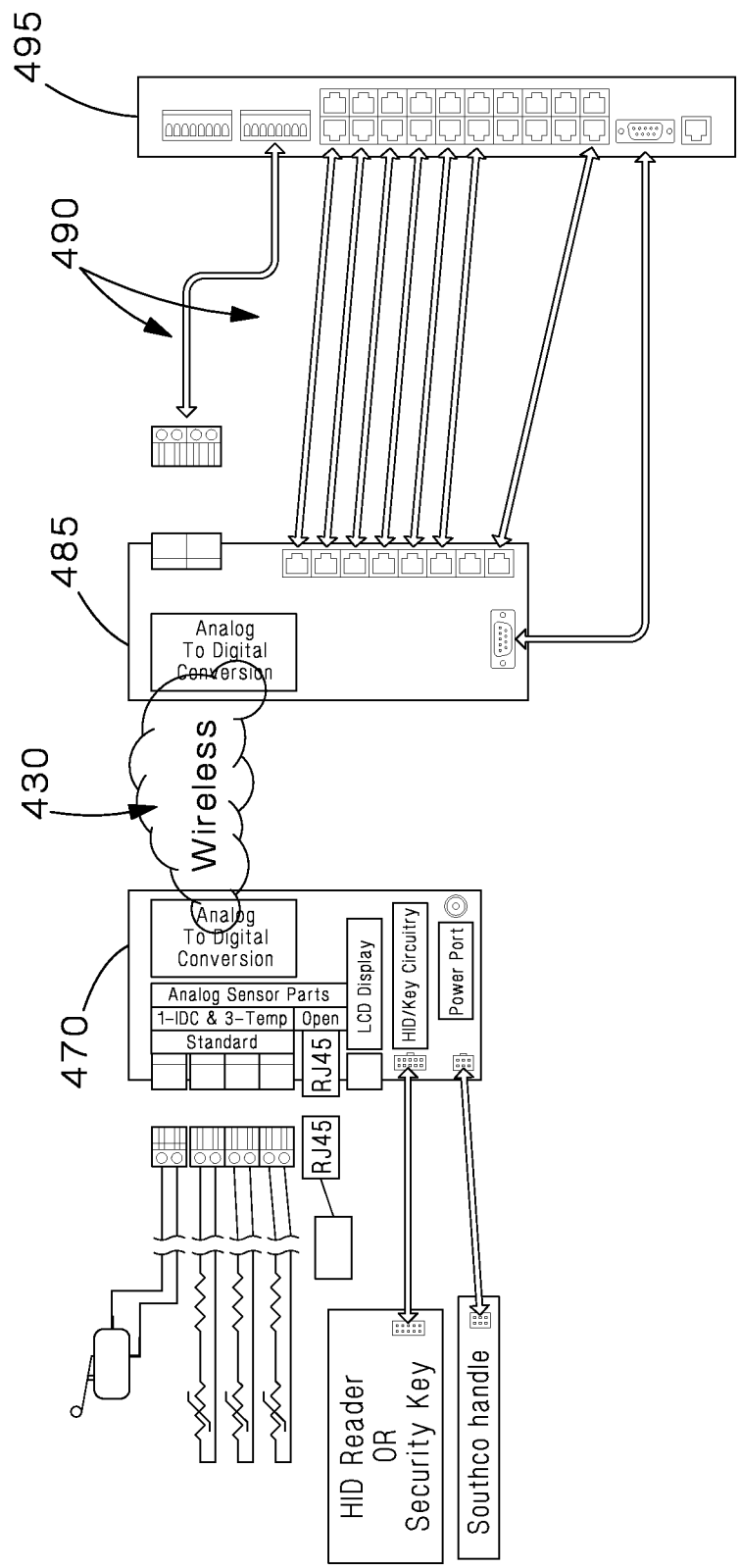
FIG. 12 illustrates a network cabinet according to an embodiment of the present invention.

In one configuration, a direct wireless communication link may be established between the door module 470 and the gateway 410. Alternatively, as shown in FIG. 12, an intermediate device 485 may be a part of that communication link. The intermediate device 485 may act as a wireless transceiver communicating wirelessly with the door module 470 and communicating via wired connection(s) 490 with the gateway 410. The intermediate device 485 may be necessary in situations where the gateway lacks wireless communication capabilities. The wireless communication between the door module 470 and the corresponding hardware (e.g., gateway, intermediate device, etc.) may be implemented through, for example, 802.11 or Bluetooth compatible hardware.

While in the embodiment of FIGS. 10 and 11 the door-mounted electronic devices and the door module can rely on batteries for their required supply of power, other configurations may also be desired. FIGS. 13A-13F shown an embodiment of the cabinet 500 where the door-mounted electronic devices and/or the door module are supplied with power via an electrical connection provided through one or more hinges 505. As shown in greater detail in FIGS. 13B-13D, the door 515 is connected to the frame 520 of the cabinet 500 by a hinge 505. More specifically, the hinge 505, which is attached to the door 515, includes an actuatable post 525 which is shown to be in an extended/engaged position. The post 525 extends through the bushing 530 and rests on a post support 535, both of which are elements of the frame. As used herein, the term "bushing" refers to both any types of a sleeve (as is commonly understood by those skilled in the art) and any type of an aperture that may be adapted for the stated purpose (e.g., a hole in a portion of the frame). This configuration allows the door 515 to be supported (on the bottom portion thereof) and pivotally secured in every corner that a hinge is present.

To enable an electrical source to pass from the frame to the door, complementary conductors are provided in the post 525 and the post support 535. In the currently described embodiment, the complementary conductors are shown as a male pin 540 positioned within the post 525 and a female socket 545 positioned within the post support 535. Both the pin 540 and the socket 545 can be insulated from the respective post and post support housing components, and may conduct electricity at various voltages and amperages. In one example, the voltage is less than or equal to 48 volts DC and amperage is less than or equal to 1 Amp. The socket 545 can be connected to a power source via a wire 547, and the pin 540 can be connected to any of the door-mounted electronic devices, the door module, and/or any power conditioning/distributing circuit mounted on the door that will then direct the power to any of the electronic components on the door (including the door module) via a wire 548.

To ensure a robust electrical connection, the pin 540 can be biased toward the socket 545 via a spring 549 installed inside of the post 525. Since in this configuration the pin can be pushed back into the post upon encountering an obstacle, the pin to be designed with a length that is longer than the socket's 545 depth. This will allow the pin to fully penetrate the socket and retract upon reaching the socket's end without causing damage to said pin. This may also prove advantageous if the door 515 is removed from the cabinet 500 and positioned in a location where the post 525 along with the pin 540 are rested on the floor. Allowing the pin 540 to retract into the post 525 may prevent damage that would be otherwise caused by the weight of the door 515.

Figure 13A:
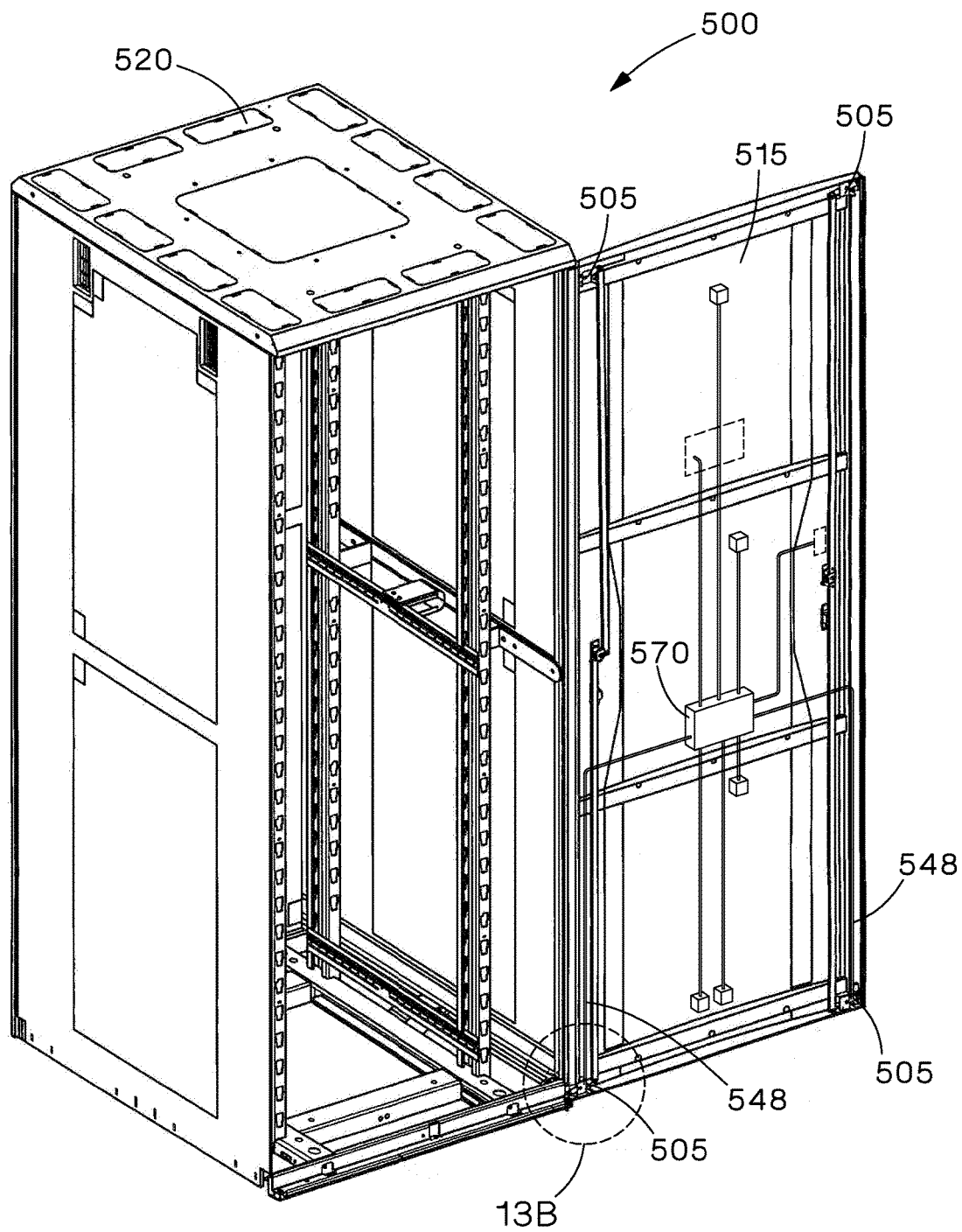
FIGS. 13A-13F illustrate an electrically conductive hinging arrangement.
Figure 13B:
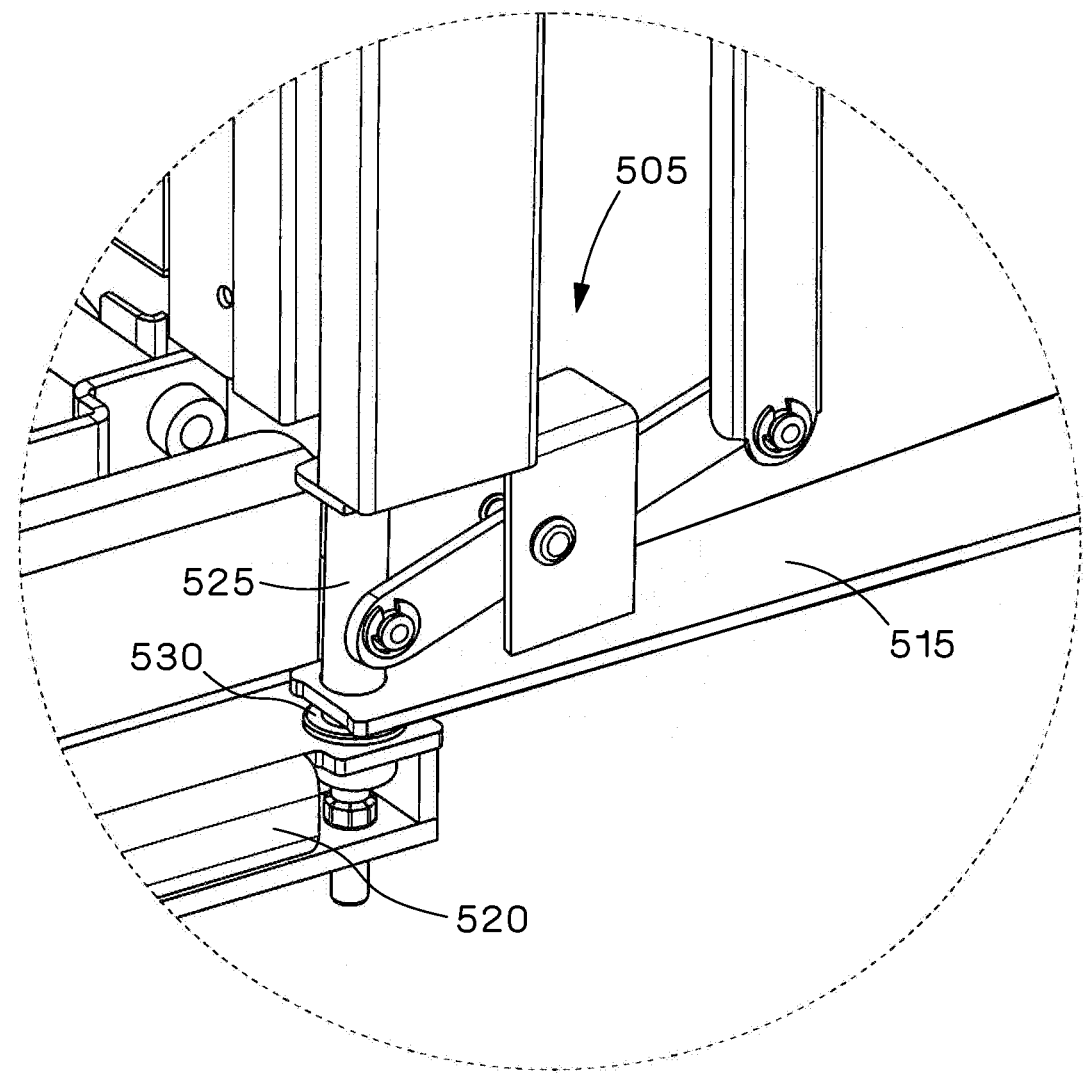
Figure 13C:
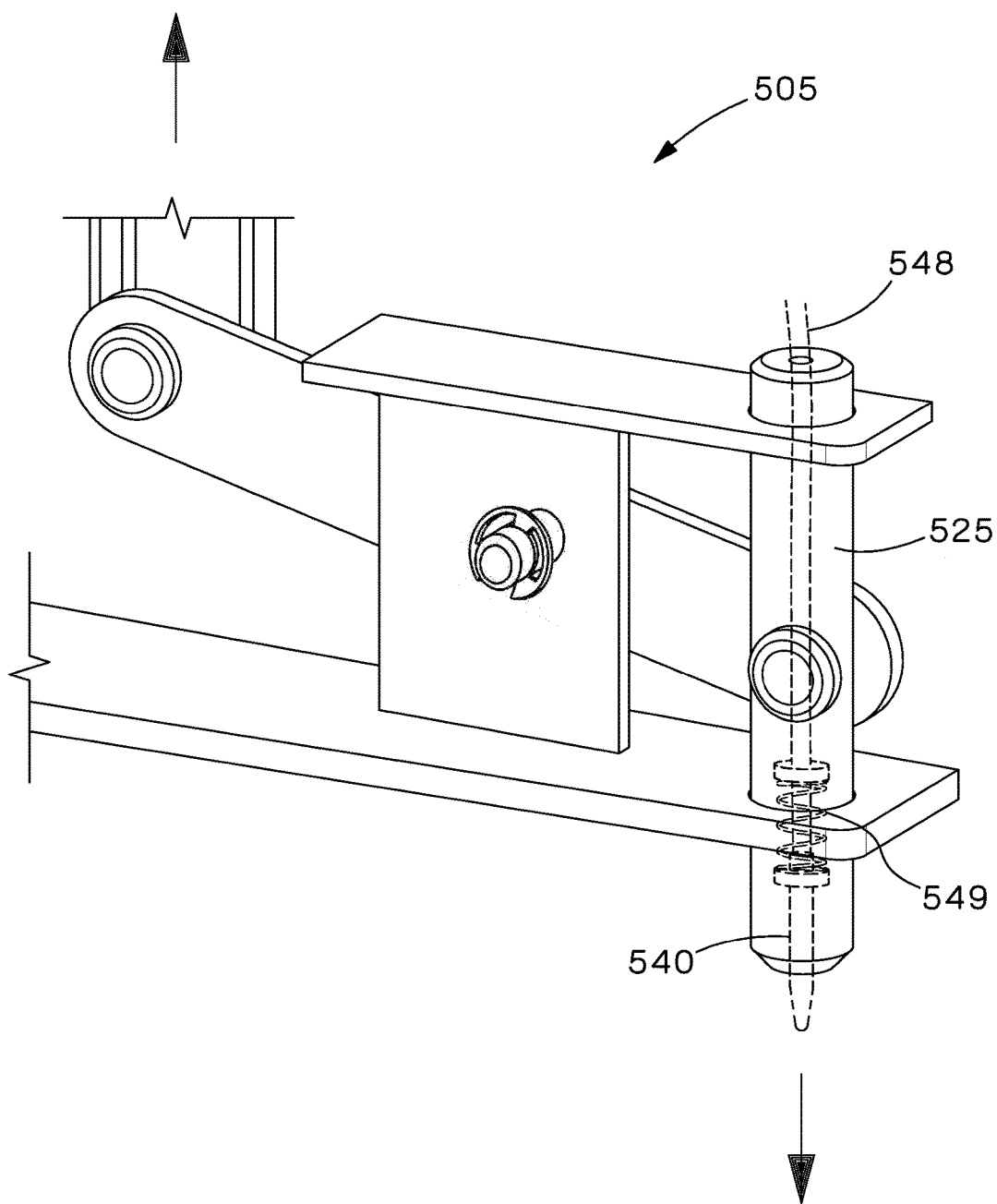
Figure 13D:
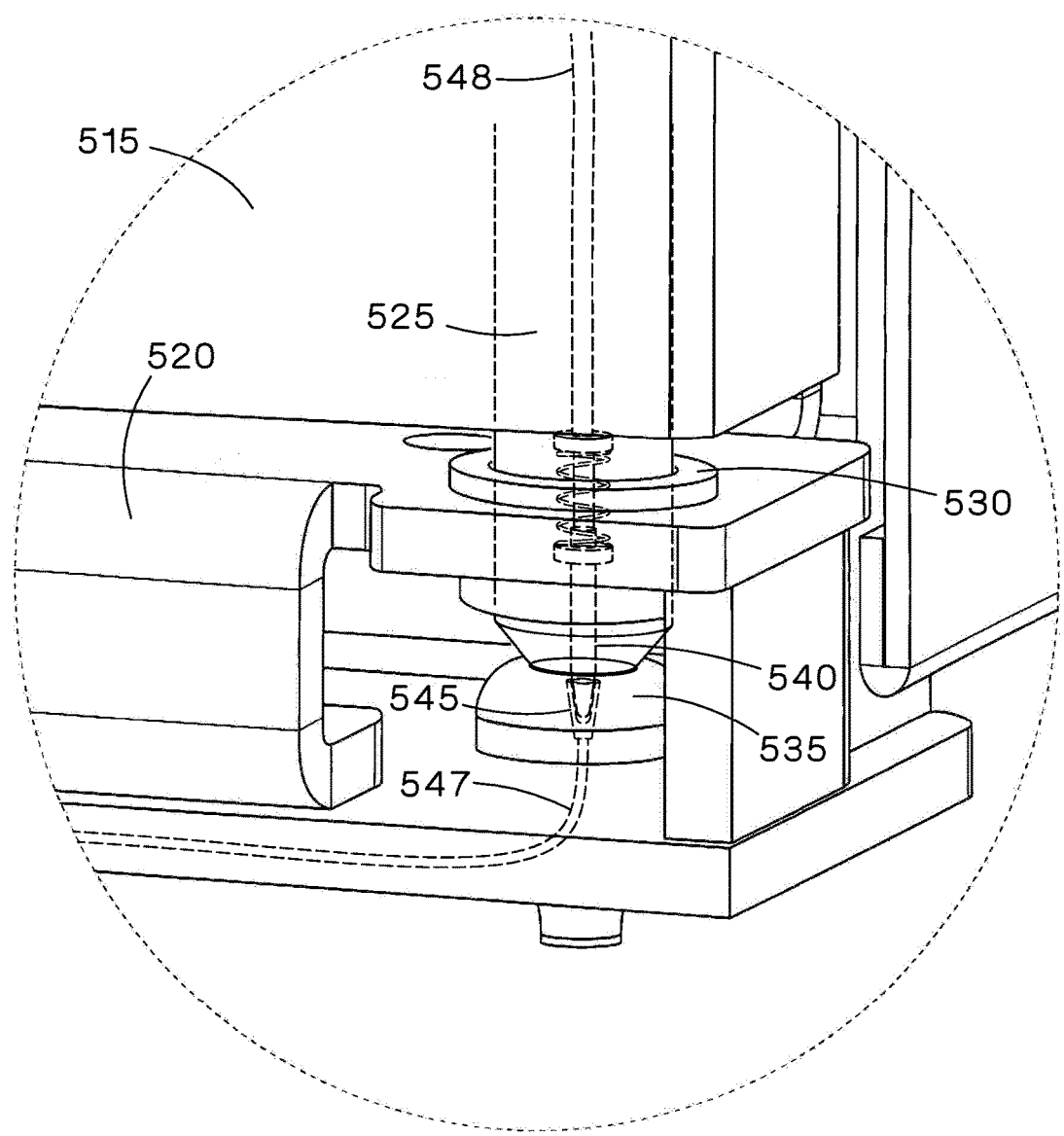
Figure 13E:
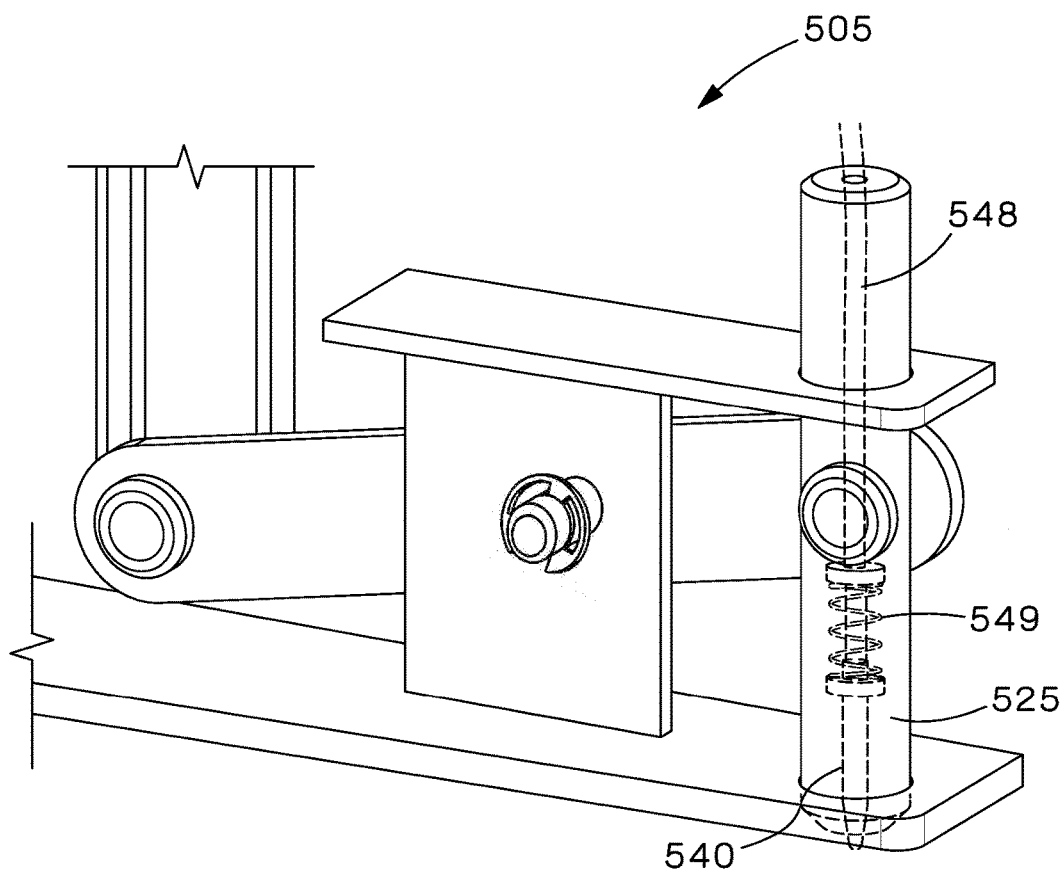
Figure 13F:
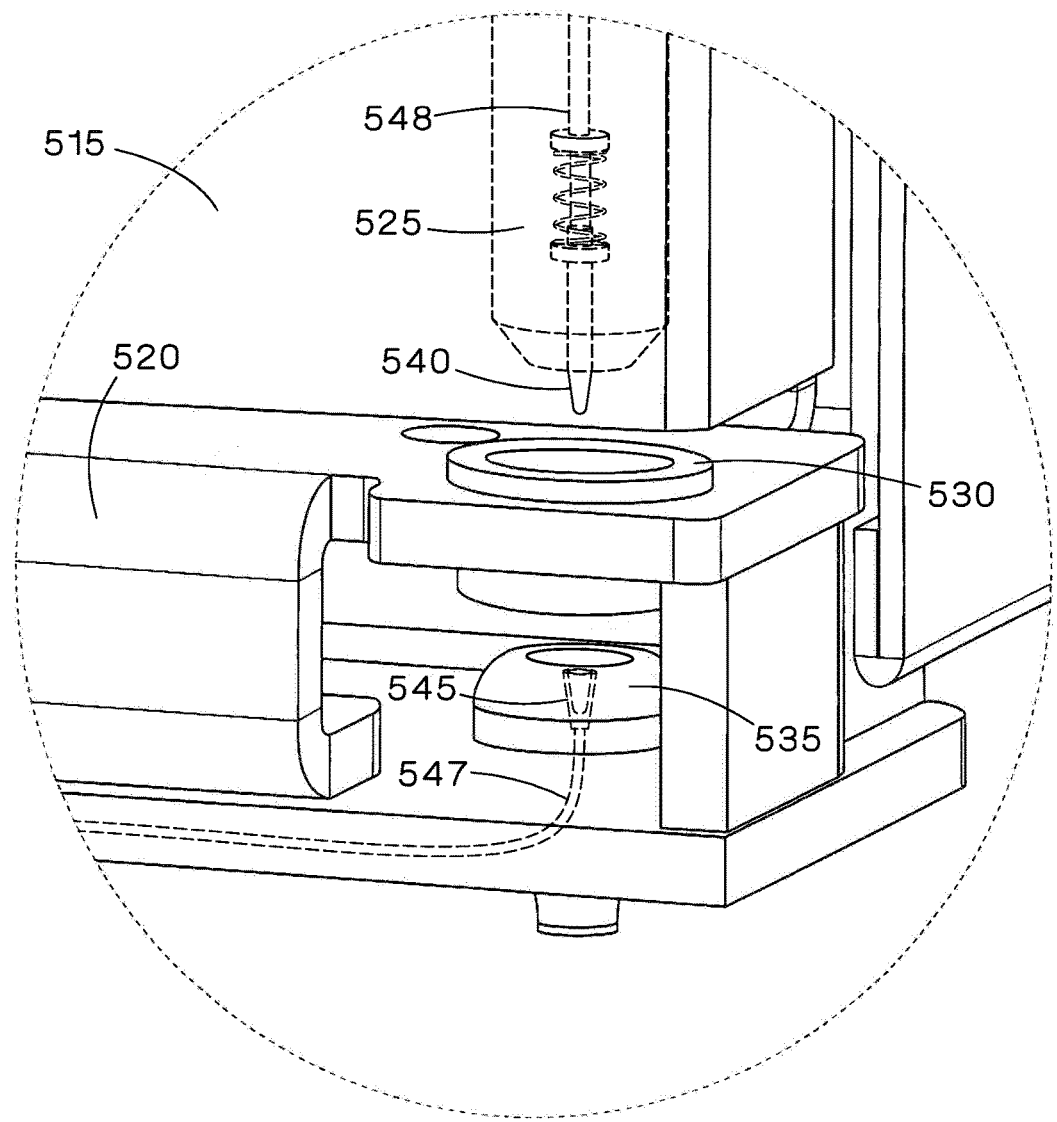

FIGS. 13E and 13F illustrate the hinge 505 disengaged from the frame 520. In this position, the post 525 along with the pin 540 are moved away from the post support 535 and the socket 545. The post and the pin retract enough to clear the bushing 530 allowing the respective portion of the door 515 where the hinge 505 is attached to no longer be restrained by the frame 520. Simultaneously, the electrical bond between the pin 540 and the socket 545 is broken.

The configuration shown in FIGS. 13A-13F provides an easily disconnectable wired power link between the door 515 and the frame 520. The connection and disconnection of the power link is integrally linked with the locking/engaging and unlocking/disengaging of the hinge 505, respectively. This allows a user to engage or disengage the power connectivity seamlessly with the actions required to open/close/mount/dismount the door 515. As a result, when the power supply arrangement shown in FIGS. 13A-13F is combined with a wireless door module 570 (see FIG. 13A), the cabinet door may be removed from or installed onto the cabinet frame without having to manually disconnect or connect additional wires and/or cables. In other words, the door may be removed or installed solely by engaging or disengaging the door hinges.

The configuration of FIGS. 13A-13F may also be advantageous when used with dual-hinge doors which can be opened from either side (see FIG. 13A). These designs prevent one from running a cable between the door and the frame along one side of the cabinet because the door may be swung open from either the left or the right. Thus, a power link arranged within both the left and the right side hinge(s) can provide power to the door regardless of which side of said door is disengaged from the cabinet.

Figure 14:
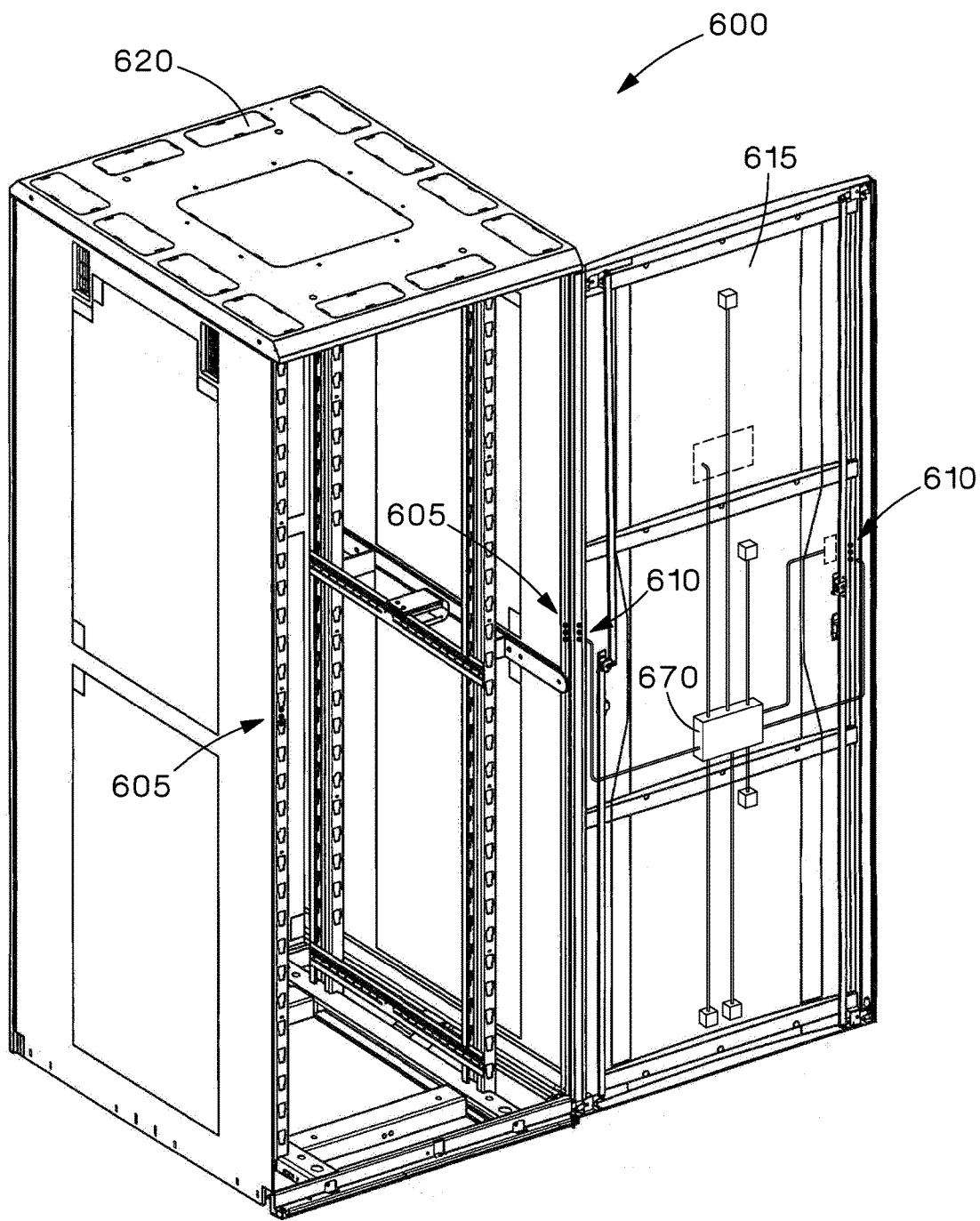
FIG. 14 illustrates a network cabinet according to an embodiment of the present invention.

Alternative embodiments of conducting electricity from the cabinet frame to the cabinet door may include wireless power transmission elements positioned along the edges of the frame and corresponding edges of the door, permitting electrical energy to be wirelessly transferred from the frame to the door. In other embodiments, as shown in FIG. 14 a complementary combination of pad contacts and/or wiping/brushing contacts 605, 610 may be provided on the frame 620 and the door 615 of the cabinet 600. This configuration enables electricity to flow from a source located in the frame 620, through the contacts 605, 610, and into the door module 670. Preferably these complementary contact are positioned along both vertical sides where the door 615 abuts the frame 620. In this case, regardless of which side the cabinet door is opened from, at least one set of complementary contacts positioned on one of the sides remains in electrical contact. Furthermore, having either the wiping/brushing contacts of the corresponding contact pads wrap around the edge of the door can allow the complementary contacts to remain in electrical continuity while the door 615 pivots.

Note that while this invention has been described in terms of several embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claims:

1. An enclosure for housing electronic equipment, the enclosure comprising:
   a frame for mounting said electronic equipment;
   a gateway connected to said frame and in communication with a management application;
   a door removably mounted to said frame, said door including a plurality of door-mounted electronic devices, at least one of said door-mounted electronic devices requiring an interface that is different from at least one other of said door-mounted electronic devices;
   a door module attached to said door, said door module providing a plurality of interfaces wherein each of said plurality of door-mounted electronic devices is connected to one of said plurality of interfaces; and
   a communication link between said door module and said gateway, at least a portion of said communication link consisting of a single communication cable.

2. The enclosure of claim 1, wherein said single communication cable includes a plurality of twisted wire pairs and an RJ45 connector.

3. The enclosure of claim 1, wherein said communication link includes an intermediate device, and wherein said door module is connected to said intermediate device via said single communication cable.

4. The enclosure of claim 3, wherein said single communication cable includes a plurality of twisted wire pairs and an RJ45 connector.

5. The enclosure of claim 1, wherein said enclosure is a network cabinet.

6. The enclosure of claim 1, wherein said door module includes a multiplexer, said multiplexer facilitating communication between said plurality of door-mounted electronic devices and said gateway.

7. The enclosure of claim 1 further comprising:
   a second door removably mounted to said frame, said second door including a plurality of second door-mounted electronic devices, at least one of said second door-mounted electronic devices requiring an interface that is different from at least one other of said second door-mounted electronic devices;
   a second door module attached to said second door, said second door module providing a plurality of second interfaces wherein each of said plurality of second door-mounted electronic devices is connected to one of said plurality of second interfaces; and
   a communication link between said second door module and said gateway, at least a portion of said second communication link consisting of a single second communication cable.

8. The enclosure of claim 1, wherein said door module receives power via Power over Ethernet.

9. The enclosure of claim 1, wherein said door module receives power via an external power adapter connected to said door module.

10. A method of monitoring environmental conditions inside of an enclosure having a frame and a removably mounted door, said enclosure housing electronic equipment, said method comprising the steps of:
    mounting a gateway to said frame, said gateway being in communication with a management application;
    providing a plurality of door-mounted electronic devices, at least one of said door-mounted electronic devices requiring an interface that is different from at least one other of said door-mounted electronic devices;
    attaching a door module to said door, said door module having a plurality of interfaces;
    connecting each of said plurality of door-mounted electronic devices with one of said plurality of interfaces;
    providing a communication link between said door module and said gateway, at least a portion of said communication link consisting of a single communication cable; and
    communicating electronic data between at least some of said plurality of door-mounted electronic devices and said management application.

11. The method of claim 10, wherein said single communication cable includes a plurality of twisted wire pairs and an RJ45 connector.

12. The method of claim 10, wherein said communication link includes an intermediate device, and wherein said door module is connected to said intermediate device via said single communication cable.

13. The method of claim 12, wherein said single communication cable includes a plurality of twisted wire pairs and an RJ45 connector.

14. The method of claim 10, wherein said enclosure is a network cabinet.

15. The method of claim 10, wherein said step of communicating electronic data between at least some of said plurality of door-mounted electronic devices and said management application includes the sub-steps of:
    multiplexing data obtained from said at least some of said plurality of door-mounted electronic devices; and
    transmitting said multiplexed data toward said gateway.

16. An enclosure management system comprising:
    a management application; and
    an enclosure housing electronic equipment and including:
       a frame for mounting said electronic equipment;
       a gateway connected to said frame and in communication with said management application;
       a door removably mounted to said frame, said door including a plurality of door-mounted electronic devices, at least one of said door-mounted electronic devices requiring an interface that is different from at least one other of said door-mounted electronic devices;

a door module attached to said door, said door module providing a plurality of interfaces wherein each of said plurality of door-mounted electronic devices is connected to one of said plurality of interfaces; and a communication link between said door module and said gateway, at least a portion of said communication link requiring only a single communication cable.

17. The enclosure management system of claim 16, wherein said single communication cable includes a plurality of twisted wire pairs and an RJ45 connector.

18. The enclosure management system of claim 16, wherein said communication link includes an intermediate device, and wherein said door module is connected to said intermediate device via said single communication cable.

19. The enclosure management system of claim 16, wherein said door module receives power via at least one of Power over Ethernet and an external power adapter connected to said door module.

20. The enclosure management system of claim 16, wherein said door module includes a multiplexer, said multiplexer facilitating communication between said plurality of door-mounted electronic devices and said gateway.

21. An enclosure for housing electronic equipment, the enclosure comprising:

a frame for mounting said electronic equipment;

a gateway connected to said frame and in communication with a management application;

a door removably mounted to said frame, said door including a plurality of door-mounted electronic devices, at least one of said door-mounted electronic devices requiring an interface that is different from at least one other of said door-mounted electronic devices;

a door module attached to said door, said door module providing a plurality of interfaces wherein each of said plurality of door-mounted electronic devices is connected to one of said plurality of interfaces; and a communication link between said door module and said gateway, at least a portion of said communication link consisting of a wireless connection.

22. The enclosure of claim 21, wherein said door further includes a hinge having a post, wherein said frame includes a bushing configured to receive said post therethrough and said frame further includes a post support configured to support said post, wherein said hinge is switchable between an engaged state and a disengaged state, said engaged state causing said post to be received through said bushing and be supported by said post support, and said disengaged state causing said post to be free of said bushing and be unsupported by said post support, and wherein electrical power for powering at least one of said door mounted electronic devices and/or said door module is passed through said post support and said post.

23. The enclosure of claim 22, wherein said post includes a post power conductor, said post power conductor being positioned at least partially within said post, wherein said post support includes a post support power conductor, said post support power conductor being positioned at least partially within said post support, wherein said post power conductor and said post support power conductor come into contact with each other when said hinge is in said engaged state, and wherein said post power conductor and said post support power conductor disengage when said hinge is in said disengaged state.

24. The enclosure of claim 23, wherein said post power conductor is biased toward said post support power conductor via a spring positioned within said post.

25. The enclosure of claim 23, wherein said post power conductor is electrically insulated from said post, and wherein said post support power conductor is insulated from said post support.

26. The enclosure of claim 23, wherein said electrical power is received via a power wire connected to said post power conductor.

27. The enclosure of claim 21, wherein said door is removably mounted to said frame along a portion of a first vertical frame edge and along a portion of a second vertical frame edge, wherein said first vertical frame edge includes at least one first electrical frame contact and said second vertical frame edge includes at least one second electrical frame contact, wherein said door further includes at least one first door contact for electrically connecting to said at least one first electrical frame contact and at least one second door contact for electrically connecting to said at least one second electrical frame contact, and wherein electrical power for powering at least one of said door mounted electronic devices and/or said door module is passed through at least one of said at least one first door contact and said at least one second door contact.

* * * * *